(12) United States Patent
Kato et al.

(10) Patent No.: US 9,692,421 B2
(45) Date of Patent: *Jun. 27, 2017

(54) NON-VOLATILE LATCH CIRCUIT AND LOGIC CIRCUIT, AND SEMICONDUCTOR DEVICE USING THE SAME

(71) Applicant: Semiconductor Energy Laboratory Co., Ltd., Atsugi-shi, Kanagawa-ken (JP)

(72) Inventors: Kiyoshi Kato, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 252 days.

This patent is subject to a terminal disclaimer.

(21) Appl. No.: 13/667,292

(22) Filed: Nov. 2, 2012

(65) Prior Publication Data

US 2013/0057315 A1 Mar. 7, 2013

Related U.S. Application Data

(63) Continuation of application No. 12/966,513, filed on Dec. 13, 2010, now Pat. No. 8,314,637.

(30) Foreign Application Priority Data

Dec. 18, 2009 (JP) ................. 2009-288146

(51) Int. Cl.
*H01L 25/00* (2006.01)
*H03K 19/00* (2006.01)
(Continued)

(52) U.S. Cl.
CPC ..... *H03K 19/1733* (2013.01); *G11C 14/0063* (2013.01); *H01L 21/8258* (2013.01);
(Continued)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 001489211 A 4/2004
CN 101047190 A 10/2007
(Continued)

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.
(Continued)

*Primary Examiner* — Jany Richardson
(74) *Attorney, Agent, or Firm* — Fish & Richardson P.C.

(57) ABSTRACT

A novel non-volatile latch circuit and a semiconductor device using the non-volatile latch circuit are provided. The latch circuit has a loop structure in which an output of a first element is electrically connected to an input of a second element and an output of the second element is electrically connected to an input of the first element through a second transistor. A transistor using an oxide semiconductor as a semiconductor material of a channel formation region is used as a switching element, and a capacitor is provided to be electrically connected to a source electrode or a drain electrode of the transistor, whereby data of the latch circuit can be retained, and a non-volatile latch circuit can thus be formed.

24 Claims, 19 Drawing Sheets

(51) Int. Cl.
*H03K 19/173* (2006.01)
*G11C 14/00* (2006.01)
*H01L 21/8258* (2006.01)
*H01L 21/84* (2006.01)
*H01L 27/06* (2006.01)
*H01L 27/088* (2006.01)
*H01L 27/12* (2006.01)
*H01L 29/786* (2006.01)
*H03K 3/356* (2006.01)
*G11C 16/02* (2006.01)
*H01L 27/1156* (2017.01)

(52) U.S. Cl.
CPC .......... *H01L 21/84* (2013.01); *H01L 27/0688* (2013.01); *H01L 27/088* (2013.01); *H01L 27/1203* (2013.01); *H01L 27/1225* (2013.01); *H01L 29/7869* (2013.01); *H03K 3/35606* (2013.01); *H03K 3/356008* (2013.01); *G11C 16/02* (2013.01); *H01L 27/1156* (2013.01)

(56) References Cited

U.S. PATENT DOCUMENTS

| | | | |
|---|---|---|---|
| 5,936,879 A | 8/1999 | Brouwer et al. | |
| 6,127,702 A | 10/2000 | Yamazaki et al. | |
| 6,271,542 B1 | 8/2001 | Emma et al. | |
| 6,294,274 B1 | 9/2001 | Kawazoe et al. | |
| 6,563,174 B2 | 5/2003 | Kawasaki et al. | |
| 6,723,589 B2 | 4/2004 | Lee | |
| 6,727,522 B1 | 4/2004 | Kawasaki et al. | |
| 6,738,281 B2* | 5/2004 | Yokozeki | 365/145 |
| 6,741,489 B2 | 5/2004 | Takasu et al. | |
| 6,788,567 B2* | 9/2004 | Fujimori | G11C 11/22 365/145 |
| 6,809,952 B2 | 10/2004 | Masui | |
| 6,944,045 B2 | 9/2005 | Fujimori | |
| 6,998,722 B2 | 2/2006 | Madurawe | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,080,270 B2 | 7/2006 | Yokozeki et al. | |
| 7,105,868 B2 | 9/2006 | Nause et al. | |
| 7,199,024 B2 | 4/2007 | Yamazaki | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,374,984 B2 | 5/2008 | Hoffman et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,511,343 B2 | 3/2009 | Li et al. | |
| 7,674,650 B2 | 3/2010 | Akimoto et al. | |
| 7,732,819 B2 | 6/2010 | Akimoto et al. | |
| 7,863,627 B2 | 1/2011 | Honda | |
| 7,893,495 B2 | 2/2011 | Li et al. | |
| 7,910,490 B2 | 3/2011 | Akimoto et al. | |
| 7,932,521 B2 | 4/2011 | Akimoto et al. | |
| 7,982,250 B2* | 7/2011 | Yamazaki | H01L 21/8221 257/278 |
| 8,212,248 B2 | 7/2012 | Itagaki et al. | |
| 8,274,077 B2 | 9/2012 | Akimoto et al. | |
| 8,295,079 B2 | 10/2012 | Yamamoto et al. | |
| 8,362,538 B2 | 1/2013 | Koyama et al. | |
| 8,410,838 B2 | 4/2013 | Kato et al. | |
| 8,432,187 B2 | 4/2013 | Kato et al. | |
| 8,466,463 B2 | 6/2013 | Akimoto et al. | |
| 8,502,217 B2 | 8/2013 | Sato et al. | |
| 8,513,662 B2 | 8/2013 | Yabuta et al. | |
| 8,618,586 B2 | 12/2013 | Koyama et al. | |
| 8,629,069 B2 | 1/2014 | Akimoto et al. | |
| 8,629,490 B2 | 1/2014 | Asami | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,860,485 B2 | 10/2014 | Kato et al. | |
| 8,994,400 B2 | 3/2015 | Kato et al. | |
| 9,099,562 B2 | 8/2015 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0123276 A1 | 7/2003 | Yokozeki | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0105302 A1 | 6/2004 | Fujimori | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197414 A1* | 8/2008 | Hoffman | H01L 29/41733 257/347 |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |

(56) References Cited

U.S. PATENT DOCUMENTS

| | | | |
|---|---|---|---|
| 2009/0002044 A1* | 1/2009 | Kobayashi | H01L 27/0207 327/203 |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0114918 A1 | 5/2009 | Wang et al. | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0148171 A1 | 6/2010 | Hayashi et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0121878 A1 | 5/2011 | Kato et al. | |
| 2011/0163311 A1 | 7/2011 | Akimoto et al. | |
| 2011/0187410 A1 | 8/2011 | Kato et al. | |
| 2014/0167037 A1 | 6/2014 | Koyama et al. | |
| 2015/0022251 A1 | 1/2015 | Kato et al. | |
| 2015/0340513 A1 | 11/2015 | Akimoto et al. | |

FOREIGN PATENT DOCUMENTS

| | | |
|---|---|---|
| CN | 101393919 A | 3/2009 |
| EP | 0 818 891 A2 | 1/1998 |
| EP | 1737044 A1 | 12/2006 |
| EP | 1 770 788 A2 | 4/2007 |
| EP | 1921681 A | 5/2008 |
| EP | 1 995 787 A2 | 11/2008 |
| EP | 1 998 373 A2 | 12/2008 |
| EP | 1 998 374 A2 | 12/2008 |
| EP | 1 998 375 A2 | 12/2008 |
| EP | 2226847 A2 | 9/2010 |
| JP | 60-198861 A | 10/1985 |
| JP | 62-177794 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-192915 A | 8/1991 |
| JP | 05-110392 A | 4/1993 |
| JP | 05-251705 A | 9/1993 |
| JP | 08-264794 A | 10/1996 |
| JP | 10-093423 A | 4/1998 |
| JP | 11-505377 A | 5/1999 |
| JP | 2000-044236 A | 2/2000 |
| JP | 2000-077982 A | 3/2000 |
| JP | 2000-077982 A | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-152506 A | 5/2003 |
| JP | 2004-103957 A | 4/2004 |
| JP | 2004-186874 A | 7/2004 |
| JP | 2004-273614 A | 9/2004 |
| JP | 2004-273732 A | 9/2004 |
| JP | 2006-050208 A | 2/2006 |
| JP | 2007-110254 A | 4/2007 |
| JP | 2007-123861 A | 5/2007 |
| JP | 2007-220820 A | 8/2007 |
| JP | 2007-258223 A | 10/2007 |
| JP | 2008-098637 A | 4/2008 |
| JP | 2008-277665 A | 11/2008 |
| JP | 2009-016891 A | 1/2009 |
| JP | 2009-049859 A | 3/2009 |
| JP | 2009-135350 A | 6/2009 |
| JP | 2009-164393 A | 7/2009 |
| JP | 2009-175716 A | 8/2009 |
| JP | 2009-260378 A | 11/2009 |
| JP | 2009-276387 A | 11/2009 |
| TW | 200620490 | 6/2006 |
| TW | 200937613 | 9/2009 |
| TW | 200941724 | 10/2009 |
| WO | WO 03/044953 A1 | 5/2003 |
| WO | WO 2004/114391 A1 | 12/2004 |
| WO | WO-2006/049791 | 5/2006 |
| WO | WO-2009/028298 | 3/2009 |
| WO | WO-2009/072532 | 6/2009 |
| WO | WO-2009/087943 | 7/2009 |
| WO | WO-2009/139483 | 11/2009 |

OTHER PUBLICATIONS

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energtics in ZnO: A Hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m>4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

(56) References Cited

OTHER PUBLICATIONS

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Walle, C, "Hydrogen as a Cause of Doping in Zinc Oxide," Phys. Rev. Lett. (Physical Review Letters), Jul. 31, 2000, vol. 85, No. 5, pp. 1012-1015.

Tomoyuki Ishii et al.; "A Poly-Silicon TFT With a Sub-5-nm Thick Channel for Low-Power Gain Cell Memory in Mobile Applicatons"; IEEE Transactons on Electron Devices; Nov. 1, 2004; vol. 51; No. 11; pp. 1805-1810.

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

International Search Report, PCT Application No. PCT/JP2010/071421, dated Dec. 28, 2010, 2 pages.

Written Opinion, PCT Application No. PCT/JP2010/071421, dated Dec. 28, 2010, 5 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

(56) References Cited

OTHER PUBLICATIONS

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and Sc2O3—A2O3-Bo Systems [a; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems,", Journal of Solid-State Circuits , 2008, vol. 43, No. 1, pp. 292-299.

Lany, S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Lee, H et al., "Current Status of, Challenges to, and Perspective View of AM-OLED ,", IDW '06 : Proceedings of the 13th International Display Workshops, Dec. 7, 2006, pp. 663-666.

Lee, J et al., "World's Largest (15-Inch) XGS AMLCD Panel Using IGZO Oxide TFT,", SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti, A et al., "Native Point Defects in ZnO," Phys. Rev. B (Physical Review. B), 2007, vol. 76, No. 16, pp. 165202-1-165202-22.

Chinese Office Action (Application No. 201080057657.1 ) Dated Jul. 29, 2014.

Taiwanese Office Action (Application No. 099142637) Dated Nov. 24, 2015.

Chinese Office Action (Application No. 201510101702.3) Dated Nov. 18, 2016.

\* cited by examiner 431,432

431,432

NON-VOLATILE LATCH CIRCUIT AND LOGIC CIRCUIT, AND SEMICONDUCTOR DEVICE USING THE SAME

CROSS-REFERENCE TO RELATED APPLICATIONS

This application is a continuation of U.S. application Ser. No. 12/966,513, filed Dec. 13, 2010, now allowed, which claims the benefit of a foreign priority application filed in Japan as Serial No. 2009-288146 on Dec. 18, 2009, both of which are incorporated by reference.

TECHNICAL FIELD

The disclosed invention relates to a non-volatile logic circuit in which a stored logic state is not erased even when the power is turned off, and a semiconductor device using the non-volatile logic circuit. In particular, the disclosed invention relates to a non-volatile latch circuit and a semiconductor device using the same.

BACKGROUND ART

An integrated circuit including a non-volatile logic circuit has been proposed; in the integrated circuit, a logic circuit has "non-volatile" characteristics, i.e., memory of the logic circuit is not erased even when the power is turned off. For example, a non-volatile latch circuit using a ferroelectric element as a non-volatile logic circuit is proposed (Patent Document 1).

REFERENCE

[Patent Document 1] PCT International Publication No. 2003/044953

DISCLOSURE OF INVENTION

However, a non-volatile latch circuit using a ferroelectric element has problems with reliability of the number of rewrites and reduction in voltage. In addition, a ferroelectric element is polarized by an electric field which is applied to the element, and stores data by the remanent polarization. However, when the remanent polarization is small, the influence of variation increases or a high-accuracy reading circuit is needed.

In view of the above problems, an object of an embodiment of the present invention is to provide a novel non-volatile latch circuit and a semiconductor device using the non-volatile latch circuit.

One embodiment of the present invention is a latch circuit with a loop structure, in which an output of a first element is electrically connected to an input of a second element and an output of the second element is electrically connected to an input of the first element through a second transistor. A transistor using an oxide semiconductor as a semiconductor material of a channel formation region is used as a switching element, and a capacitor is provided to be electrically connected to a source electrode or a drain electrode of the transistor, whereby data of the latch circuit can be retained, and a non-volatile latch circuit can thus be formed. The transistor using an oxide semiconductor allows retaining data written to the capacitor. The capacitor is electrically connected to a predetermined position in the loop structure of the latch circuit. Accordingly, the non-volatile latch circuit has such a configuration that a charge corresponding to data of the latch circuit is automatically accumulated in the capacitor so that data writing is performed.

In other words, one embodiment of the present invention is a latch circuit in which a first transistor and a second transistor each using an oxide semiconductor as a semiconductor material of a channel formation region are used as switching elements, and which includes a capacitor electrically connected to one of a source electrode and a drain electrode of the first transistor and one of a source electrode and a drain electrode of the second transistor. The latch circuit has a loop structure in which an output of a first element is electrically connected to an input of a second element and an output of the second element is electrically connected to an input of the first element through the second transistor. The input of the first element is electrically connected to a wiring to which an input signal is applied through the first transistor. The output of the first element is electrically connected to a wiring to which an output signal is applied. That is, the first transistor is provided between the wiring to which an input signal is applied and the input of the first element, and the second transistor is provided between the output of the second element and the input of the first element.

In the above structure, one electrode of the capacitor is electrically connected to the one of the source electrode and the drain electrode of the second transistor, and the input of the first element. The one electrode of the capacitor is also electrically connected to the one of the source electrode and the drain electrode of the first transistor. The other of the source electrode and the drain electrode of the second transistor is electrically connected to the output of the second element. The other of the source electrode and the drain electrode of the first transistor is electrically connected to the wiring to which an input signal is applied.

In the above structure, the first element includes at least a third transistor. A gate of the third transistor is electrically connected to the input of the first element, and the gate of the third transistor is electrically connected to the one of the source electrode and the drain electrode of the second transistor. Further, the gate of the third transistor is electrically connected to the one of the source electrode and the drain electrode of the first transistor.

In the above structure, a capacitor between the second transistor and the input of the first element can be used as a capacitor for retaining data of the latch circuit. A gate capacitance of the third transistor can also be used as a capacitor for retaining data of the latch circuit. Further, a gate capacitance of a transistor other than the third transistor included in the first element can be used as a capacitor for retaining data of the latch circuit. The above capacitances can be used in combination. It is also possible to use only the gate capacitance of the third transistor and not to use the other capacitances.

In the above structure, the first transistor and the second transistor each have a function of retaining data written to the capacitor. The capacitor is electrically connected to a predetermined position in the loop structure of the latch circuit. Accordingly, the non-volatile latch circuit has such a configuration that a charge corresponding to data of the latch circuit is automatically accumulated in the capacitor so that data writing is performed.

In the above structure, as the first element and the second element, it is possible to use an element from which an inverted signal of an input signal is output. For example, an inverter, a NAND, a NOR, or a clocked inverter can be used as the first element and the second element. An inverter can be used as each of the first element and the second inverter, for example. It is also possible to use, for example, a NAND as the first element and a clocked inverter as the second element.

In the above structure, as an oxide semiconductor layer used for the channel formation region of each of the first transistor and the second transistor, the following oxide semiconductors can be employed: an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are oxides of two metal elements; or an In—O-based oxide semiconductor, a Sn—O-based oxide semiconductor, or a Zn—O-based oxide semiconductor. In addition, the above oxide semiconductor materials may contain $SiO_2$.

In the above structure, for example, an In—Sn—Ga—Zn—O-based oxide semiconductor means an oxide semiconductor containing at least In, Sn, Ga, and Zn. There is no limitation on the composition ratio of each metal element, and metal elements other than In, Sn, Ga, and Zn may be contained.

Alternatively, as the oxide semiconductor layer, a film containing a material represented by $InMO_3 (ZnO)_m$ (m>0, and m is not a natural number) can be used. Here, M denotes one or more of metal elements selected from Ga, Al, Mn, and Co. For example, M can be Ga, Ga and Al, Ga and Mn, or Ga and Co.

In the above structure, the concentration of hydrogen in the oxide semiconductor layer can be less than or equal to $5\times10^{19}/cm^3$, preferably less than or equal to $5\times10^{18}/cm^3$, more preferably less than or equal to $5\times10^{17}/cm^3$, and still more preferably less than or equal to $1\times10^{16}/cm^3$. In addition, the carrier concentration of the oxide semiconductor layer can be less than $1\times10^{14}/cm^3$, preferably less than $1\times10^{12}/cm^3$, and more preferably less than $1\times10^{11}/cm^3$.

In the above structure, a transistor using an oxide semiconductor may be a bottom-gate transistor, a top-gate transistor, or a bottom-contact transistor. A bottom-gate transistor includes a gate electrode over an insulating surface; a gate insulating film over the gate electrode; an oxide semiconductor layer which overlaps with the gate electrode over the gate insulating film; a source electrode and a drain electrode over the oxide semiconductor layer; and an insulating film over the source electrode, the drain electrode, and the oxide semiconductor layer. A top-gate transistor includes an oxide semiconductor layer over an insulating surface; a gate insulating film over the oxide semiconductor layer; a gate electrode which overlaps with the oxide semiconductor layer over the gate insulating film and functions as a conductive film; a drain electrode; a source electrode; and an insulating film over the oxide semiconductor layer. Another top-gate transistor can include an oxide semiconductor layer over an insulating surface; a drain electrode and a source electrode over the oxide semiconductor layer; a gate insulating film over the oxide semiconductor layer, the drain electrode, and the source electrode; and a gate electrode which overlaps with the oxide semiconductor layer over the gate insulating film and functions as a conductive film. A bottom-contact transistor includes a gate electrode over an insulating surface; a gate insulating film over the gate electrode; a source electrode and a drain electrode over the gate insulating film; an oxide semiconductor layer over the source electrode, the drain electrode, and the gate insulating film which overlaps with the gate electrode; and an insulating film over the source electrode, the drain electrode, and the oxide semiconductor layer.

A transistor (the first transistor and the second transistor) including a channel formation region formed using an oxide semiconductor layer made of the aforementioned oxide semiconductor material, can have the following characteristics: an off-state current at room temperature (e.g., at 20° C.) is less than or equal to $10^{-13}$ A; and a subthreshold swing (S value) is approximately 0.1 V/dec. (a gate insulating film: 100 nm thickness) even in the case where, for example, the transistor has a channel width W of $1\times10^4$ μm and a channel length of 3 μm. In addition, the above transistor is a normally-off transistor which is turned off when a voltage between a gate electrode and a source electrode is approximately 0 V (that is, a threshold voltage is a positive value in the case of an n-channel transistor).

Thus, the above transistor has the following characteristics: an off-state current (also referred to as a leakage current) when a voltage between a gate electrode and a source electrode is approximately 0 V, is much smaller than that of a transistor using silicon for a channel formation region. For example, the aforementioned transistor with $W=1\times10^4$ μm has a leakage current of 10 aA or less, preferably 1 aA or less per 1 μm of channel width at room temperature (hereinafter, the following expression is used in this specification: "the leakage current per unit channel width at room temperature is less than or equal to 10 aA/μm (preferably, 1 aA/μm)").

Accordingly, when the transistor using an oxide semiconductor layer for a channel formation region is used as a switching element, a charge accumulated in the capacitor can be kept retained even after the supply of a power source voltage to the latch circuit has stopped. That is, data written to the capacitor can be kept retained.

For example, it is possible to realize a much longer refresh time than that of a DRAM which is formed using a transistor including a channel formation region made of silicon, and also to realize memory retention characteristics (data retaining characteristics) almost as good as those of a non-volatile memory. Furthermore, after a power source voltage has restarted to be supplied to the latch circuit, data retained in the capacitor can be read. As a result, the logic state can be returned to that before the supply of a power source voltage stops.

Moreover, the above transistor has good temperature characteristics, and can have a sufficiently low off-state current and a sufficiently high on-state current even at high temperature. For example, as for the Vg-Id characteristics of the transistor, the following data is obtained: an on-state current, a mobility, and an S value have small temperature dependence in the range of −25° C. to 150° C.; and an off-state current is as extremely as small as less than or equal to $1\times10^{-13}$ A in this temperature range.

It is considered that the aforementioned characteristics can be obtained by using, for the channel formation region of the transistor, an oxide semiconductor which has a sufficiently low hydrogen concentration to be highly purified and to have a sufficiently low carrier concentration, namely, an intrinsic (i-type) or substantially intrinsic (i-type) oxide semiconductor. That is, the channel formation region of the transistor is made of an oxide semiconductor from which hydrogen as an n-type impurity is removed so that impurities other than a main component of the oxide semiconductor are contained as little as possible, and which is highly purified to be an intrinsic (i-type) or substantially intrinsic (i-type) oxide semiconductor.

Note that in this specification, a semiconductor with a carrier concentration of less than $1 \times 10^{11}/cm^3$ is called an "intrinsic" ("i-type") semiconductor, and a semiconductor with a carrier concentration of $1 \times 10^{11}/cm^3$ or more and less than $1 \times 10^{12}/cm^3$ is called a "substantially intrinsic" ("substantially i-type") semiconductor.

By using such an intrinsic (i-type) or substantially intrinsic (i-type) oxide semiconductor, a transistor can have an off-state current of 10 aA ($1 \times 10^{-17}$ A)/μm or less, preferably 1 aA ($1 \times 10^{-18}$ A)/μm or less per 1 μm of channel width W.

As described above, in one embodiment of the present invention, the transistor using an oxide semiconductor as a semiconductor material of a channel formation region is used as the switching element; thus, it is possible to provide a non-volatile latch circuit which operates in a wide temperature range and stably operates even at high temperature, and in which a stored logic state is not erased even when the power is turned off.

In the above structure, various kinds of logic circuits can be provided by using the non-volatile latch circuit. Further, various kinds of semiconductor devices using the logic circuit can be provided. For example, among a plurality of block circuits of the logic circuit, the supply of a power source voltage to one or more of block circuits not in use can be stopped. With use of the nonvolatile latch circuit, the logic state of the block circuit can be kept stored even after the supply of the power source voltage to the block circuit has stopped. Moreover, the stored logic state can be read after the supply of the power source voltage to the block circuit has started again. As a result, the logic state can be returned to that before the supply of a power source voltage stops.

Note that in this specification and the like, the term such as "over" or "below" does not necessarily mean that a component is placed "directly on" or "directly under" another component. For example, the expression "a gate electrode over a gate insulating layer" does not exclude the case where a component is placed between the gate insulating layer and the gate electrode. Moreover, the terms such as "over" and "below" are only used for convenience of description and can include the case where the relation of components is reversed, unless otherwise specified.

Also in this specification and the like, the term such as "electrode" or "wiring" does not limit a function of such a component. For example, an "electrode" is sometimes used as part of a "wiring", and vice versa. Furthermore, the term "electrode" or "wiring" includes the case where a plurality of "electrodes" or "wirings" is formed in an integrated manner.

Functions of a "source" and a "drain" are sometimes replaced with each other when a transistor of opposite polarity is used or when the direction of current is changed in circuit operation, for example. Therefore, in this specification, the terms "source" and "drain" can be replaced with each other.

Also in this specification and the like, the expression "electrically connected" includes the case where components are connected through an object having any electric function. There is no particular limitation on "an object having any electric function" as long as electric signals can be transmitted and received between components that are connected through the object.

Examples of the "object having any electric function" are a switching element such as a transistor, a resistor, an inductor, a capacitor, and an element with a variety of functions as well as an electrode and a wiring.

In general, an "SOI substrate" means a substrate where a silicon semiconductor layer is provided over an insulating surface. In this specification and the like, the "SOI substrate" also includes in its category a substrate where a semiconductor layer made of a material other than silicon is provided over an insulating surface. That is, a semiconductor layer included in the "SOI substrate" is not limited to a silicon semiconductor layer.

Further, a substrate for the "SOI substrate" is not limited to a semiconductor substrate such as a silicon wafer and can be a non-semiconductor substrate such as a glass substrate, a quartz substrate, a sapphire substrate, or a metal substrate. In other words, the "SOI substrate" also includes in its category a conductive substrate or an insulating substrate provided with a layer made of a semiconductor material.

Moreover, in this specification and the like, a "semiconductor substrate" means not only a substrate made of only a semiconductor material but also all substrates including a semiconductor material. That is, in this specification and the like, the "SOI substrate" is also included in the category of the "semiconductor substrate".

According to one embodiment of the present invention, a transistor using, as a semiconductor material of a channel formation region, an intrinsic (i-type) or substantially intrinsic (i-type) oxide semiconductor which has a sufficiently low hydrogen concentration to be highly purified and to have a sufficiently low carrier concentration, is used as a switching element and a capacitor electrically connected to a source electrode or a drain electrode of the transistor is provided; thus, it is possible to realize a non-volatile latch circuit which operates in a wide temperature range and stably operates even at high temperature, and in which a stored logic state is not erased even when the power is turned off, or a latch circuit which has a sufficiently long refresh time and data retention characteristics. In addition, since a charge accumulated in the capacitor is retained as data, data can be read easily with less variation as compared with the case where data is stored by remanent polarization.

Various kinds of logic circuits can be provided by using the non-volatile latch circuit. For example, the power consumption of a logic circuit using the non-volatile latch circuit can be reduced by turning off the power of blocks not in use. In addition, since a logic state is stored even when the power is turned off, a system can be started when the power is turned on or terminated when the power is turned off, at high speed and low power.

BEST MODE FOR CARRYING OUT THE INVENTION

Figure 1:
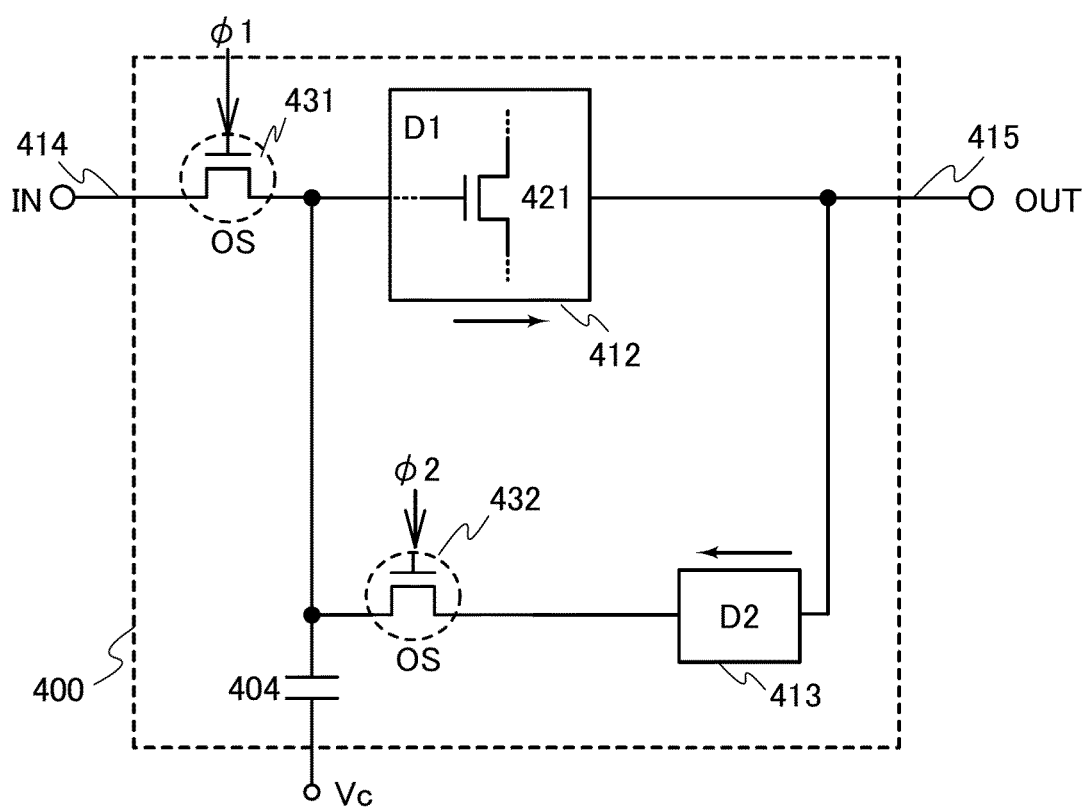
FIG. 1 illustrates an example of a configuration of a non-volatile latch circuit.

Embodiments of the present invention will be described below with reference to drawings. Note that the present invention is not limited to the following description because it is apparent to those skilled in the art that modes and details can be modified in various ways without departing from the spirit and scope of the present invention. Therefore, the present invention is not construed as being limited to the description of the embodiments. Note that in the description using drawings, like portions are denoted by like reference numerals in different drawings.

Note that the size, layer thickness, and area of each structure illustrated in the drawings and the like in the embodiments are exaggerated for simplicity in some cases. Accordingly, the scale of each structure is not necessarily limited to that illustrated in the drawings.

Note that ordinal numbers such as "first", "second", and "third" in this specification are used in order to identify components, and the terms do not limit the components numerically.

Embodiment 1

In this embodiment, a configuration and operation of a non-volatile latch circuit which is one embodiment of the disclosed invention, a configuration and a method for manufacturing an element included in the non-volatile latch circuit, and the like will be described with reference to FIG. 1, FIGS. 2A and 2B, FIGS. 3A and 3B, FIGS. 4A to 4H, FIGS. 5A to 5G, FIGS. 6A to 6D, FIG. 7, FIG. 8, FIGS. 9A and 9B, and FIG. 10.

<Configuration and Operation of Non-Volatile Latch Circuit>

FIG. 1 illustrates a configuration of a non-volatile latch circuit 400. The non-volatile latch circuit 400 illustrated in FIG. 1 has a loop structure in which an output of a first element (D1) 412 is electrically connected to an input of a second element (D2) 413 and an output of the second element (D2) 413 is electrically connected to an input of the first element (D1) 412 through a second transistor 432.

The input of the first element (D1) 412 is electrically connected to a wiring 414 to which an input signal is applied through a first transistor 431. The output of the first element (D1) 412 is electrically connected to a wiring 415 to which an output signal is applied. The wiring 414 to which an input signal is applied is a wiring supplied with a signal that is input from a circuit of a preceding stage to the non-volatile latch circuit 400. The wiring 415 to which an output signal is applied is a wiring supplied with a signal that is output from the non-volatile latch circuit 400 to a circuit of a subsequent stage.

In the case where the first element (D1) 412 has a plurality of inputs, one of the inputs can be electrically connected to the wiring 414 to which an input signal is applied through the first transistor 431. In the case where the second element (D2) 413 has a plurality of inputs, one of the inputs can be electrically connected to the output of the first element (D1) 412.

As the first element (D1) 412, it is possible to use an element from which an inverted signal of an input signal is output. For example, an inverter, a NAND, a NOR, or a clocked inverter can be used as the first element (D1) 412. An element from which an inverted signal of an input signal is output can also be used as the second element (D2) 413. For example, an inverter, a NAND, a NOR, or a clocked inverter can be used as the second element (D2) 413.

In the non-volatile latch circuit 400, the first transistor 431 and the second transistor 432, each of which uses an oxide semiconductor as a semiconductor material of a channel formation region, are used as switching elements. In addition, the non-volatile latch circuit 400 includes a capacitor 404 which is electrically connected to a source electrode or a drain electrode of the first transistor 431 and the second transistor 432. That is, one electrode of the capacitor 404 is electrically connected to one of the source electrode and the drain electrode of the first transistor 431, and the one electrode of the capacitor 404 is electrically connected to one of the source electrode and the drain electrode of the second transistor 432. The other of the source electrode and the drain electrode of the first transistor 431 is electrically connected to the wiring to which an input signal is applied. The other of the source electrode and the drain electrode of the second transistor 432 is electrically connected to the output of the second element. A potential Vc is applied to the other electrode of the capacitor 404.

In the above configuration, the first element 412 included in the non-volatile latch circuit 400 includes at least a third transistor 421. A gate of the third transistor 421 is electrically connected to the input of the first element 412. That is, the gate of the third transistor 421 is electrically connected to one of the source electrode and the drain electrode of the second transistor 432. Furthermore, the gate of the third transistor 421 is electrically connected to one of the source electrode and the drain electrode of the first transistor 431.

Figure 2A:
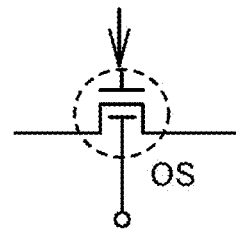
FIGS. 2A and 2B illustrate examples of part of a non-volatile latch circuit.
Figure 2B:
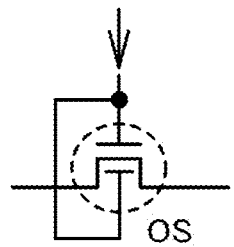

The first transistor 431 and the second transistor 432 can have a configuration illustrated in FIG. 2A or FIG. 2B instead of the configuration illustrated in FIG. 1.

A transistor illustrated in FIG. 2A includes a first gate electrode and a second gate electrode. The second gate electrode is provided opposite the first gate electrode with an oxide semiconductor layer forming a channel formation region therebetween. The first gate electrode is electrically connected to a wiring to which a signal is applied. The second gate electrode is electrically connected to a wiring to which a predetermined potential is applied. For example, the second gate electrode is electrically connected to a wiring to which a negative potential or a ground potential (GND) is applied.

In the non-volatile latch circuit using the transistor illustrated in FIG. 2A, the effect that electric properties (e.g., a threshold voltage) of the transistor are easily controlled can be obtained in addition to the effect of the non-volatile latch circuit illustrated in FIG. 1. For example, when a negative potential is applied to the second gate electrode of the transistor, the transistor can be easily made normally off (that is, the transistor can be turned off when a voltage between the gate electrode and the source electrode is approximately 0 V).

A transistor illustrated in FIG. 2B includes a first gate electrode and a second gate electrode. The second gate electrode is provided opposite the first gate electrode with an oxide semiconductor layer forming a channel formation region therebetween. The second gate electrode is electrically connected to the first gate electrode.

In the non-volatile latch circuit using the transistor illustrated in FIG. 2B, the effect that the amount of electric current of the transistor is increased can be obtained in addition to the effect of the non-volatile latch circuit illustrated in FIG. 1.

In the non-volatile latch circuit having the configuration illustrated in FIG. 1 or FIGS. 2A and 2B, data writing, data retaining, and data reading can be performed in the following manner. Note that the following description is made on the configuration of FIG. 1, but the same applies to the other configurations.

As described above, the non-volatile latch circuit 400 has a loop structure in which the output of the first element (D1) 412 is electrically connected to the input of the second element (D2) 413 and the output of the second element (D2) 413 is electrically connected to the input of the first element (D1) 412 through the second transistor 432. The capacitor 404 and the gate capacitance of the third transistor 421 are electrically connected to predetermined positions in the loop structure. Specifically, one electrode of the capacitor 404 and the gate of the third transistor 421 are electrically connected to the input of the first element (D1) 412. In this manner, the capacitor 404 and the gate capacitance of the third transistor 421 are electrically connected to predetermined positions in the loop structure of the non-volatile latch circuit 400. Thus, every time data is written to the latch circuit, a charge corresponding to the data is accumulated in the capacitor 404 and the gate capacitance of the third transistor 421. In other words, data of the latch circuit 400 is automatically written to a non-volatile latch (data writing). Data rewriting can be performed similarly.

Retention of data written to the capacitor 404 and the gate capacitance of the third transistor 421, namely, retention of a charge accumulated in the capacitor 404 and the gate capacitance of the third transistor 421, can be performed by applying a potential to the gate of the first transistor 431 and the gate of the second transistor 432 so that the first transistor 431 and the second transistor 432 are turned off (data retaining).

Here, a transistor used as the first transistor 431 and the second transistor 432 uses an oxide semiconductor layer for a channel formation region and has normally-off characteristics and a significantly low off-state current. Thus, a charge accumulated in the capacitor can be kept retained even after a power source voltage has stopped to be supplied to at least the first element (D1) 412 and the second element (D2) 413 included in the latch circuit 400. Consequently, the logic state of the latch circuit 400 can be kept stored even after the supply of the power source voltage has stopped.

The capacitor 404 and the gate capacitance of the third transistor 421 are electrically connected to the input of the first element (D1) 412. Thus, after the power source voltage restarts to be supplied to at least the first element (D1) 412 of the latch circuit 400, the potential of an output signal OUT is determined by the charge accumulated in the capacitor 404 and the gate capacitance of the third transistor 421. That is, the data written to the capacitor 404 and the gate capacitance of the third transistor 421 can be read (data reading).

As the oxide semiconductor layer used for the channel formation region of each of the first transistor 431 and the second transistor 432, the following oxide semiconductors can be used: an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are oxides of two metal elements; or an In—O-based oxide semiconductor, a Sn—O-based oxide semiconductor, or a Zn—O-based oxide semiconductor. In addition, the above oxide semiconductor materials may contain $SiO_2$.

In the above structure, for example, an In—Sn—Ga—Zn—O-based oxide semiconductor means an oxide semiconductor containing at least In, Sn, Ga, and Zn. There is no limitation on the composition ratio of each metal element, and metal elements other than In, Sn, Ga, and Zn may be contained.

Alternatively, as the oxide semiconductor layer, a film containing a material represented by $InMO_3(ZnO)_m$ (m>0, and m is not a natural number) can be used. Here, M denotes one or more of metal elements selected from Ga, Al, Mn, and Co. For example, M can be Ga, Ga and Al, Ga and Mn, or Ga and Co.

In the above structure, the concentration of hydrogen in the oxide semiconductor layer can be less than or equal to $5\times10^{19}/cm^3$, preferably less than or equal to $5\times10^{18}/cm^3$, more preferably less than or equal to $5\times10^{17}/cm^3$, and still more preferably less than or equal to $1\times10^{16}/cm^3$. In addition, the carrier concentration of the oxide semiconductor layer can be less than $1\times10^{14}/cm^3$, preferably less than $1\times10^{12}/cm^3$, and more preferably less than $1\times10^{11}/cm^3$.

In the above structure, the transistor 431 and the transistor 432 each using an oxide semiconductor may be a bottom-gate transistor or a top-gate transistor. Further, the transistor 431 and the transistor 432 may be a bottom-contact transistor or a top-contact transistor. A bottom-gate transistor includes at least a gate electrode over an insulating surface; a gate insulating film over the gate electrode; and an oxide semiconductor layer which overlaps with the gate electrode over the gate insulating film and serves as a channel formation region. A top-gate transistor includes at least an oxide semiconductor layer over an insulating surface which serves as a channel formation region; a gate insulating film over the oxide semiconductor layer; and a gate electrode which overlaps with the oxide semiconductor layer over the gate insulating film. A bottom-contact transistor includes an oxide semiconductor layer which serves as a channel formation region over a source electrode and a drain electrode. A top-contact transistor includes a source electrode and a drain electrode over an oxide semiconductor layer which serves as a channel formation region.

A transistor (the first transistor 431 and the second transistor 432) including a channel formation region formed using an oxide semiconductor layer made of the aforementioned oxide semiconductor material, can have the following characteristics: in the case where a drain voltage Vd applied to a drain electrode is +1 V or +10 V and a gate voltage Vg applied to a gate electrode is in the range of −5 V to −20 V, an off-state current at room temperature (e.g., at 20° C.) is less than or equal to $10^{-13}$ A; and a subthreshold swing (S value) is approximately 0.1 V/dec. (a gate insulating film: 100 nm thickness) even in the case where, for example, the transistor has a channel width W of $1 \times 10^4$ µm and a channel length of 3 µm. In addition, the above transistor has normally-off characteristics in which the transistor is turned off when a voltage between a gate electrode and a source electrode is approximately 0 V (that is, a threshold voltage is a positive value in the case of an n-channel transistor).

Thus, the above transistor has the following characteristics: an off-state current (also referred to as a leakage current) when a voltage between the gate electrode and the source electrode is approximately 0 V, is much smaller than that of a transistor using silicon for a channel formation region. For example, the aforementioned transistor with $W=1\times10^4$ µm has a leakage current of 10 aA/µm or less per 1 µm of channel width at room temperature.

Accordingly, when the transistor including a channel formation region formed using an oxide semiconductor layer is used as a switching element, a charge accumulated in the capacitor can be kept retained even after the supply of a power source voltage to the latch circuit has stopped. That is, data written to the capacitor can be kept retained.

For example, it is possible to realize a much longer refresh time than that of a DRAM which is formed using a transistor including a channel formation region made of silicon, and also to realize memory retention characteristics (data retention characteristics) almost as good as those of a non-volatile memory. Furthermore, after a power source voltage has restarted to be supplied to the latch circuit, data retained in the capacitor can be read. As a result, the logic state can be returned to that before the supply of a power source voltage stops.

Moreover, the above transistor has good temperature characteristics, and can have a sufficiently low off-state current and a sufficiently high on-state current even at high temperature. For example, as for the Vg-Id characteristics of the transistor, the following data is obtained: an on-state current, a mobility, and an S value have small temperature dependence in the range of −25° C. to 150° C.; and an off-state current is as extremely small as less than or equal to $1\times10^{-13}$ A in this temperature range.

It is considered that the aforementioned characteristics can be obtained by using, for the channel formation region of the transistor, an oxide semiconductor which has a sufficiently low hydrogen concentration to be highly purified and to have a sufficiently low carrier concentration, namely, an intrinsic (i-type) or substantially intrinsic (i-type) oxide semiconductor. That is, the channel formation region of the transistor is made of an oxide semiconductor from which hydrogen as an n-type impurity is removed so that impurities other than a main component of the oxide semiconductor are contained as little as possible, and which is highly purified to be an intrinsic (i-type) or substantially intrinsic (i-type) oxide semiconductor.

Note that in this specification, a semiconductor with a carrier concentration of less than $1\times10^{11}/cm^3$ is called an "intrinsic" ("i-type") semiconductor, and a semiconductor with a carrier concentration of $1\times10^{11}/cm^3$ or more and less than $1\times10^{12}/cm^3$ is called a "substantially intrinsic" ("substantially i-type") semiconductor.

By using such an intrinsic (i-type) or substantially intrinsic (i-type) oxide semiconductor, a transistor can have an off-state current of 10 aA ($1\times10^{-17}$ A)/µm or less, preferably 1 aA ($1\times10^{-18}$ A)/µm or less per 1 µm of channel width W.

As described above, in this embodiment, the first transistor 431 and the second transistor 432 using the oxide semiconductor as a semiconductor material of a channel formation region are used as the switching elements; thus, it is possible to provide a non-volatile latch circuit which operates in a wide temperature range and stably operates even at high temperature, and in which a stored logic state is not erased even when the power is turned off.

Note that the concentration of hydrogen in the oxide semiconductor layer is a concentration measured by SIMS (secondary ion mass spectrometry).

<Structure of Elements in Non-Volatile Latch Circuit>

Some elements included in the non-volatile latch circuit 400, other than the first transistor 431 and the second transistor 432 using an oxide semiconductor, can be made of a semiconductor material other than an oxide semiconductor. As the material other than an oxide semiconductor, single crystal silicon, crystalline silicon, or the like can be used. For example, the element other than the first transistor 431 and the second transistor 432 can be provided over a substrate containing a semiconductor material. As the substrate containing a semiconductor material, a silicon wafer, an SOI (silicon on insulator) substrate, a silicon film over an insulating surface, or the like can be used. The use of the material other than an oxide semiconductor enables high-speed operation.

For example, the third transistor 421 included in the first element (D1) 412 can be made of a material (such as silicon) other than an oxide semiconductor. Other elements included in the first element (D1) 412 and the second element (D2) 413 can also be made of a material (such as silicon) other than an oxide semiconductor.

Another element such as the capacitor 404 included in the non-volatile latch circuit 400 can be formed using the same material and over the same layer as a semiconductor layer, an insulating layer, a conductive layer, or a conductive layer used as a wiring included in the transistor using an oxide semiconductor (the first transistor 431, the second transistor 432) or the transistor using a material (such as silicon) other than an oxide semiconductor.

For example, the third transistor 421 using a material other than an oxide semiconductor can be provided in the lower portion, and the first transistor 431 and the second transistor 432 each using an oxide semiconductor can be provided in the upper portion. Then, an excellent non-volatile latch circuit having characteristics of both of the transistors can be manufactured.

Figure 3A:
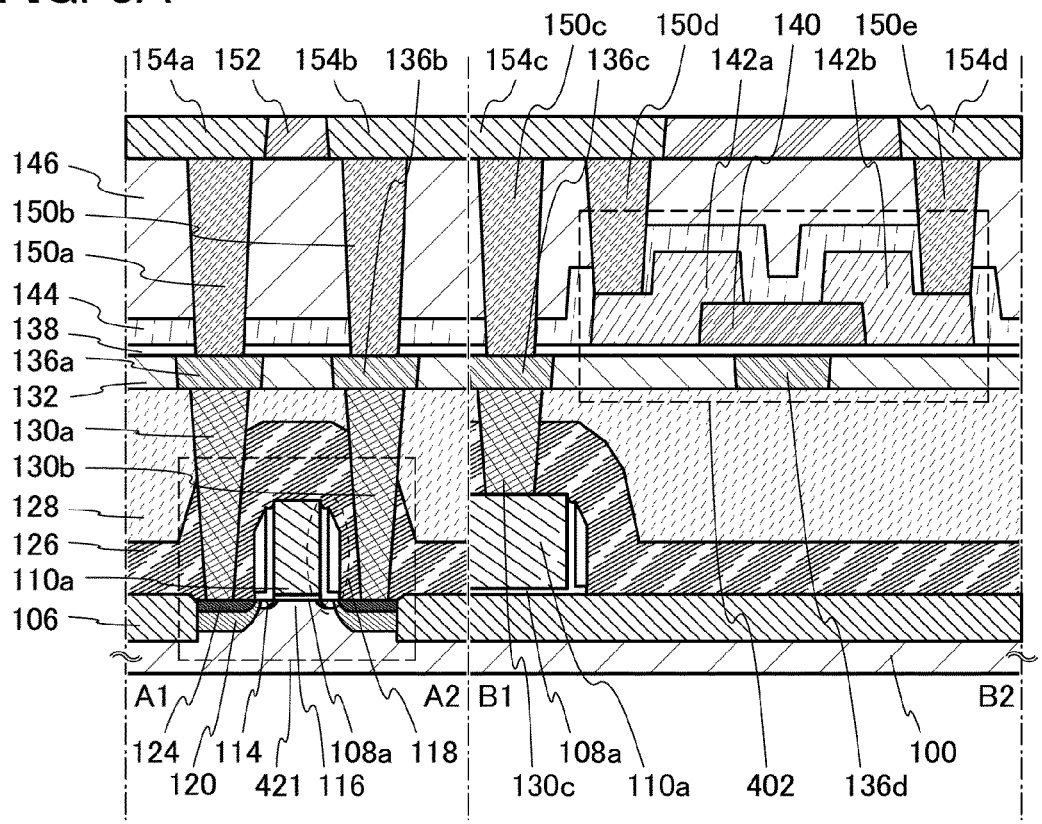
FIGS. 3A and 3B are respectively a cross-sectional view and a top view of an element included in a non-volatile latch circuit.
Figure 3B:
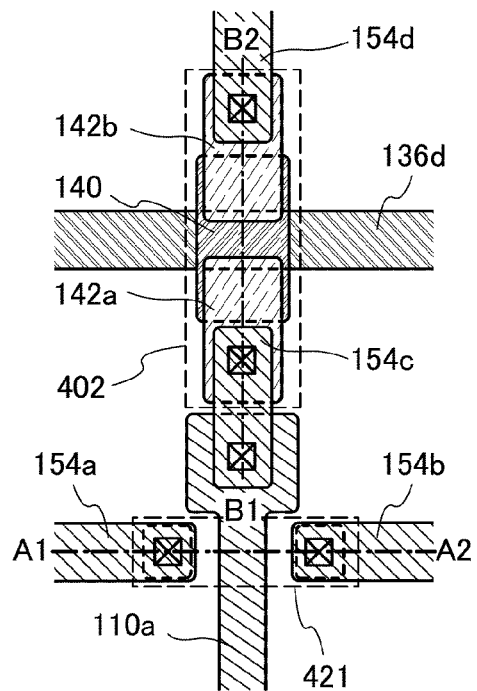

FIGS. 3A and 3B illustrate an example of structures of elements included in the non-volatile latch circuit. In FIG. 3A, the transistor 421 using a material other than an oxide semiconductor is provided in the lower portion and a transistor 402 using an oxide semiconductor is provided in the upper portion. The transistor 402 is used as the first transistor 431 and the second transistor 432. The transistor 421 is used as the third transistor 421.

FIG. 3A is a cross-sectional view and FIG. 3B is a top view. FIG. 3A corresponds to a cross section along a line A1-A2 and a line B1-B2 in FIG. 3B. In FIGS. 3A and 3B, the transistor 421 using a material other than an oxide semiconductor is provided in the lower portion and the transistor 402 using an oxide semiconductor is provided in the upper portion.

The transistor 421 includes a channel formation region 116 in a substrate 100 containing a semiconductor material; impurity regions 114 and high-concentration impurity regions 120 (also correctively referred to as impurity regions simply); a gate insulating layer 108a over the channel formation region 116; a gate electrode 110a over the gate insulating layer 108a; and a source or drain electrode 130a and a source or drain electrode 130b electrically connected to the impurity regions 114 (see FIG. 3A).

Sidewall insulating layers 118 are provided on side surfaces of the gate electrode 110a. The high-concentration impurity regions 120 are provided in regions of the substrate 100 which do not overlap with the sidewall insulating layers 118 when seen from above, and metal compound regions 124 are provided in contact with the high-concentration impurity regions 120. An element isolation insulating layer 106 is provided over the substrate 100 so as to surround the transistor 421. An interlayer insulating layer 126 and an interlayer insulating layer 128 are provided to surround the transistor 421. Note that the sidewall insulating layers 118 are not necessarily provided in the case of high miniaturization of the semiconductor element.

The source or drain electrode 130a and the source or drain electrode 130b are electrically connected to the metal compound regions 124 through openings formed in the interlayer insulating layer 126 and the interlayer insulating layer 128. In other words, the source or drain electrode 130a and the source or drain electrode 130b are electrically connected to the high-concentration impurity regions 120 and the impurity regions 114 through the metal compound regions 124.

The transistor 402 includes a gate electrode 136d over the interlayer insulating layer 128; a gate insulating layer 138 over the gate electrode 136d; an oxide semiconductor layer 140 over the gate insulating layer 138; and a source or drain electrode 142a and a source or drain electrode 142b which are over the oxide semiconductor layer 140 and electrically connected to the oxide semiconductor layer 140 (see FIG. 3A).

A protective insulating layer 144 is provided over the transistor 402 so as to be in contact with part of the oxide semiconductor layer 140. An interlayer insulating layer 146 is provided over the protective insulating layer 144. The protective insulating layer 144 and the interlayer insulating layer 146 include openings reaching the source or drain electrode 142a and the source or drain electrode 142b. An electrode 150d and an electrode 150e are provided in contact with the source or drain electrode 142a and the source or drain electrode 142b through the openings.

At the same time as the formation of the electrode 150d and the electrode 150e, an electrode 150a, an electrode 150b, and an electrode 150c are formed in contact with an electrode 136a, an electrode 136b, and an electrode 136c, respectively, through openings formed in the gate insulating layer 138, the protective insulating layer 144, and the interlayer insulating layer 146. Although a bottom-gate transistor is used as the transistor 402 for example, the structure of the transistor is not limited to this and a top-gate transistor may be used.

An insulating layer 152 is provided over the interlayer insulating layer 146. An electrode 154a, an electrode 154b, an electrode 154c, and an electrode 154d are provided to be embedded in the insulating layer 152. The electrode 154a, the electrode 154b, the electrode 154c, and the electrode 154d are in contact with the electrode 150a, the electrode 150b, the electrodes 150c and 150d, and the electrode 150e, respectively.

That is, the source or drain electrode 142a of the transistor 402 is electrically connected to other elements (such as the transistor using a material other than an oxide semiconductor) through an electrode 130c, the electrode 136c, the electrode 150c, the electrode 154c, and the electrode 150d (see FIG. 3A). The source or drain electrode 142b of the transistor 402 is electrically connected to other elements through the electrode 150e and the electrode 154d. Note that the structure of connection electrodes (such as the electrode 130c, the electrode 136c, the electrode 150c, the electrode 154c, and the electrode 150d) is not limited to the above, and the electrodes may be added, omitted, or the like as appropriate.

Although an example of the connection relationship is shown above, an embodiment of the disclosed invention is not limited to this.

The oxide semiconductor layer 140 is preferably a highly-purified oxide semiconductor layer from which an impurity such as hydrogen is sufficiently removed. Specifically, the concentration of hydrogen in the oxide semiconductor layer 140, which is measured by secondary ion mass spectrometry (SIMS), is less than or equal to $5 \times 10^{19}/cm^3$, preferably less than or equal to $5 \times 10^{18}/cm^3$, more preferably less than or equal to $5 \times 10^{17}/cm^3$, and still more preferably less than $1 \times 10^{16}/cm^3$.

Note that the highly-purified oxide semiconductor layer 140 having a sufficiently low hydrogen concentration has a carrier concentration (e.g., less than $1 \times 10^{12}/cm^3$, less than preferably $1 \times 10^{11}/cm^3$) which is much lower than that of a typical silicon wafer (a silicon wafer to which an impurity element such as phosphorus or boron is slightly added) (approximately $1 \times 10^{14}/cm^3$).

By using such an i-type or substantially i-type oxide semiconductor, the transistor 402 with excellent off-current characteristics can be obtained. For example, in the case where a drain voltage Vd applied to the drain electrode is +1 V or +10 V and a gate voltage Vg applied to the gate electrode is in the range of −5 V to −20 V, an off-state current at room temperature is less than or equal to $10^{-13}$ A even in the case where the transistor has a channel width W of $1 \times 10^4$ μm and a channel length of 3 μm. In addition, the transistor 402 has the properties as a normally-off transistor.

Thus, the transistor 402 has the following characteristics: an off-state current (also referred to as a leakage current) when a voltage between the gate electrode and the source electrode is approximately 0 V, is much smaller than that of a transistor using silicon for a channel formation region. For example, the transistor 402 has a leakage current of 10 aA/μm or less per 1 μm of channel width at room temperature.

Moreover, the transistor 402 has good temperature characteristics, and can have a sufficiently low off-state current and a sufficiently high on-state current even at high temperature. For example, as for the Vg-Id characteristics of the transistor, the following data is obtained: an on-state current, a mobility, and an S value have small temperature dependence in the range of −25° C. to 150° C.; and an off-state current is as extremely small as less than or equal to $1\times10^{-13}$ A in this temperature range.

By using such an intrinsic (i-type) or substantially intrinsic (i-type) oxide semiconductor, the transistor can have an off-state current of 10 aA ($1\times10^{-17}$ A)/μm or less, preferably 1 aA ($1\times10^{-18}$ A)/μm or less per 1 μm of channel width W.

As described above, when the highly-purified oxide semiconductor layer 140 having a sufficiently low hydrogen concentration is used so that the off-state current of the transistor 402 is reduced, a semiconductor device with a new structure can be realized.

<Method for Manufacturing Elements in Non-Volatile Latch Circuit>

Next, an example of a method for manufacturing elements included in the aforementioned non-volatile latch circuit will be described. First, a method for manufacturing the transistor 421 will be described with reference to FIGS. 4A to 4H, and then a method for manufacturing the transistor 402 will be described with reference to FIGS. 5A to 5G or FIGS. 6A to 6D. With the manufacturing method shown below, the elements included in the aforementioned non-volatile latch circuit can be manufactured. Note that FIGS. 4A to 4H illustrate only a cross section along the line A1-A2 in FIG. 3A. FIGS. 5A to 5G and FIGS. 6A to 6D illustrate a cross section along the line A1-A2 and the line B1-B2 in FIG. 3A.

<Method for Manufacturing Transistor in Lower Portion>

Figure 4A:
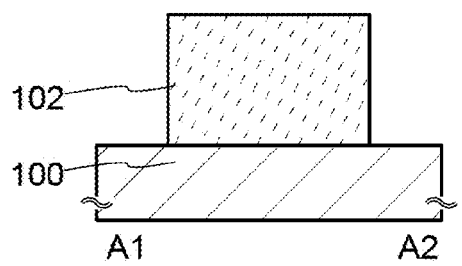
FIGS. 4A to 4H illustrate an example of a method for manufacturing an element included in a non-volatile latch circuit.

First, the substrate 100 including a semiconductor material is prepared (see FIG. 4A). As the substrate 100 including a semiconductor material, a single crystal semiconductor substrate or a polycrystalline semiconductor substrate made of silicon, silicon carbide, or the like; a compound semiconductor substrate made of silicon germanium or the like; or an SOI substrate can be used for example. An example shown here is the case of using a single crystal silicon substrate as the substrate 100 including a semiconductor material.

Note that in general, an "SOI substrate" means a substrate where a silicon semiconductor layer is provided on an insulating surface. In this specification and the like, the "SOI substrate" also includes a substrate where a semiconductor layer formed of a material other than silicon is provided over an insulating surface in its category. That is, a semiconductor layer included in the "SOI substrate" is not limited to a silicon semiconductor layer. Further, the SOI substrate may have a structure in which a semiconductor layer is provided over an insulating substrate such as a glass substrate.

A protective layer 102 serving as a mask for forming an element isolation insulating layer is formed over the substrate 100 (see FIG. 4A). As the protective layer 102, for example, an insulating layer made of silicon oxide, silicon nitride, silicon nitride oxide, or the like can be used. Note that before or after this step, an impurity element imparting n-type conductivity or an impurity element imparting p-type conductivity may be added to the substrate 100 in order to control the threshold voltage of the transistor. In the case where silicon is used as the semiconductor material, phosphorus, arsenic, or the like can be used as the impurity imparting n-type conductivity, and boron, aluminum, gallium, or the like can be used as the impurity imparting p-type conductivity.

Next, part of the substrate 100 in a region that is not covered with the protective layer 102 (i.e., in an exposed region) is removed by etching, using the protective layer 102 as a mask. Thus, an isolated semiconductor region 104 is formed (see FIG. 4B). As the etching, dry etching is preferably performed, but wet etching can be performed. An etching gas or an etchant can be selected as appropriate depending on a material to be etched.

Figure 4B:
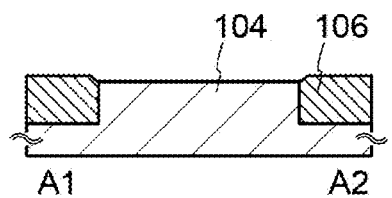

Then, an insulating layer is formed to cover the semiconductor region 104, and the insulating layer in a region overlapping with the semiconductor region 104 is selectively removed, so that element isolation insulating layers 106 are formed (see FIG. 4B). The insulating layer is made of silicon oxide, silicon nitride, silicon nitride oxide, or the like. As a method for removing the insulating layer, any of etching treatment and polishing treatment such as CMP can be employed. Note that the protective layer 102 is removed after the formation of the semiconductor region 104 or after the formation of the element isolation insulating layers 106.

Next, an insulating layer is formed over the semiconductor region 104, and a layer including a conductive material is formed over the insulating layer.

The insulating layer serves as a gate insulating layer later, and preferably has a single-layer structure or a layered structure using a film containing silicon oxide, silicon nitride oxide, silicon nitride, hafnium oxide, aluminum oxide, tantalum oxide, or the like formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer, and for example, the insulating layer can have a thickness of 1 nm to 100 nm inclusive.

The layer including a conductive material can be made of a metal material such as aluminum, copper, titanium, tantalum, or tungsten. The layer including a conductive material may also be formed of a semiconductor material such as polycrystalline silicon which contains an impurity element imparting conductivity. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is made of a metal material.

Figure 4C:
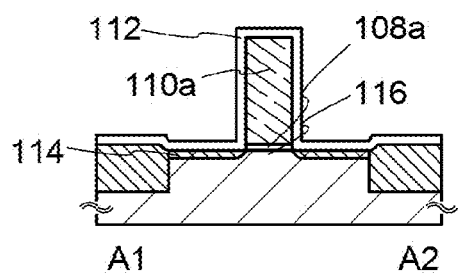

After that, the insulating layer and the layer including a conductive material are selectively etched, whereby the gate insulating layer 108a and the gate electrode 110a are formed (see FIG. 4C).

Next, an insulating layer 112 that covers the gate electrode 110a is formed (see FIG. 4C). Phosphorus (P), arsenic (As), or the like is then added to the semiconductor region 104, whereby the impurity regions 114 with a shallow junction depth are formed (see FIG. 4C). Note that phosphorus or arsenic is added here in order to form an n-channel transistor; an impurity element such as boron (B) or aluminum (Al) may be added in the case of forming a p-channel transistor.

With the formation of the impurity regions 114, the channel formation region 116 is formed in the semiconductor region 104 below the gate insulating layer 108a (see FIG. 4C). Here, the concentration of the impurity added can be set as appropriate; the concentration is preferably increased when the size of a semiconductor element is extremely decreased. The step in which the impurity regions 114 are formed after the formation of the insulating layer 112 is employed here; alternatively, the insulating layer 112 may be formed after the formation of the impurity regions 114.

Figure 4D:
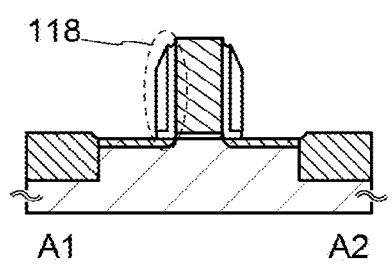
Figure 4E:
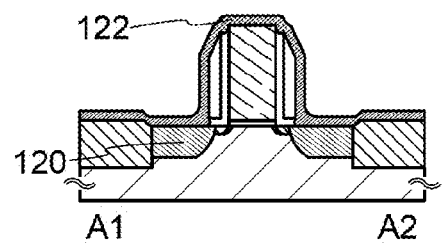
Figure 4F:
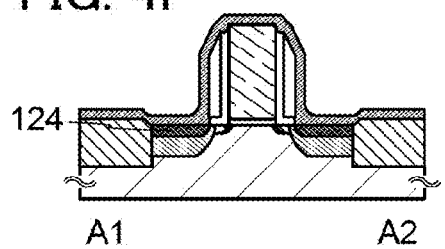

Next, the sidewall insulating layers 118 are formed (see FIG. 4D). When an insulating layer is formed to cover the insulating layer 112 and then subjected to highly anisotropic etching, the sidewall insulating layers 118 can be formed in a self-aligned manner. At this time, it is preferable to partly etch the insulating layer 112 so that a top surface of the gate electrode 110a and top surfaces of the impurity regions 114 are exposed. Note that the sidewall insulating layers 118 are not necessarily provided in the case of high miniaturization of the semiconductor element.

Then, an insulating layer is formed to cover the gate electrode 110a, the impurity regions 114, the sidewall insulating layers 118, and the like. Then, phosphorus (P), arsenic (As), or the like is added to regions in contact with the impurity regions 114; thus, the high-concentration impurity regions 120 are formed. After that, the insulating layer is removed, and a metal layer 122 is formed to cover the gate electrode 110a, the sidewall insulating layers 118, the high-concentration impurity regions 120, and the like (see FIG. 4E).

The metal layer 122 can be formed by a variety of film formation methods such as a vacuum evaporation method, a sputtering method, or a spin coating method. The metal layer 122 is preferably made of a metal material that reacts with a semiconductor material included in the semiconductor region 104 to be a low-resistance metal compound. Examples of such a metal material include titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 4F). Note that when the gate electrode 110a is made of polycrystalline silicon or the like, a metal compound region is also formed in a region of the gate electrode 110a in contact with the metal layer 122.

As the heat treatment, irradiation with a flash lamp can be employed, for example. Although it is needless to say that another heat treatment method can be used, a method by which heat treatment can be achieved in an extremely short time is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Figure 4G:
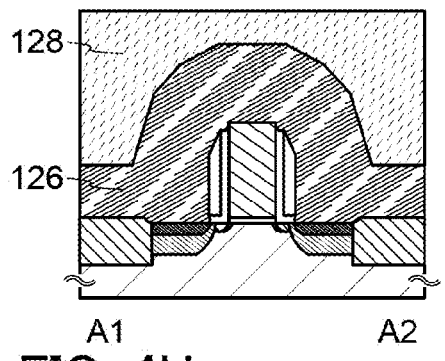

Then, the interlayer insulating layer 126 and the interlayer insulating layer 128 are formed to cover the components formed in the above steps (see FIG. 4G). The interlayer insulating layers 126 and 128 can be formed of an inorganic insulating material such as silicon oxide, silicon nitride oxide, silicon nitride, hafnium oxide, aluminum oxide, or tantalum oxide. Alternatively, the interlayer insulating layers 126 and 128 can be formed of an organic insulating material such as polyimide or acrylic. Note that a two-layer structure of the interlayer insulating layer 126 and the interlayer insulating layer 128 is employed here; however, the structure of an interlayer insulating layer is not limited to this structure. After the formation of the interlayer insulating layer 128, a surface of the interlayer insulating layer 128 is preferably planarized with CMP, etching, or the like.

Figure 4H:
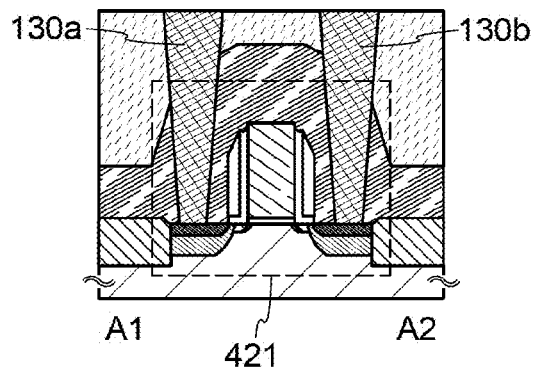

Then, openings that reach the metal compound regions 124 are formed in the interlayer insulating layers, and the source or drain electrode 130a and the source or drain electrode 130b are formed in the openings (see FIG. 4H). The source or drain electrodes 130a and 130b can be formed in such a manner, for example, that a conductive layer is formed in a region including the openings by a PVD method, a CVD method, or the like and then part of the conductive layer is removed by etching, CMP, or the like.

Note that in the case where the source or drain electrodes 130a and 130b are formed by removing part of the conductive layer, the surfaces are preferably processed to be planarized. For example, when a thin titanium film or a thin titanium nitride film is formed in a region including the openings and then a tungsten film is formed to be embedded in the openings, subsequent CMP allows removing unnecessary tungsten, titanium, titanium nitride, or the like and improving the flatness of the surface. When the surface including the source or drain electrodes 130a and 130b is planarized in such a manner, so that an electrode, a wiring, an insulating layer, a semiconductor layer, and the like can be favorably formed in later steps.

There is no particular limitation on a material used for the source or drain electrodes 130a and 130b, and a variety of conductive materials can be used. For example, a conductive material such as molybdenum, titanium, chromium, tantalum, tungsten, aluminum, copper, neodymium, or scandium can be used. Note that only the source or drain electrodes 130a and 130b in contact with the metal compound regions 124 are shown here; in this step, an electrode 130c in FIG. 3A, and the like can also be formed.

Specifically, for example, the conductive layer can be formed as follows: a thin titanium film is formed by a PVD method in a region including the openings, and a thin titanium nitride film is formed by a CVD method; then, a tungsten film is formed to be embedded in the openings. Here, the titanium film formed by a PVD method has a function of reducing an oxide film which may be formed on the surface of the metal compound regions and decreasing the contact resistance with the metal compound regions. The titanium nitride film formed after the formation of the titanium film has a barrier function of preventing diffusion of the conductive material. A copper film may be formed by a plating method after the formation of the barrier film of titanium, titanium nitride, or the like. Note that not only a so-called single damascene method but also a dual damascene method may be employed.

Through the above steps, the transistor 421 using the substrate 100 including a semiconductor material is obtained. Note that an electrode, a wiring, an insulating layer, or the like may be further formed after the above steps. When the wirings have a multi-layer structure of a layered structure including an interlayer insulating layer and a conductive layer, a highly integrated semiconductor device can be provided.

<Method for Manufacturing Transistor in Upper Portion>

Next, steps for manufacturing the transistor 402 over the interlayer insulating layer 128 will be described with reference to FIGS. 5A to 5G and FIGS. 6A to 6D. Note that FIGS. 5A to 5G and FIGS. 6A to 6D illustrate steps for manufacturing electrodes, the transistor 402, and the like over the interlayer insulating layer 128; therefore, the transistor 421 and the like placed below the transistor 402 are omitted.

Figure 5A:
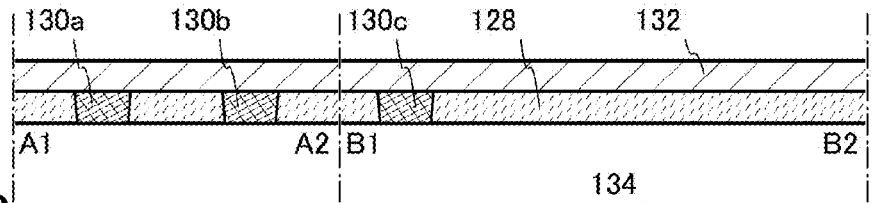
FIGS. 5A to 5G illustrate an example of a method for manufacturing an element included in a non-volatile latch circuit.
Figure 5B:
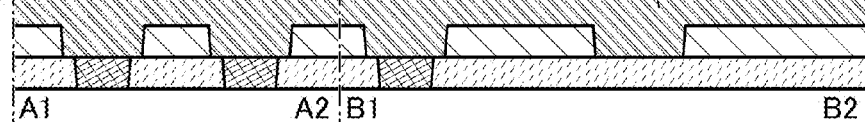

First, an insulating layer 132 is formed over the interlayer insulating layer 128, the source or drain electrodes 130a and 130b, and the electrode 130c (see FIG. 5A). Next, openings that reach the source or drain electrodes 130a and 130b and the electrode 130c are formed in the insulating layer 132. Then, a conductive layer 134 is formed to be embedded in the openings (see FIG. 5B). After that, part of the conductive layer 134 is removed by etching, CMP, or the like, so that the insulating layer 132 is exposed and the electrodes 136a, 136b, and 136c and the gate electrode 136d are formed (see FIG. 5C).

The insulating layer 132 can be formed by a PVD method, a CVD method, or the like. The insulating layer 132 can be formed of an inorganic insulating material such as silicon oxide, silicon nitride oxide, silicon nitride, hafnium oxide, aluminum oxide, or tantalum oxide.

The openings in the insulating layer 132 can be formed by etching using a mask, or the like. The mask can be formed by a method such as light exposure using a photomask. Either wet etching or dry etching may be used as the etching; dry etching is preferably used in terms of microfabrication.

The conductive layer 134 can be formed by a film formation method such as a PVD method or a CVD method. Examples of the material used for the conductive layer 134 include a conductive material such as molybdenum, titanium, chromium, tantalum, tungsten, aluminum, copper, neodymium, and scandium; and an alloy and compound (e.g. nitride) of any of these materials.

More specifically, the conductive layer 134 can be formed in such a manner, for example, that a thin titanium film is formed in a region including the openings by a PVD method and a thin titanium nitride film is formed by a CVD method, and then, a tungsten film is formed to be embedded in the openings. Here, the titanium film formed by a PVD method has a function of reducing an oxide film which may be formed on the surface of lower electrodes (here, the source or drain electrodes 130a and 130b, the electrode 130c, and the like) and decreasing the contact resistance with the lower electrodes.

The titanium nitride film formed after the formation of the titanium film has a barrier function of preventing diffusion of the conductive material. A copper film may be formed by a plating method after the formation of the barrier film of titanium, titanium nitride, or the like. Note that not only a so-called single damascene method but also a dual damascene method may be employed.

Figure 5C:
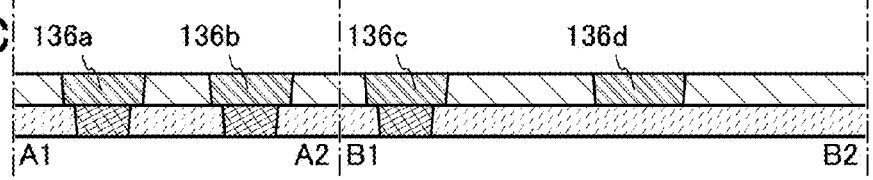

After the conductive layer 134 is formed, part of the conductive layer 134 is removed by etching, CMP, or the like, so that the insulating layer 132 is exposed and the electrodes 136a, 136b, and 136c and the gate electrode 136d are formed (see FIG. 5C). Note that when the electrodes 136a, 136b, and 136c and the gate electrode 136d are formed by removing part of the conductive layer 134, the surfaces are preferably processed to be planarized. When the surfaces of the insulating layer 132, the electrodes 136a, 136b, and 136c, and the gate electrode 136d are planarized in such a manner, an electrode, a wiring, an insulating layer, a semiconductor layer, and the like can be favorably formed in later steps.

Figure 5D:
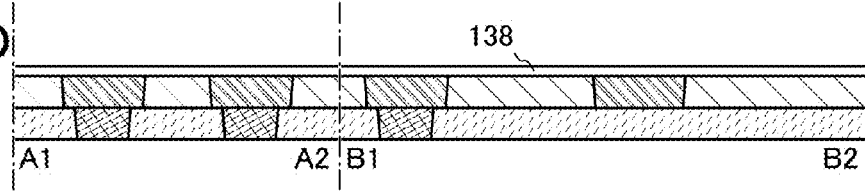

Next, the gate insulating layer 138 is formed to cover the insulating layer 132, the electrodes 136a, 136b, and 136c, and the gate electrode 136d (see FIG. 5D). The gate insulating layer 138 can be formed by a CVD method, a sputtering method, or the like. The gate insulating layer 138 is preferably made of silicon oxide, silicon nitride, silicon oxynitride, silicon nitride oxide, aluminum oxide, hafnium oxide, tantalum oxide, or the like. Note that the gate insulating layer 138 may have a single-layer structure or a layered structure.

For example, the gate insulating layer 138 made of silicon oxynitride can be formed by a plasma CVD method using silane ($SiH_4$), oxygen, and nitrogen as a source gas. There is no particular limitation on the thickness of the gate insulating layer 138, and for example, the gate insulating layer 138 can have a thickness of 10 nm to 500 nm inclusive. In the case of employing a layered structure, for example, the gate insulating layer 138 is preferably a stack of a first gate insulating layer with a thickness of 50 nm to 200 nm inclusive, and a second gate insulating layer with a thickness of 5 nm to 300 nm inclusive over the first gate insulating layer.

If hydrogen, water, or the like is contained in the gate insulating layer 138, hydrogen may enter the oxide semiconductor layer or extract oxygen from the oxide semiconductor layer, which may cause degradation of characteristics of the transistor. Thus, it is preferable that the gate insulating layer 138 contain as little hydrogen or water as possible.

In the case of using a sputtering method or the like, for example, it is preferable that the gate insulating layer 138 be formed in a state where moisture remaining in the treatment chamber is removed. In order to remove moisture remaining in the treatment chamber, an entrapment vacuum pump such as a cryopump, an ion pump, or a titanium sublimation pump is preferably used. A turbo pump provided with a cold trap may be used. From the treatment chamber evacuated with a cryopump or the like, hydrogen, water, or the like is sufficiently removed; thus, the concentration of an impurity in the gate insulating layer 138 can be reduced.

When the gate insulating layer 138 is formed, it is preferable to use a high-purity gas in which the concentration of an impurity such as hydrogen or water is reduced is reduced to less than or equal to 1 ppm (preferably, less than or equal to 1 ppb).

Note that an oxide semiconductor which is made to be an i-type or a substantially i-type oxide semiconductor by removing impurities (a highly-purified oxide semiconductor) is extremely sensitive to an interface state or an interface electric charge; therefore, when such an oxide semiconductor is used for an oxide semiconductor layer, an interface between the oxide semiconductor layer and a gate insulating layer is important. In other words, the gate insulating layer 138 that is in contact with a highly-purified oxide semiconductor layer needs to have high quality.

For example, a high-density plasma CVD method using microwave (2.45 GHz) is favorable because the dense and high-quality gate insulating layer 138 having high withstand voltage can be formed thereby. This is because when the highly-purified oxide semiconductor layer is in close contact with the high-quality gate insulating layer, the interface state can be reduced and favorable interface properties can be obtained.

It is needless to say that, even when a highly-purified oxide semiconductor layer is used, another method such as a sputtering method or a plasma CVD method can be employed as long as a high-quality insulating layer can be formed as the gate insulating layer. Moreover, it is possible to use an insulating layer whose quality and interface characteristics are improved with heat treatment performed after the formation of the insulating layer. In any case, an insulating layer that has favorable film quality as the gate insulating layer 138 and can reduce interface state density with an oxide semiconductor layer to form a favorable interface is formed as the gate insulating layer 138.

Figure 5E:
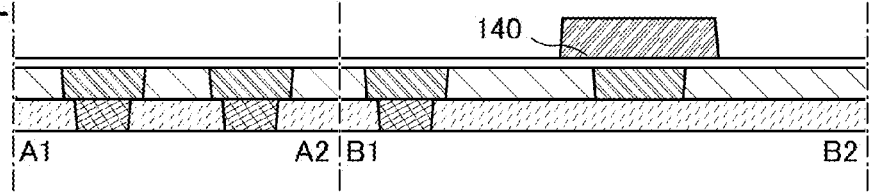

Next, an oxide semiconductor layer is formed over the gate insulating layer 138 and processed by a method such as etching using a mask, so that the island-shaped oxide semiconductor layer 140 is formed (see FIG. 5E).

As the oxide semiconductor layer, the following oxide semiconductors can be used: an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are oxides of two metal elements; or an In—O-based oxide semiconductor, a Sn—O-based oxide semiconductor, or a Zn—O-based oxide semiconductor. In addition, the above oxide semiconductor materials may contain $SiO_2$.

Alternatively, as the oxide semiconductor layer, a thin film containing a material represented by $InMO_3$ $(ZnO)_m$ (m>0, and m is not a natural number) can be used. Here, M denotes one or more of metal elements selected from Ga, Al, Mn, and Co. For example, M can be Ga, Ga and Al, Ga and Mn, or Ga and Co.

In this embodiment, an amorphous oxide semiconductor layer is formed as the oxide semiconductor layer by a sputtering method with use of an In—Ga—Zn—O-based metal oxide target. Note that since crystallization of an amorphous oxide semiconductor layer can be suppressed by adding silicon to the amorphous oxide semiconductor layer, an oxide semiconductor layer may be formed, for example, using a target containing $SiO_2$ of 2 wt % to 10 wt % inclusive.

As the target for forming the oxide semiconductor layer by a sputtering method, it is possible to use, for example, a target having a composition ratio of $In_2O_3:Ga_2O_3:ZnO=1:1:1$ [molar ratio]. It is also possible to use a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio]. The filling factor of the metal oxide target is 90% to 100% inclusive, and preferably higher than or equal to 95% (e.g., 99.9%). With use of a metal oxide target with high filling factor, an oxide semiconductor layer which is a dense film can be formed.

The atmosphere in which the oxide semiconductor layer is formed is preferably a rare gas (typically argon) atmosphere, an oxygen atmosphere, or a mixed atmosphere of a rare gas (typically argon) and oxygen. Specifically, it is preferable to use, for example, a high-purity gas atmosphere from which an impurity such as hydrogen, water, a hydroxyl group, or hydride is removed to a concentration of less than or equal to 1 ppm (preferably, less than or equal to 1 ppb).

In forming the oxide semiconductor layer, the substrate is held in a treatment chamber that is maintained at reduced pressure and the substrate temperature is set to 100° C. to 600° C. inclusive, preferably 200° C. to 400° C. inclusive. By forming the oxide semiconductor layer while heating the substrate, the impurity concentration of the oxide semiconductor layer can be reduced. In addition, damage due to sputtering can be reduced. Then, a sputtering gas from which hydrogen and water are removed is introduced into the treatment chamber from which remaining moisture is being removed, and the oxide semiconductor layer is formed using a metal oxide as a target.

In order to remove moisture remaining in the treatment chamber, an entrapment vacuum pump is preferably used. For example, a cryopump, an ion pump, or a titanium sublimation pump can be used. The evacuation unit may be a turbo pump provided with a cold trap. A hydrogen atom, a compound containing a hydrogen atom, such as water ($H_2O$), (preferably, also a compound containing a carbon atom), or the like is removed from the deposition chamber which is evacuated with the cryopump, thereby reducing the concentration of impurities contained in the oxide semiconductor layer formed in the deposition chamber.

The oxide semiconductor layer is formed under the following conditions, for example: the distance between the substrate and the target is 100 mm; the pressure is 0.6 Pa; the direct-current (DC) power is 0.5 kW; and the atmosphere is oxygen (100% of oxygen). Note that a pulsed direct-current (DC) power supply is preferably used because dust can be reduced and the film thickness can be made uniform. The thickness of the oxide semiconductor layer is 2 nm to 200 nm inclusive, preferably 5 nm to 30 nm inclusive. Note that the appropriate thickness of the oxide semiconductor layer differs depending on the oxide semiconductor material used; therefore, the thickness may be determined in accordance with the material. In the case where the channel length is short, the thickness of the oxide semiconductor layer can be set to greater than or equal to 5 nm and less than or equal to 30 nm, for example. When the size of an element is reduced in such a manner, high integration can be achieved, and a short-channel effect can be suppressed by reduction in the thickness of the oxide semiconductor layer.

Note that before the oxide semiconductor layer is formed by a sputtering method, it is preferable to perform reverse sputtering in which plasma is generated with an argon gas introduced, so that dust attached to the surface of the gate insulating layer 138 is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which a high-frequency voltage is applied to the surface in an argon atmosphere and plasma is generated near a substrate. Note that an atmosphere of nitrogen, helium, oxygen, or the like may be used instead of an argon atmosphere.

Either dry etching or wet etching may be employed for etching the oxide semiconductor layer. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

An example of the etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, an ammonia peroxide mixture (a mixed solution of ammonia, water, and hydrogen peroxide), or the like can be used. An etchant such as ITO07N (produced by KANTO CHEMICAL CO., INC.) may also be used.

Next, first heat treatment is preferably performed on the oxide semiconductor layer. The oxide semiconductor layer can be dehydrated or dehydrogenated with the first heat treatment. The first heat treatment is performed at a temperature of 300° C. to 800° C. inclusive, preferably 400° C. to 700° C. inclusive, more preferably 450° C. to 700° C. inclusive, and further preferably 550° C. to 700° C. inclusive.

The first heat treatment at a temperature of 350° C. or higher allows dehydration or dehydrogenation of the oxide semiconductor layer, resulting in a reduction in the hydrogen concentration in the layer. The first heat treatment at a temperature of 450° C. or higher allows a further reduction in the hydrogen concentration in the layer. The first heat treatment at a temperature of 550° C. or higher allows a still further reduction in the hydrogen concentration in the layer. The first heat treatment can be performed in such a manner that, for example, the substrate is introduced into an electric furnace using a resistance heating element or the like, and then the oxide semiconductor layer 140 is subjected to heat treatment at 450° C. for an hour under a nitrogen atmosphere. During the heat treatment, the oxide semiconductor layer 140 is not exposed to the air to prevent the entry of water or hydrogen.

The heat treatment apparatus is not limited to an electric furnace, and it is also possible to use an apparatus for heating an object to be processed using thermal conduction or thermal radiation generated from a medium such as a heated gas. For example, an RTA (rapid thermal anneal) apparatus such as a GRTA (gas rapid thermal anneal) apparatus or an LRTA (lamp rapid thermal anneal) apparatus can be used.

An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The substrate is put in an inert gas atmosphere heated to a high temperature of 650° C. to 700° C., heated for several minutes, and taken out of the inert gas atmosphere. The GRTA process enables high-temperature heat treatment in a short time. Moreover, the GRTA process can be employed even when the temperature exceeds the upper temperature limit of the substrate because the heat treatment is performed in a short time. For example, in the case of using an SOI substrate including a substrate with relatively low heat resistance, such as a glass substrate, shrinkage of the substrate becomes a problem at a temperature higher than the upper temperature limit (strain point) but does not in the case of performing heat treatment in a short time.

Note that as the inert gas atmosphere in which the first heat treatment is performed, it is preferable to use an atmosphere that contains nitrogen or a rare gas (e.g., helium, neon, or argon) as its main component and that does not contain water, hydrogen, or the like. For example, the purity of nitrogen or a rare gas such as helium, neon, or argon introduced into the heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

Note that the inert gas atmosphere may be changed to an atmosphere containing oxygen during the process. For example, in the case where an electrical furnace is used for the first heat treatment, an atmosphere can be changed when a heat treatment temperature falls. For example, the heat treatment can be performed (at a constant temperature) in an atmosphere of an inert gas such as a rare gas (such as helium, neon, or argon) or nitrogen, and the atmosphere can be changed to an atmosphere containing oxygen when the temperature falls. As the atmosphere containing oxygen, an oxygen gas or a mixed gas of an oxygen gas and a nitrogen gas can be used. Also in the case where the atmosphere containing oxygen is employed, it is preferable that the atmosphere do not contain water, hydrogen, or the like. Alternatively, the purity of the oxygen gas or the nitrogen is preferably greater than or equal to 6N (99.9999%), preferably greater than or equal to 7N (99.99999%) (that is, the concentration of the impurities is less than or equal to 1 ppm, preferably less than or equal to 0.1 ppm). Defects caused by oxygen vacancies can be reduced by performing the first heat treatment in the atmosphere containing oxygen.

Depending on the conditions of the first heat treatment or the material of the oxide semiconductor layer, the oxide semiconductor layer is crystallized to be microcrystalline or polycrystalline. For example, in some cases the oxide semiconductor layer is crystallized to be a microcrystalline oxide semiconductor layer having a degree of crystallization of 90% or more, or 80% or more. In other cases, depending on the conditions of the first heat treatment or the material of the oxide semiconductor layer, the oxide semiconductor layer may be an amorphous oxide semiconductor layer containing no crystalline component.

Furthermore, in the oxide semiconductor layer, a microcrystal (the grain size is 1 nm to 20 nm inclusive, typically 2 nm to 4 nm inclusive) is sometimes mixed in an amorphous oxide semiconductor (e.g., in a surface of the oxide semiconductor layer).

The electric characteristics of the oxide semiconductor layer can be changed by aligning microcrystals in an amorphous semiconductor. For example, in the case where the oxide semiconductor layer is formed using an In—Ga—Zn—O-based metal oxide target, a microcrystalline portion where crystal grains of $In_2Ga_2ZnO_7$ having electrical anisotropy are aligned is formed, whereby the electric characteristics of the oxide semiconductor layer can be changed.

For example, when the crystal grains are aligned so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing the entry of an impurity such as water or hydrogen into the oxide semiconductor layer.

Note that the oxide semiconductor layer including the microcrystalline portion can be formed by heating the surface of the oxide semiconductor layer by a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the above-described heat treatment can also be referred to as dehydration treatment, dehydrogenation treatment, or the like because of its effect of dehydration or dehydrogenation of the oxide semiconductor layer 140. Such dehydration treatment or dehydrogenation treatment can be performed, for example, after the oxide semiconductor layer is formed, after a source electrode and a drain electrode are stacked over the oxide semiconductor layer 140, or after a protective insulating layer is formed over the source and drain electrodes. Such dehydration treatment or dehydrogenation treatment may be conducted once or plural times.

Figure 5F:
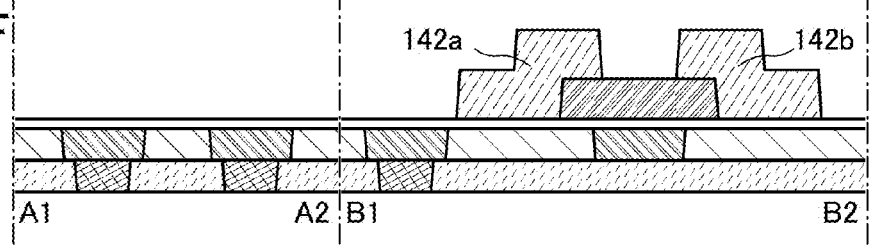

Next, the source or drain electrode 142a and the source or drain electrode 142b are formed in contact with the oxide semiconductor layer 140 (see FIG. 5F). The source or drain electrodes 142a and 142b can be formed in such a manner that a conductive layer is formed to cover the oxide semiconductor layer 140 and then is selectively etched.

The conductive layer can be formed by a PVD (physical vapor deposition) method such as a sputtering method, or a CVD (chemical vapor deposition) method such as a plasma CVD method. As a material for the conductive layer, an element selected from aluminum, chromium, copper, tantalum, titanium, molybdenum, or tungsten; an alloy containing any of these elements as a component; or the like can be used. Alternatively, one or more materials selected from manganese, magnesium, zirconium, beryllium, and yttrium may be used. Aluminum combined with one or more of elements selected from titanium, tantalum, tungsten, molybdenum, chromium, neodymium, or scandium may be used.

An oxide conductive film may be used for the conductive layer. As the oxide conductive film, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials to which silicon or silicon oxide is added can be used.

In that case, it is preferable to use a material whose conductivity is high or whose resistivity is low as compared with a material used for the oxide semiconductor layer 140. The conductivity of an oxide conductive film can be increased by an increase in the carrier concentration. The carrier concentration of an oxide conductive film can be increased by an increase in the hydrogen concentration. Further, the carrier concentration of an oxide conductive film can be increased by an increase in oxygen vacancy.

The conductive layer can have a single-layer structure or a layered structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order. Here, a three-layer structure of a titanium film, an aluminum film, and a titanium film is employed.

Note that an oxide conductive layer may be formed between the oxide semiconductor layer 140 and the conductive layer. The oxide conductive layer and the conductive layer can be formed successively (successive deposition). Such an oxide conductive layer allows reducing the resistance of the source region or the drain region, so that the transistor can operate at high speed.

Next, the conductive layer is selectively etched to form the source or drain electrodes 142a and 142b (see FIG. 5F). Here, ultraviolet light, KrF laser light, or ArF laser light is preferably used for light exposure in forming a mask used for etching.

The channel length (L) of the transistor is determined by the distance between a lower edge portion of the source or drain electrode 142a and a lower edge portion of the source or drain electrode 142b. Note that in the case where light exposure is performed so that the channel length (L) is less than 25 nm, light exposure for forming a mask is performed with extreme ultraviolet rays whose wavelength is extremely short of several nanometers to several tens of nanometers. Light exposure with extreme ultraviolet rays leads to a high resolution and a large focal depth. For these reasons, it is possible to design a mask so that the channel length (L) of the transistor to be formed later is less than 25 nm, that is, in the range of 10 nm to 1000 nm inclusive, and the circuit can operate at higher speed. Moreover, the off-state current is extremely low, which prevents power consumption from increasing.

The materials and etching conditions of the conductive layer and the oxide semiconductor layer 140 are adjusted as appropriate so that the oxide semiconductor layer 140 is not removed in etching of the conductive layer. Note that depending on the materials and the etching conditions, the oxide semiconductor layer 140 is partly etched in the etching step and thus has a groove portion (a recessed portion).

In order to reduce the number of masks used and reduce the number of steps, a resist mask may be formed using a multi-tone mask which is a light-exposure mask through which light is transmitted to have a plurality of intensities, so that an etching step can be performed with the use of this resist mask. A resist mask formed using a multi-tone mask has a shape with a plurality of thicknesses (a step-like shape) and further can be changed in shape by ashing; thus, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Note that after the above step, plasma treatment is preferably performed using a gas such as $N_2O$, $N_2$, or Ar. This plasma treatment removes water or the like attached on an exposed surface of the oxide semiconductor layer. Plasma treatment may be performed using a mixture gas of oxygen and argon.

Figure 5G:
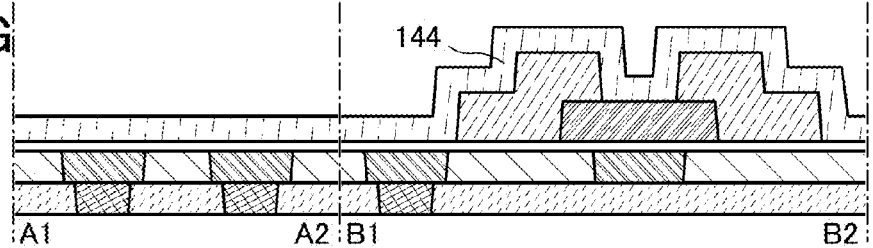

Next, the protective insulating layer 144 is formed in contact with part of the oxide semiconductor layer 140 without exposure to the air (see FIG. 5G).

The protective insulating layer 144 can be formed using as appropriate a method such as a sputtering method, by which impurities such as water and hydrogen are prevented from being mixed to the protective insulating layer 144. The protective insulating layer 144 has a thickness of at least 1 nm or more. The protective insulating layer 144 can be made of silicon oxide, silicon nitride, silicon oxynitride, silicon nitride oxide, or the like. The protective insulating layer 144 can have a single-layer structure or a layered structure. The substrate temperature in forming the protective insulating layer 144 is preferably higher than or equal to room temperature and lower than or equal to 300° C. The atmosphere for forming the protective insulating layer 144 is preferably a rare gas (typically argon) atmosphere, an oxygen atmosphere, or a mixed atmosphere containing a rare gas (typically argon) and oxygen.

If hydrogen is contained in the protective insulating layer 144, the hydrogen may enter the oxide semiconductor layer or extract oxygen in the oxide semiconductor layer, whereby the resistance of the oxide semiconductor layer on the backchannel side might be decreased and a parasitic channel might be formed. It is thus important not to use hydrogen in forming the protective insulating layer 144 so that the protective insulating layer 144 contains hydrogen as little as possible.

In addition, it is preferable that the protective insulating layer 144 be formed while moisture remaining in the treatment chamber is removed. This is for preventing hydrogen, hydroxyl, or moisture from being contained in the oxide semiconductor layer 140 and the protective insulating layer 144.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. A hydrogen atom, a compound containing a hydrogen atom, such as water ($H_2O$), or the like is removed from the deposition chamber which is evacuated with the cryopump, thereby reducing the concentration of impurities contained in the protective insulating layer 144 formed in the deposition chamber.

As a sputtering gas used for forming the protective insulating layer 144, it is preferable to use a high-purity gas from which an impurity such as hydrogen, water, a hydroxyl group, or hydride is removed to a concentration of 1 ppm or less (preferably, 1 ppb or less).

Next, second heat treatment is preferably performed in an inert gas atmosphere or an oxygen gas atmosphere (preferably at 200° C. to 400° C. inclusive, for example, at 250° C. to 350° C. inclusive). For example, the second heat treatment is performed at 250° C. for one hour in a nitrogen atmosphere. The second heat treatment can reduce variation in electric characteristics of the transistor.

Furthermore, heat treatment may be performed at 100° C. to 200° C. inclusive for one hour to 30 hours in the air. This heat treatment may be performed at a fixed heating temperature; alternatively, an increase in the heating temperature from room temperature to 100° C. to 200° C. inclusive and a decrease in the heating temperature to room temperature may be repeatedly conducted plural times. This heat treatment may be performed under a reduced pressure before the protective insulating layer is formed. The heat treatment time can be shortened under the reduced pressure. This heat treatment may be performed instead of the second heat treatment or may be performed before or after the second heat treatment, for example.

Figure 6A:
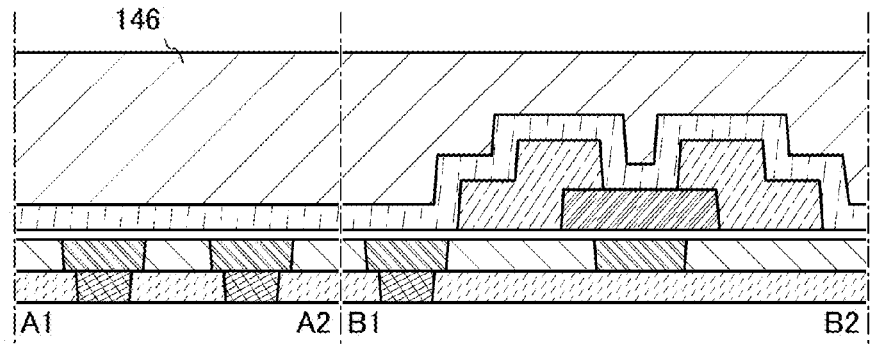
FIGS. 6A to 6D illustrate an example of a method for manufacturing an element included in a non-volatile latch circuit.
Figure 6B:
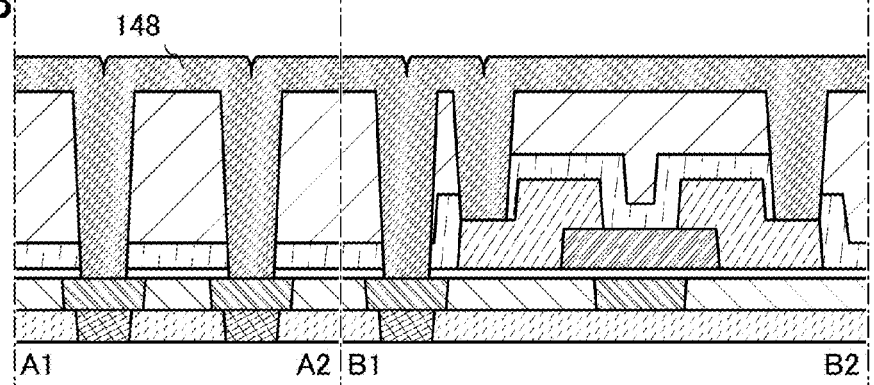

Next, the interlayer insulating layer 146 is formed over the protective insulating layer 144 (see FIG. 6A). The interlayer insulating layer 146 can be formed by a PVD method, a CVD method, or the like. The interlayer insulating layer 146 can be formed of an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with CMP, etching, or the like.

Next, openings that reach the electrodes 136a, 136b, and 136c and the source or drain electrodes 142a and 142b are formed in the interlayer insulating layer 146, the protective insulating layer 144, and the gate insulating layer 138. Then, a conductive layer 148 is formed to be embedded in the openings (see FIG. 6B). The openings can be formed by a method such as etching using a mask. The mask can be formed by a method such as light exposure using a photomask.

Either wet etching or dry etching may be used as the etching; dry etching is preferably used in terms of microfabrication. The conductive layer 148 can be formed by a film formation method such as a PVD method or a CVD method. The conductive layer 134 can be formed of a conductive material such as molybdenum, titanium, chromium, tantalum, tungsten, aluminum, copper, neodymium, or scandium or an alloy or a compound (e.g., a nitride) of any of these materials, for example.

Specifically, for example, the conductive layer 148 can be formed as follows: a thin titanium film is formed by a PVD method in a region including the openings, and a thin titanium nitride film is formed by a CVD method; then, a tungsten film is formed to be embedded in the openings. Here, the titanium film formed by a PVD method has a function of reducing an oxide film which may be formed at the interface and decreasing the contact resistance with lower electrodes (here, the electrodes 136a, 136b, and 136c and the source or drain electrodes 142a and 142b). The titanium nitride film formed after the formation of the titanium film has a barrier function of preventing diffusion of the conductive material. A copper film may be formed by a plating method after the formation of the barrier film of titanium, titanium nitride, or the like.

Figure 6C:
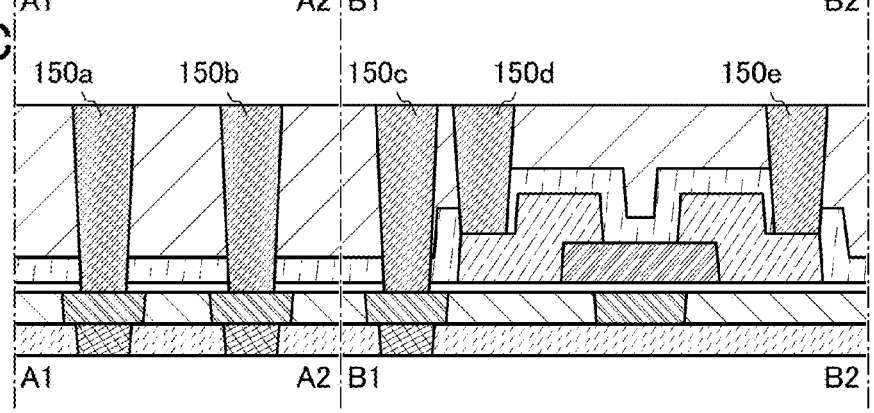
Figure 6D:
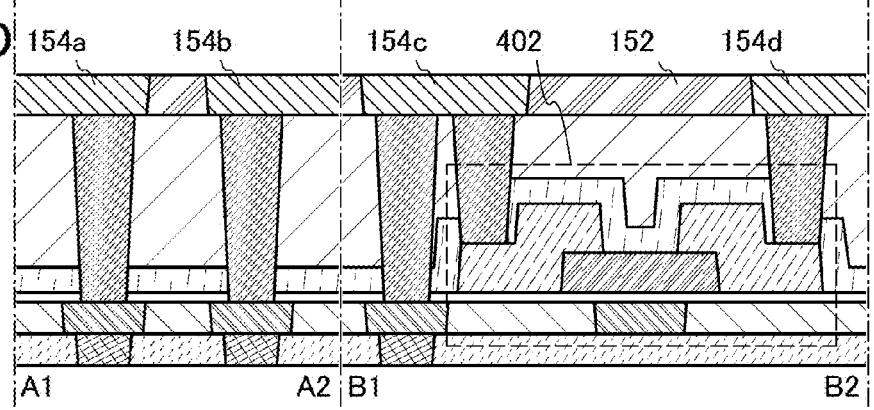

After the conductive layer 148 is formed, part of the conductive layer 148 is removed by etching, CMP, or the like, so that the interlayer insulating layer 146 is exposed and the electrodes 150a, 150b, 150c, 150d, and 150e are formed (see FIG. 6C). Note that when the electrodes 150a, 150b, 150c, 150d, and 150e are formed by removing part of the conductive layer 148, the surfaces are preferably processed to be planarized. When the surfaces of the interlayer insulating layer 146 and the electrodes 150a, 150b, 150c, 150d, and 150e are planarized in such a manner, an electrode, a wiring, an insulating layer, a semiconductor layer, and the like can be favorably formed in later steps.

Then, the insulating layer 152 is formed, and openings that reach the electrodes 150a, 150b, 150c, 150d, and 150e are formed in the insulating layer 152. After a conductive layer is formed to be embedded in the openings, part of the conductive layer is removed by etching, CMP, or the like, whereby the insulating layer 152 is exposed and the electrodes 154a, 154b, 154c, and 154d are formed (see FIG. 6D). This step is similar to the step of forming the electrode 150a and the like; therefore, the detailed description is omitted.

In the case where the transistor 402 is formed in the aforementioned manner, the hydrogen concentration in the oxide semiconductor layer 140 is less than or equal to $5 \times 10^{19}/cm^3$ and the off-state current of the transistor 402 at room temperature is less than or equal to $1 \times 10^{-13}$ A (a leakage current at room temperature per 1 μm of channel width is less than or equal to 10 aA/μm). The carrier concentration of the oxide semiconductor layer is less than $1 \times 10^{14}/cm^3$. The transistor 402 with excellent characteristics can be obtained by using such an oxide semiconductor layer 140 that is highly purified by a sufficient reduction in hydrogen concentration and a supply of oxygen. Further, since the transistor 421 using a material other than an oxide semiconductor is provided in the lower portion and the transistor 402 using an oxide semiconductor is provided in the upper portion, it is possible to manufacture an excellent nonvolatile latch circuit having characteristics of both the transistors, and a semiconductor device using the nonvolatile latch circuit.

Note that it is preferable that oxygen be supplied to the oxide semiconductor layer 140 shortly after the hydrogen concentration is reduced because there is no possibility that hydrogen, water, or the like enters the oxide semiconductor layer and an oxide semiconductor layer with extremely favorable characteristics can thus be realized. It is needless to say that treatment for reducing the hydrogen concentration and treatment for supplying oxygen do not need to be performed successively as long as an oxide semiconductor layer with favorable characteristics can be realized. For example, another treatment may be performed between these treatments. Alternatively, these treatments may be performed at the same time.

Note that silicon carbide (e.g., 4H—SiC) is a semiconductor material that can be compared to an oxide semiconductor. An oxide semiconductor and 4H—SiC have some things in common: for example, a carrier density. In accordance with Fermi-Dirac distribution, the density of minority carriers in an oxide semiconductor is estimated to be approximately $10^{-7}/cm^3$. This value is extremely small similarly to that in 4H—SiC, $6.7 \times 10^{-11}/cm^3$. When the minority carrier density of the oxide semiconductor is compared with the intrinsic carrier density of silicon (approximately $1.4 \times 10^{10}/cm^3$), it is easily understood that the minority carrier density of the oxide semiconductor is significantly low.

In addition, the energy band gap of the oxide semiconductor is 3.0 eV to 3.5 eV inclusive and that of 4H—SiC is 3.26 eV, which means that both the oxide semiconductor and silicon carbide are wide bandgap semiconductors.

On the other hand, there is a major difference between an oxide semiconductor and silicon carbide: the process temperature. Since heat treatment at 1500° C. to 2000° C. inclusive is usually needed in a semiconductor process using silicon carbide, it is difficult to form a stack of silicon carbide and a semiconductor element using a semiconductor material other than silicon carbide. This is because a semiconductor substrate, a semiconductor element, and the like are damaged by such high temperature. Meanwhile, an oxide semiconductor can be formed by heat treatment at 300° C. to 500° C. inclusive (lower than or equal to the glass transition temperature, up to about 700° C.); therefore, it is possible to form an integrated circuit with the use of a semiconductor material other than an oxide semiconductor and then to form a semiconductor element including an oxide semiconductor.

In addition, in contrast to silicon carbide, an oxide semiconductor is advantageous in that a low heat-resistant substrate such as a glass substrate can be used. Moreover, the oxide semiconductor is also advantageous in that energy costs can be sufficiently reduced as compared with silicon carbide because heat temperature at high temperature is not necessary.

Note that although many researches on the physical properties of an oxide semiconductor such as density of state (DOS) are conducted, they do not suggest an idea of sufficiently reducing localized states themselves. According to an embodiment of the disclosed invention, a highly-purified oxide semiconductor is formed by removing water or hydrogen that can be a cause of a localized level. This is based on the idea of sufficiently reducing localized states themselves. Thus, excellent industrial products can be manufactured.

Further, a more highly-purified (i-type) oxide semiconductor can be obtained by supplying oxygen to a dangling bond of metal which is generated by oxygen vacancy and reducing a localized level due to the oxygen vacancy. For example, an oxide film containing excessive oxygen is formed in close contact with a channel formation region and then oxygen is supplied to the channel formation region from the oxide film, so that a localized level due to oxygen defect can be reduced.

A defect of the oxide semiconductor is said to be attributed a shallow level of 0.1 eV to 0.2 eV inclusive below the conduction band due to excessive hydrogen, a deep level due to deficiency of oxygen, or the like. Thorough removal of hydrogen and sufficient supply of oxygen for elimination of such a defect would be right as a technological thought.

An oxide semiconductor is generally considered as an n-type semiconductor; however, according to an embodiment of the disclosed invention, an i-type semiconductor is realized by removing impurities, particularly water and hydrogen. In this respect, it can be said that an embodiment of the disclosed invention includes a novel technical idea because it is different from an i-type semiconductor such as silicon added with an impurity.

The example described above is that, among elements of the nonvolatile latch circuit 400, the elements other than the transistor 402 using an oxide semiconductor use a material other than an oxide semiconductor as a semiconductor material; however, the disclosed invention is not limited to this example. An oxide semiconductor can be used as a semiconductor material of the elements other than the transistor 402 included in the nonvolatile latch circuit 400.

<Electrical Conduction Mechanism of Transistor Using Oxide Semiconductor>

An electrical conduction mechanism of a transistor using an oxide semiconductor will be described with reference to FIG. 7, FIG. 8, FIGS. 9A and 9B, and FIG. 10. Note that the following description is based on an ideal situation for ease of understanding and does not entirely reflect the actual situation. Also note that the following description is just a consideration and does not affect the validity of the invention.

Figure 7:
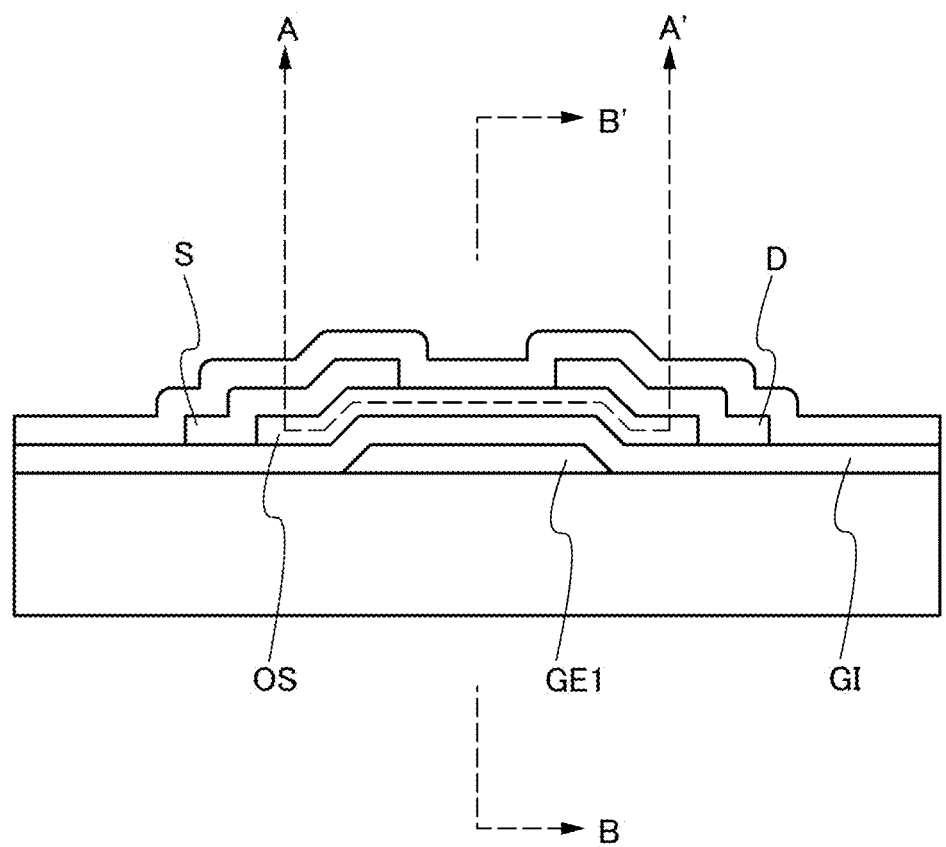
FIG. 7 illustrates an example of a cross-sectional structure of an inverted staggered transistor using an oxide semiconductor.

FIG. 7 is a cross-sectional view of a transistor (thin film transistor) using an oxide semiconductor. An oxide semiconductor layer (OS) is provided over a gate electrode (GE1) with a gate insulating layer (GI) interposed therebetween, and a source electrode (S) and a drain electrode (D) are provided over the oxide semiconductor layer. An insulating layer is provided to cover the source electrode (S) and the drain electrode (D).

Figure 8:
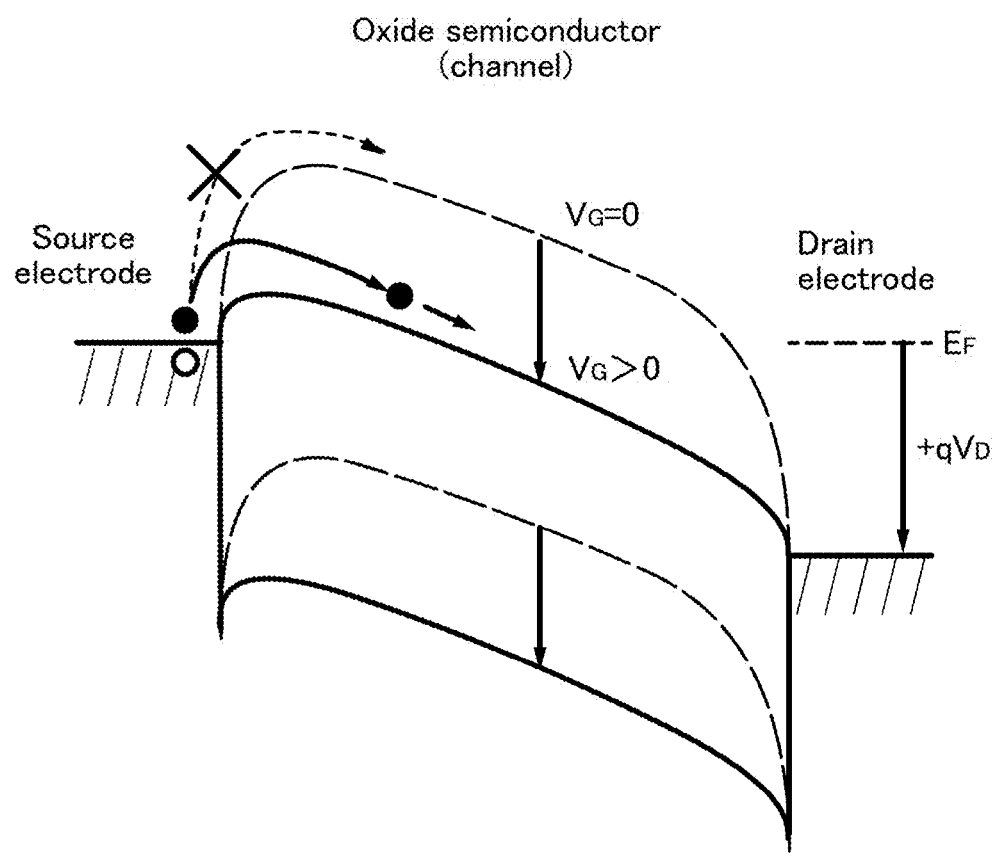
FIG. 8 is an energy band diagram (schematic diagram) along section A-A' in FIG. 7.

FIG. 8 is an energy band diagram (schematic diagram) of the cross section A-A' in FIG. 7. In FIG. 8, a black circle (●) and a white circle (o) represent an electron and a hole and have electric charges (−q, +q), respectively. With a positive voltage ($V_D>0$) applied to the drain electrode, the dashed line shows the case where no voltage is applied to the gate electrode ($V_G=0$) and the solid line shows the case where a positive voltage is applied to the gate electrode ($V_G>0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered and thus a current flows, which means an on state.

Figure 9A:
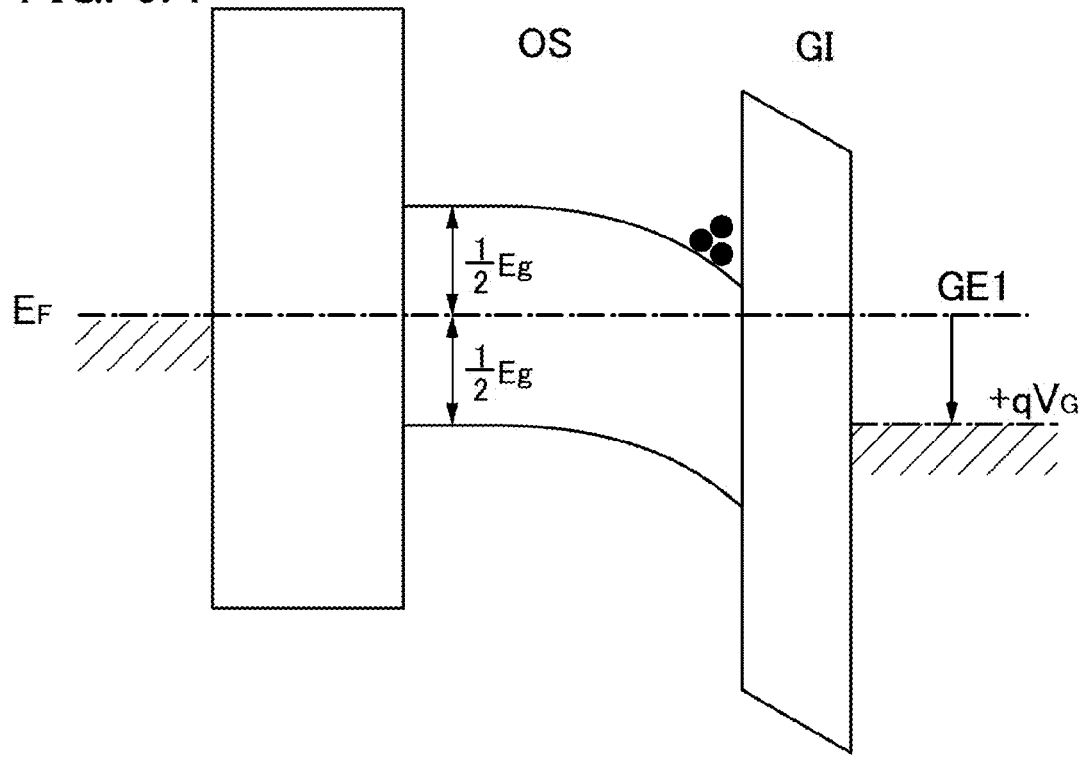
FIG. 9A illustrates a state in which a positive voltage ($V_G > 0$) is applied to a gate (GE1), and 9B illustrates a state in which a negative voltage ($V_G < 0$) is applied to the gate (GE1)
Figure 9B:
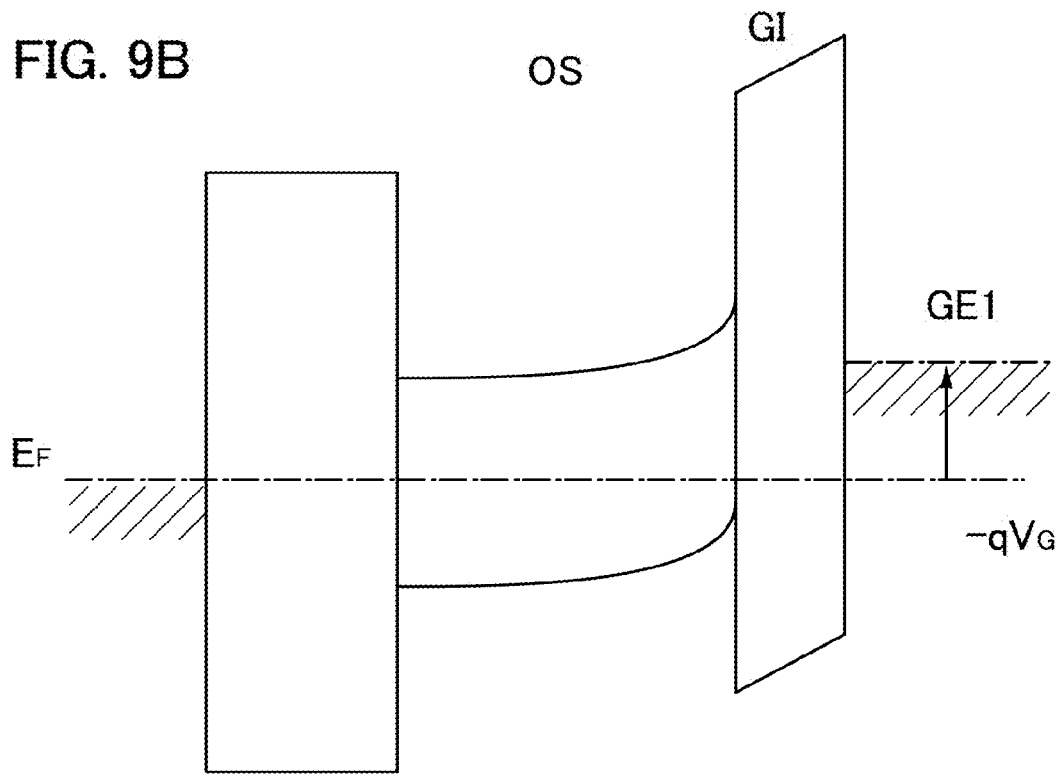

FIGS. 9A and 9B are energy band diagrams (schematic diagrams) of the cross section B-B' in FIG. 7. FIG. 9A illustrates an on state in which a positive voltage ($V_G>0$) is applied to the gate electrode (GE1) and carriers (electrons) flow between the source electrode and the drain electrode. FIG. 9B illustrates an off state in which a negative voltage ($V_G<0$) is applied to the gate electrode (GE1) and minority carriers do not flow.

Figure 10:
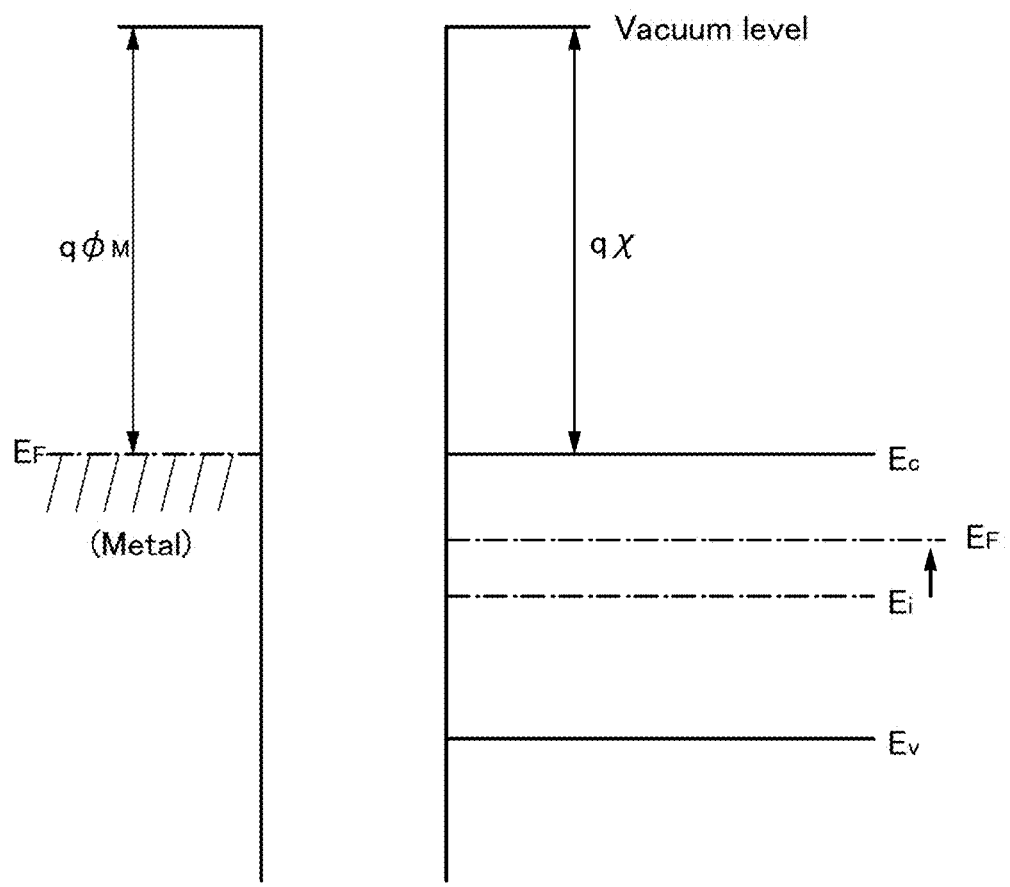
FIG. 10 illustrates the relationship between the vacuum level and the work function of a metal ($\phi_M$) and between the vacuum level and the electron affinity ($\chi$) of an oxide semiconductor.

FIG. 10 illustrates the relationships between the vacuum level and the work function of a metal ($\phi_M$) and between the vacuum level and the electron affinity ($\chi$) of an oxide semiconductor. At normal temperature, electrons in the metal are degenerated and the Fermi level is located in the conduction band. On the other hand, a conventional oxide semiconductor is an n-type semiconductor, in which the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor according to an embodiment of the disclosed invention is an intrinsic (i-type) or a substantially intrinsic oxide semiconductor which is obtained by removing hydrogen that is a factor for an n-type oxide semiconductor from an oxide semiconductor and purifying the oxide semiconductor such that an element other than its main component of the oxide semiconductor (i.e., an impurity element) is contained as little as possible. That is, a feature is that a highly-purified i-type (intrinsic) semiconductor or a semiconductor close thereto is obtained not by adding an impurity element but by removing an impurity such as hydrogen and water as much as possible. Thus, the Fermi level ($E_F$) can be comparable with the intrinsic Fermi level ($E_i$).

It is said that the band gap ($E_g$) of an oxide semiconductor is 3.15 eV and the electron affinity ($\chi$) thereof is 4.3 eV. The work function of titanium (Ti) contained in the source electrode and the drain electrode is substantially equal to the electron affinity ($\chi$) of the oxide semiconductor. In this case, a Schottky barrier for an electron is not formed at the interface between the metal and the oxide semiconductor.

At that time, as illustrated in FIG. 9A, the electron moves in the vicinity of the interface between the gate insulating layer and the highly-purified oxide semiconductor (the lowest portion of the oxide semiconductor which is stable in terms of energy).

In addition, as illustrated in FIG. 9B, when a negative potential is supplied to the gate electrode (GE1), the value of current is extremely close to zero because the number of holes that are minority carriers is substantially zero.

In such a manner, an intrinsic (i-type) or substantially intrinsic oxide semiconductor is obtained by being highly purified such that an element other than its main component (i.e., an impurity element) is contained as little as possible. Thus, characteristics of the interface between the oxide semiconductor and the gate insulating layer become important. For that reason, the gate insulating layer needs to be able to form a favorable interface with the oxide semiconductor. Specifically, the following insulating layers are preferably used, for example: an insulating layer formed by a CVD method using high-density plasma generated with a power source frequency in the range of the VHF band to the microwave band, or an insulating layer formed by a sputtering method.

When the oxide semiconductor is highly purified while a favorable interface is made between the oxide semiconductor and the gate insulating layer, for example, in the case where the transistor has a channel width W of $1 \times 10^4$ μm and a channel length L of 3 μm, it is possible to realize an off-state current of $1 \times 10^{-13}$ A or less and a subthreshold swing (S value) of 0.1 V/dec. (a gate insulating layer: 100 nm thickness) at room temperature.

When the oxide semiconductor is highly purified as described above so as to contain an element other than its main element (i.e., an impurity element) as little as possible, the thin film transistor can operate in a favorable manner.

According to this embodiment, a transistor using, as a semiconductor material of a channel formation region, an intrinsic (i-type) or substantially intrinsic (i-type) oxide semiconductor which has a sufficiently low hydrogen concentration to be highly purified and to have a sufficiently low carrier concentration, is used as the switching element and the capacitor electrically connected to the source electrode or the drain electrode of the transistor is provided; thus, it is possible to realize a non-volatile latch circuit which operates in a wide temperature range and stably operates even at high temperature, and in which a stored logic state is not erased even when the power is turned off, or a latch circuit which has a sufficiently long refresh time and data retention characteristics. In addition, since a charge accumulated in the capacitor is retained as data, data can be read easily with less variation as compared with the case where data is stored by remanent polarization.

Various kinds of logic circuits can be provided by using the non-volatile latch circuit. For example, the power consumption of a logic circuit using the non-volatile latch circuit can be reduced by turning off the power of blocks not in use. In addition, since a logic state is stored even when the power is turned off, a system can be started when the power is turned on or terminated when the power is turned off, at high speed and low power.

This embodiment can be freely combined with the other embodiments.

Embodiment 2

In this embodiment, a configuration and operation of the non-volatile latch circuit that is an embodiment of the disclosed invention will be described with reference to FIGS. 11A and 11B and FIG. 12.

Figure 11A:
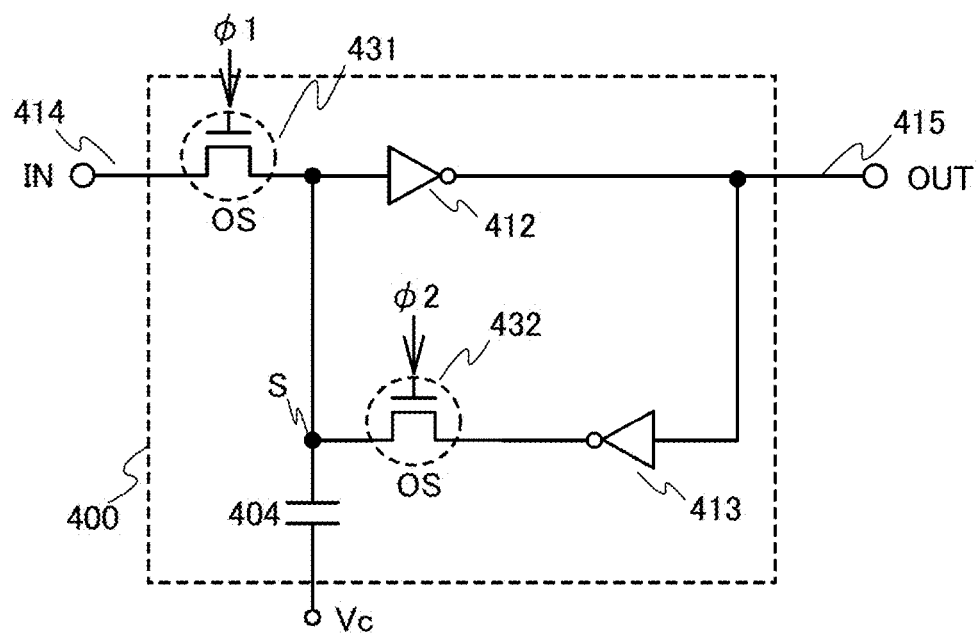
FIGS. 11A and 11B illustrate an example of a configuration of a non-volatile latch circuit.

FIG. 11A illustrates a configuration of the non-volatile latch circuit 400. FIG. 11B illustrates a configuration of part of the non-volatile latch circuit 400. FIG. 12 is an example of a timing chart of the non-volatile latch circuit 400.

FIG. 11A illustrates an example of the configuration of the latch circuit 400 in FIG. 1, where a first inverter is used as the first element 412 and a second inverter is used as the second element 413. The first transistor 431 and the second transistor 432 can have a structure similar to that shown in Embodiment 1. That is, as the first transistor 431 and the second transistor 432, it is possible to use a transistor which uses an oxide semiconductor layer for a channel formation region and has normally-off characteristics and a significantly low off-state current.

The non-volatile latch circuit 400 illustrated in FIG. 11A has a loop structure in which the output of the first element (first inverter) 412 is electrically connected to the input of the second element (second inverter) 413 and the output of the second element (second inverter) 413 is electrically connected to the input of the first element (first inverter) 412 through the second transistor 432.

The input of the first element (first inverter) 412 is electrically connected to the wiring 414 to which an input signal is applied through the first transistor 431. The output of the first element (first inverter) 412 is electrically connected to the wiring 415 to which an output signal is applied. The wiring 414 to which an input signal is applied is a wiring supplied with a signal that is input from a circuit of a preceding stage to the non-volatile latch circuit 400. The wiring 415 to which an output signal is applied is a wiring supplied with a signal that is output from the non-volatile latch circuit 400 to a circuit of a subsequent stage.

In the non-volatile latch circuit 400, the first transistor 431 and the second transistor 432, each of which uses an oxide semiconductor as a semiconductor material of a channel formation region, are used as switching elements. In addition, the non-volatile latch circuit 400 includes a capacitor 404 which is electrically connected to a source electrode or a drain electrode of the first transistor 431 and the second transistor 432. That is, one electrode of the capacitor 404 is electrically connected to one of the source electrode and the drain electrode of the first transistor 431, and the one electrode of the capacitor 404 is electrically connected to one of the source electrode and the drain electrode of the second transistor 432. The other of the source electrode and the drain electrode of the first transistor 431 is electrically connected to the wiring 414 to which an input signal is applied. The other of the source electrode and the drain electrode of the second transistor 432 is electrically connected to the output of the second element (second inverter) 413. A potential Vc is applied to the other electrode of the capacitor 404. A node connected to the input of the first element (first inverter) 412 is referred to as node S.

Figure 11B:
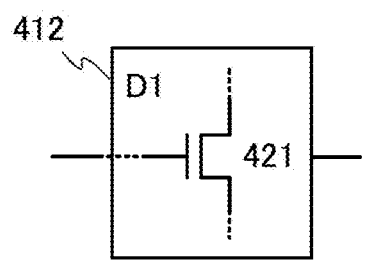

As illustrated in FIG. 11B, the first element (first inverter) 412 included in the non-volatile latch circuit 400 includes at least the third transistor 421. The gate of the third transistor 421 is electrically connected to the input of the first element (first inverter) 412. That is, the gate of the third transistor 421 is electrically connected to one of the source electrode and the drain electrode of the second transistor 432. Furthermore, the gate of the third transistor 421 is electrically connected to one of the source electrode and the drain electrode of the first transistor 431.

The first transistor 431 and the second transistor 432 can have a structure illustrated in FIG. 2A or FIG. 2B instead of the structure illustrated in FIG. 11A.

A potential of an input signal IN is applied to the wiring 414 from a circuit of a precedent stage. A potential of the wiring 415 is applied as an output signal OUT to a circuit of a subsequent stage. A potential of a signal $\phi 1$ is applied to the first transistor 431. A potential of a signal $\phi 2$ is applied to the second transistor 432. When a high-level potential is applied to the signal $\phi 1$, the first transistor 431 is turned on. When a high-level potential is applied to the signal $\phi 2$, the second transistor 432 is turned on. Although the description is made on the case where both the first transistor 431 and the second transistor 432 are n-type transistors, they may be p-type transistors.

In a normal operation period, a high-level power source voltage VDD and a low-level power source voltage VSS are applied to the first element (first inverter) 412 and the second element (second inverter) 413 included in the latch circuit 400.

Data writing, retaining, and reading operation of the non-volatile latch circuit 400 will be described with reference to FIG. 12. FIG. 12 illustrates an example of a timing chart of potentials of a signal $\phi 1$, a signal $\phi 2$, an input signal IN, and an output signal OUT obtained during a period when the non-volatile latch circuit 400 operates (operation period) and during a period when the non-volatile latch circuit 400 does not operate (non-operation period). FIG. 12 also illustrates a potential of the node S in the latch circuit 400 and a potential of the power source voltage VDD applied to the first element (first inverter) 412 and the second element (second inverter) 413. Note that a predetermined potential Vc, e.g., a ground potential is applied to the other electrode of the capacitor 404.

Figure 12:
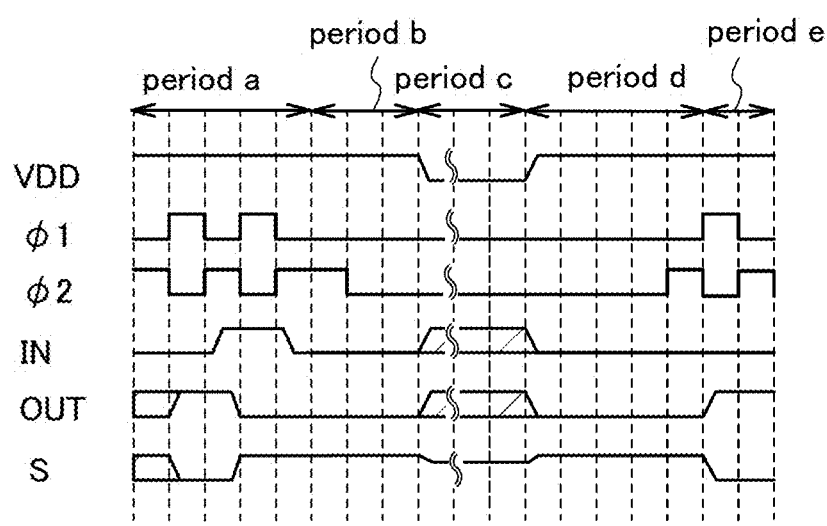
FIG. 12 illustrates an example of operation of a non-volatile latch circuit.

In FIG. 12, a period a, a period b, a period d, and a period e are periods during which the latch circuit 400 operates (operation periods): the power source voltage VDD and the power source voltage VSS are applied to the first element (first inverter) 412 and the second element (second inverter) 413. A period c is a period during which the latch circuit 400 does not operate (non-operation period): the supply of a power source voltage to the first element (first inverter) 412 and the second element (second inverter) 413 stops and the power source voltage VDD is lowered. The period a and the period e are normal operation periods of the latch circuit 400, during which a high-level potential and a low-level potential are alternately applied to the signal $\phi 1$ and the signal $\phi 2$. When the potential of the signal $\phi 1$ is at a high level, the potential of the signal $\phi 2$ is at a low level, and when the potential of the signal $\phi 1$ is at a low level, the potential of the signal $\phi 2$ is at a high level. That is, the signal $\phi 1$ and the signal $\phi 2$ have an inverted relationship. The period b is a preparation period until the non-operation period. The period b is also referred to as a falling period. The period d is a preparation period after the non-operation period and until a normal operation period starts with the supply of power. The period d is also referred to as a rising period.

In the normal operation period (period a), when a high-level potential is applied to the signal $\phi 1$ and a low-level potential is applied to the signal $\phi 2$, the second transistor 432 is turned off so that the loop structure of the latch circuit 400 (also referred to as an inverter loop) is cut off while the first transistor 431 is turned on so that the potential of the input signal is input to the first element (first inverter) 412. The potential of the input signal is inverted by the first element (first inverter) 412, and applied as the output signal OUT to a circuit of a subsequent stage. When a high-level potential is applied to the signal $\phi 1$ and the input signal has a high-level potential, an output signal with a low level potential can be obtained. When a high-level potential is applied to the signal $\phi 1$ and the input signal has a low-level potential, an output signal with a high level potential can be obtained.

When a low-level potential is applied to the signal $\phi 1$ and a high-level potential is applied to the signal $\phi 2$, the first transistor 431 is turned off and the second transistor 432 is turned on so that an inverter loop is formed, whereby the potential of the output signal OUT is retained (data is latched, that is, the logic state of the latch circuit is retained). The node S shows the potential of the input of the first inverter, which is an inverted potential of the output signal OUT in the normal operation period.

The input of the first element (first inverter) 412 is electrically connected to one electrode of the capacitor 404 and the gate of the third transistor 421. Accordingly, every time data is written to the latch circuit, a charge corresponding to the data is accumulated in the capacitor 404 and the gate capacitance of the third transistor 421. In other words, data of the latch circuit 400 is automatically written to a non-volatile latch (data writing). A charge corresponding to a potential is accumulated in the one electrode of the capacitor 404 and the gate of the third transistor 421 (node S).

In the preparation period (period b) before the non-operation period, a potential (a low-level potential) to turn off the first transistor 431 and the second transistor 432 is applied to the signal ϕ1 and the signal ϕ2, whereby the first transistor 431 and the second transistor 432 are turned off and the node S is brought into a floating state. As a result, the charge accumulated in the node S is retained (data retaining).

Next, the supply of a power source voltage to the first element (first inverter) 412 and the second element (second inverter) 413 stops to lower the power source voltage VDD; then, the non-operation period (period c) starts. In the non-operation period (period c), the input signal IN and the output signal OUT may have any value between VDD and VSS. Here, a transistor which uses an oxide semiconductor layer for a channel formation region and has normally-off characteristics and a significantly low off-state current is used as the first transistor 431 and the second transistor 432; thus, the charge accumulated in the capacitor 404 and the gate capacitance of the third transistor 421 (the charge accumulated in the node S) can be kept retained even after the supply of a power source voltage to the latch circuit 400 has stopped (period c). Accordingly, after the supply of a power source voltage to the latch circuit 400 has stopped, the logic state of the latch circuit 400 can be stored. Note that when the power source voltage VDD is lowered, the potential of the node S slightly varies in some cases due to the influence of the capacitive coupling with the power source voltage. It is needless to say that the potential of the node S is returned to an original level when the power source voltage VDD restarts to be supplied, because the charge accumulated in the node S is kept retained.

The capacitor 404 and the gate capacitance of the third transistor 421 are electrically connected to the input of the first element (first inverter) 412. Thus, after the power source voltage restarts to be supplied to at least the first element (first inverter) 412 of the latch circuit 400 (period d), the potential of the output signal OUT is determined by the charge accumulated in (data written to) the capacitor 404 and the gate capacitance of the third transistor 421. That is, the data written to the capacitor 404 and the gate capacitance of the third transistor 421 can be read (data reading). As a result, the logic state of the latch circuit can be returned to that before the non-operation period.

Next, a high-level potential is applied to the signal ϕ2. When a high-level potential is applied to the signal ϕ2, the second transistor 432 is turned on and an inverter loop is formed. When the inverter loop is formed, a high-level or low-level potential is applied to the output signal OUT and the node S and then retained (data is latched).

For example, in the case where the power supply stops for a long time, the potential of the node S might be slightly shifted from a high-level potential or a low-level potential because of a reduction in the amount of charge accumulated in the node S (the capacitor 404 and the gate capacitance of the third transistor 421). Even in that case, a high-level potential or a low-level potential is applied anew; consequently, the potential of the node S can be returned to a level before the shift (also referred to as rewriting operation). This operation is effective particularly when the capacitor 404 and the gate capacitance of the third transistor 421 have low capacitance. Note that in the period d, a period during which a high-level potential is applied to the signal ϕ2 is not necessarily provided.

Next, a high-level potential and a low-level potential are applied to the signal ϕ1 and the signal ϕ2, so that a normal operation period (period e) starts. When the normal operation period (period e) starts, the signal ϕ1 and the signal ϕ2 may have the same potential (the same state) as that when the preceding normal operation period (period a) is completed, or may have an inverted potential (the next state) of that when the period a is completed.

According to this embodiment, a transistor using, as a semiconductor material of a channel formation region, an intrinsic (i-type) or substantially intrinsic (i-type) oxide semiconductor which has a sufficiently low hydrogen concentration to be highly purified and to have a sufficiently low carrier concentration, is used as the switching element and the capacitor electrically connected to the source electrode or the drain electrode of the transistor is provided; thus, it is possible to realize a non-volatile latch circuit which operates in a wide temperature range and stably operates even at high temperature, and in which a stored logic state is not erased even when the power is turned off, or a latch circuit which has a sufficiently long refresh time and data retention characteristics. In addition, since a charge accumulated in the capacitor is retained as data, data can be read easily with less variation as compared with the case where data is stored by remanent polarization.

Various kinds of logic circuits can be provided by using the non-volatile latch circuit. For example, the power consumption of a logic circuit using the non-volatile latch circuit can be reduced by turning off the power of blocks not in use. In addition, since a logic state is stored even when the power is turned off, a system can be started when the power is turned on or terminated when the power is turned off, at high speed and low power.

This embodiment can be freely combined with the other embodiments.

Embodiment 3

In this embodiment, operation of the non-volatile latch circuit that is an embodiment of the disclosed invention will be described with reference to FIGS. 13A and 13B. The non-volatile latch circuit has the same configuration as that illustrated in FIGS. 11A and 11B, and the timing chart thereof is different from that of FIG. 12.

Figure 13A:
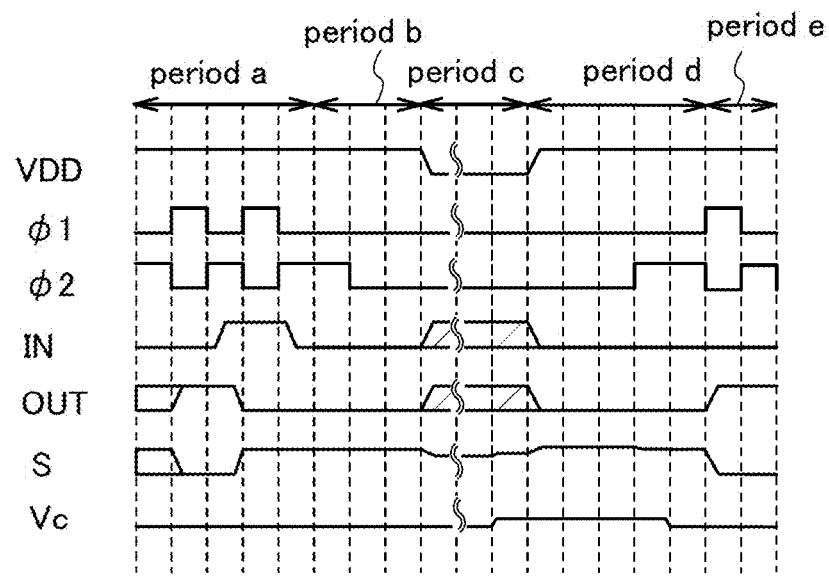
FIGS. 13A and 13B illustrate examples of operation of a non-volatile latch circuit.

FIG. 13A illustrates an example of a timing chart of potentials of a signal ϕ1, a signal ϕ2, an input signal IN, and an output signal OUT obtained during a period when the non-volatile latch circuit 400 operates (operation period) and a period when the non-volatile latch circuit 400 does not operate (non-operation period). FIG. 13A also illustrates a potential of the node S in the latch circuit 400, a potential of the power source voltage VDD applied to the first element (first inverter) 412 and the second element (second inverter) 413, and a potential Vc of the other electrode of the capacitor 404.

In FIG. 13A, a period a, a period b, a period d, and a period e are periods during which the latch circuit 400 operates (operation periods): the power source voltage VDD and the power source voltage VSS are applied to the first element (first inverter) 412 and the second element (second inverter) 413. A period c is a period during which the latch circuit 400 does not operate (non-operation period): the supply of a power source voltage to the first element (first inverter) 412 and the second element (second inverter) 413 stops and the power source voltage VDD is lowered. The period a and the period e are normal operation periods of the latch circuit 400, during which a high-level potential and a low-level potential are alternately applied to the signal φ1 and the signal φ2. When the potential of the signal φ1 is at a high level, the signal φ2 is at a low level, and when the potential of the signal φ1 is at a low level, the potential of the signal φ2 is at a high level. That is, the signal φ1 and the signal φ2 have an inverted relationship. The period b is a preparation period until the non-operation period. The period b is also referred to as a falling period. The period d is a preparation period after the non-operation period and until a normal operation period starts with the supply of power. The period d is also referred to as a rising period.

In FIG. 13A, the operation in the period a and the period b is similar to that in FIG. 12. Next, the supply of a power source voltage to the first element (first inverter) 412 and the second element (second inverter) 413 stops to lower the power source voltage VDD; then, the non-operation period (period c) starts. In the non-operation period (period c), the input signal IN and the output signal OUT may have any value between VDD and VSS. Here, a transistor which uses an oxide semiconductor layer for a channel formation region and has normally-off characteristics and a significantly low off-state current is used as the first transistor 431 and the second transistor 432; thus, the charge accumulated in the capacitor 404 and the gate capacitance of the third transistor 421 (the charge accumulated in the node S) can be kept retained even after the supply of a power source voltage to the latch circuit 400 has stopped (period c). Accordingly, after the supply of a power source voltage to the latch circuit 400 has stopped, the logic state of the latch circuit 400 can be stored. Note that when the power source voltage VDD is lowered, the potential of the node S slightly varies in some cases due to the influence of the capacitive coupling with the power source voltage. It is needless to say that the potential of the node S is returned to an original level when the power source voltage VDD restarts to be supplied, because the charge accumulated in the node S is kept retained.

Next, the potential Vc of the other electrode of the capacitor 404 is set to a predetermined potential. The potential Vc is set to a potential raised from the low level and a potential between the low level and the high level. Consequently, an increase in the potential Vc of the other electrode of the capacitor 404 is added to a potential applied to the node S. When a power source voltage is applied to the first element (first inverter) 412 and the second element (second inverter) 413 in this state (period d), the potential of the output signal OUT is determined by a charge accumulated in the capacitor 404 and the gate capacitance of the third transistor 421. That is, data written to the capacitor 404 and the gate capacitance of the third transistor 421 can be read (data reading). As a result, the logic state of the latch circuit can be returned to that before the non-operation period.

As described above, the potential Vc of the other electrode of the capacitor 404 is set to a predetermined potential at the timing when the supply of a power source voltage to the first element (first inverter) 412 restarts and the charge accumulated in (data written to) the capacitor 404 and the gate capacitance of the third transistor 421 is read, whereby data reading can be performed more stably. For example, in the case where the power supply stops for a long time, the potential of the node S might be slightly shifted from a high-level potential as illustrated in FIG. 13B because of a reduction in the amount of charge accumulated in the capacitor 404 and the gate capacitance of the third transistor 421, so that the stability of data reading might be lowered. Such phenomenon is likely to occur particularly when the capacitor 404 and the gate capacitance of the third transistor 421 have low capacitance. Even in that case, the potentials of the capacitor 404 and the gate electrode of the third transistor 421 can be controlled to appropriate potentials by setting the potential Vc of the other electrode of the capacitor 404 to a predetermined potential as illustrated in FIGS. 13A and 13B. Consequently, data reading can be performed stably. That is, operation is enabled when the capacitor is reduced in size, which achieves miniaturization. Further, data retention period can be more increased.

Next, a high-level potential is applied to the signal φ2. When a high-level potential is applied to the signal φ2, the second transistor 432 is turned on and an inverter loop is formed. When the inverter loop is formed, a high-level or low-level potential is applied to the output signal OUT and the node S and then retained (data is latched).

Even when the potential of the node S is slightly shifted from a high-level potential or a low-level potential at this time, a high-level potential or a low-level potential is applied anew; consequently, the potential of the node S can be returned to a level before the shift (also referred to as rewriting operation). After the potential of the node S is returned to a level before the shift (after the rewriting operation), the potential of the Vc is returned to an original level.

Next, a high-level potential and a low-level potential are applied to the signal φ1 and the signal φ2, so that a normal operation period (period e) starts. When the normal operation period (period e) starts, the signal φ1 and the signal φ2 may have the same potential (the same state) as that when the preceding normal operation period (period a) is completed, or may have an inverted potential (the next state) of that when the period a is completed.

According to this embodiment, a transistor using, as a semiconductor material of a channel formation region, an intrinsic (i-type) or substantially intrinsic (i-type) oxide semiconductor which has a sufficiently low hydrogen concentration to be highly purified and to have a sufficiently low carrier concentration, is used as the switching element and the capacitor electrically connected to the source electrode or the drain electrode of the transistor is provided; thus, it is possible to realize a non-volatile latch circuit which operates in a wide temperature range and stably operates even at high temperature, and in which a stored logic state is not erased even when the power is turned off, or a latch circuit which has a sufficiently long refresh time and data retention characteristics. In addition, since a charge accumulated in the capacitor is retained as data, data can be read easily with less variation as compared with the case where data is stored by remanent polarization.

Various kinds of logic circuits can be provided by using the non-volatile latch circuit. For example, the power consumption of a logic circuit using the non-volatile latch circuit can be reduced by turning off the power of blocks not in use. In addition, since a logic state is stored even when the power is turned off, a system can be started when the power is turned on or terminated when the power is turned off, at high speed and low power.

This embodiment can be freely combined with the other embodiments.

Embodiment 4

Figure 14:
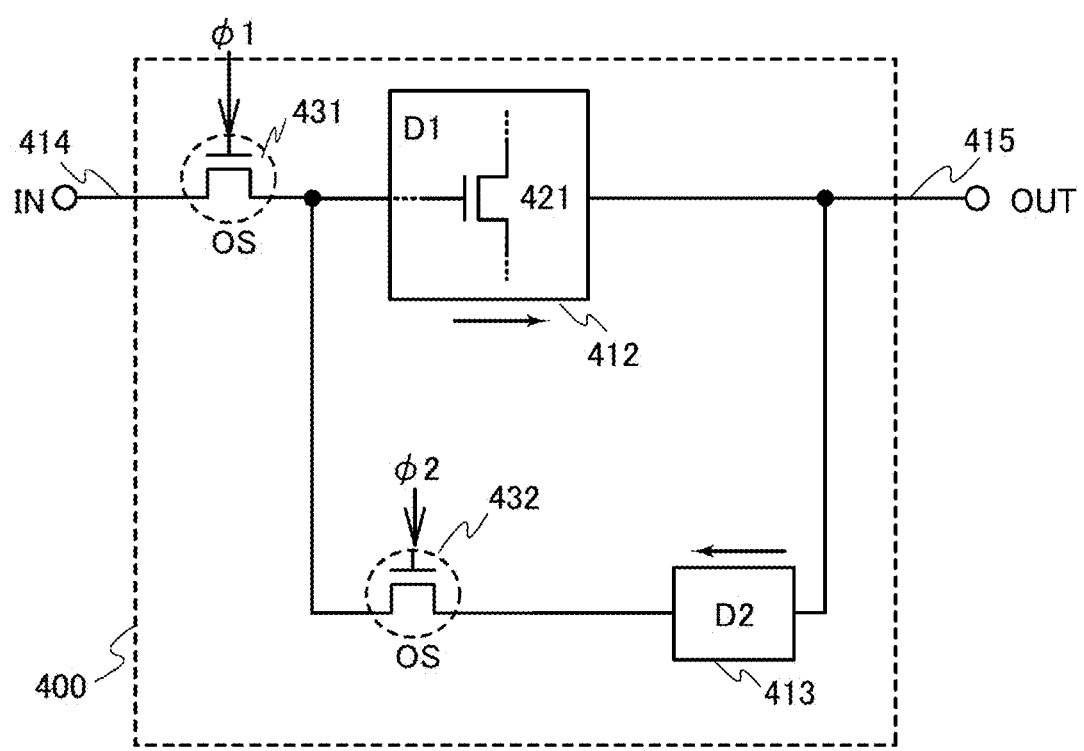
FIG. 14 illustrates an example of a configuration of a non-volatile latch circuit.

In this embodiment, an example of the configuration of the non-volatile latch circuit that is an embodiment of the disclosed invention, which is different from that of FIG. 1, will be described with reference to FIG. 14. FIG. 14 illustrates a configuration of the non-volatile latch circuit 400.

The configuration in FIG. 14 is the same as that in FIG. 1, except that a capacitor (the capacitor 404 in FIG. 1) electrically connected to the input of the first element (D1) 412 is not provided. That is, the non-volatile latch circuit 400 illustrated in FIG. 14 has a loop structure in which an output of the first element (D1) 412 is electrically connected to an input of the second element (D2) 413 and an output of the second element (D2) 413 is electrically connected to an input of the first element (D1) 412 through the second transistor 432.

The input of the first element (D1) 412 is electrically connected to the wiring 414 to which an input signal is applied through the first transistor 431. The output of the first element (D1) 412 is electrically connected to the wiring 415 to which an output signal is applied. The wiring 414 to which an input signal is applied is a wiring supplied with a signal that is input from a circuit of a preceding stage to the non-volatile latch circuit 400. The wiring 415 to which an output signal is applied is a wiring supplied with a signal that is output from the non-volatile latch circuit 400 to a circuit of a subsequent stage.

In the non-volatile latch circuit 400, the first transistor 431 and the second transistor 432, each of which uses an oxide semiconductor as a semiconductor material of a channel formation region, are used as switching elements. The first transistor 431 and the second transistor 432 can have a structure similar to that shown in Embodiment 1. That is, as the first transistor 431 and the second transistor 432, it is possible to use a transistor which uses an oxide semiconductor layer for a channel formation region and has normally-off characteristics and a significantly low off-state current.

In the above configuration, the first element 412 included in the non-volatile latch circuit 400 includes at least the third transistor 421. The gate of the third transistor 421 is electrically connected to the input of the first element 412. That is, the gate of the third transistor 421 is electrically connected to one of the source electrode and the drain electrode of the second transistor 432. Furthermore, the gate of the third transistor 421 is electrically connected to one of the source electrode and the drain electrode of the first transistor 431. The other of the source electrode and the drain electrode of the first transistor 431 is electrically connected to the wiring to which an input signal is applied. The other of the source electrode and the drain electrode of the second transistor 432 is electrically connected to the output of the second element.

The first transistor 431 and the second transistor 432 can have a structure illustrated in FIG. 2A or FIG. 2B instead of the structure illustrated in FIG. 14.

In the non-volatile latch circuit having the configuration illustrated in FIG. 14, data writing, data retaining, and data reading can be performed in the following manner.

As described above, the non-volatile latch circuit 400 has a loop structure in which the output of the first element (D1) 412 is electrically connected to the input of the second element (D2) 413 and the output of the second element (D2) 413 is electrically connected to the input of the first element (D1) 412 through the second transistor 432. The gate capacitance of the third transistor 421 is electrically connected to a predetermined position in the loop structure. Specifically, the gate of the third transistor 421 is electrically connected to the input of the first element (D1) 412. In this manner, the gate capacitance of the third transistor 421 is electrically connected to a predetermined position in the loop structure of the non-volatile latch circuit 400. Thus, every time data is written to the latch circuit, a charge corresponding to the data is accumulated in the gate capacitance of the third transistor 421. In other words, data of the latch circuit 400 is automatically written to a non-volatile latch (data writing). Data rewriting can be performed similarly.

Data written to the gate capacitance of the third transistor 421, namely, a charge accumulated in the gate capacitance of the third transistor 421, can be retained by applying a potential to the gate of the first transistor 431 and the gate of the second transistor 432 so that the first transistor 431 and the second transistor 432 are turned off (data retaining).

Here, a transistor used as the first transistor 431 and the second transistor 432 uses an oxide semiconductor layer for a channel formation region and has normally-off characteristics and a significantly low off-state current. Thus, a charge accumulated in the gate capacitance can be kept retained even after a power source voltage has stopped to be supplied to at least the first element (D1) 412 and the second element (D2) 413 included in the latch circuit 400. Accordingly, the logic state of the latch circuit 400 can be kept stored even after the supply of the power source voltage has stopped.

The gate capacitance of the third transistor 421 is electrically connected to the input of the first element (D1) 412. Thus, after the power source voltage restarts to be supplied to at least the first element (D1) 412 of the latch circuit 400, the potential of the output signal OUT is determined by the charge accumulated in the gate capacitance of the third transistor 421. That is, the data written to the gate capacitance of the third transistor 421 can be read (data reading).

According to this embodiment, a transistor using, as a semiconductor material of a channel formation region, an intrinsic (i-type) or substantially intrinsic (i-type) oxide semiconductor which has a sufficiently low hydrogen concentration to be highly purified and to have a sufficiently low carrier concentration, is used as the switching element and the capacitor electrically connected to the source electrode or the drain electrode of the transistor is provided; thus, it is possible to realize a non-volatile latch circuit which operates in a wide temperature range and stably operates even at high temperature, and in which a stored logic state is not erased even when the power is turned off, or a latch circuit which has a sufficiently long refresh time and data retention characteristics. In addition, since a charge accumulated in the capacitor is stored as data, data can be read easily with less variation as compared with the case where data is retained by remanent polarization.

Various kinds of logic circuits can be provided by using the non-volatile latch circuit. For example, the power consumption of a logic circuit using the non-volatile latch circuit can be reduced by turning off the power of blocks not in use. In addition, since a logic state is stored even when the power is turned off, a system can be started when the power is turned on or terminated when the power is turned off, at high speed and low power.

This embodiment can be freely combined with the other embodiments.

Embodiment 5

Figure 15:
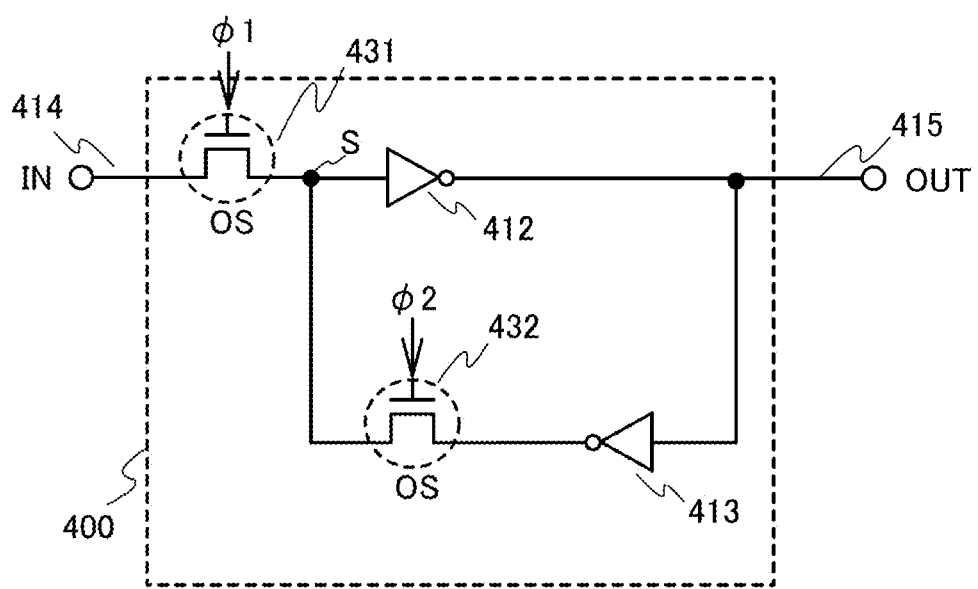
FIG. 15 illustrates an example of a configuration of a non-volatile latch circuit.

In this embodiment, an example of the configuration of the non-volatile latch circuit that is an embodiment of the disclosed invention, which is different from that of FIGS. 11A and 11B, will be described with reference to FIG. 15. FIG. 15 illustrates a configuration of the non-volatile latch circuit 400.

The configuration in FIG. 15 is the same as that in FIGS. 11A and 11B, except that a capacitor (the capacitor 404 in FIG. 11A) connected to the node S is not provided.

FIG. 15 illustrates an example of the configuration of the latch circuit 400 in FIG. 14, where a first inverter is used as the first element 412 and a second inverter is used as the second element 413. The first transistor 431 and the second transistor 432 can have a structure similar to that shown in Embodiment 1. That is, as the first transistor 431 and the second transistor 432, it is possible to use a transistor which uses an oxide semiconductor layer for a channel formation region and has normally-off characteristics and a significantly low off-state current.

The non-volatile latch circuit 400 illustrated in FIG. 15 has a loop structure in which the output of the first element (first inverter) 412 is electrically connected to the input of the second element (second inverter) 413 and the output of the second element (second inverter) 413 is electrically connected to the input of the first element (first inverter) 412 through the second transistor 432.

The input of the first element (first inverter) 412 is electrically connected to the wiring 414 to which an input signal is applied through the first transistor 431. The output of the first element (first inverter) 412 is electrically connected to the wiring 415 to which an output signal is applied. The wiring 414 to which an input signal is applied is a wiring supplied with a signal that is input from a circuit of a preceding stage to the non-volatile latch circuit 400. The wiring 415 to which an output signal is applied is a wiring supplied with a signal that is output from the non-volatile latch circuit 400 to a circuit of a subsequent stage.

In the non-volatile latch circuit 400, the first transistor 431 and the second transistor 432, each of which uses an oxide semiconductor as a semiconductor material of a channel formation region, are used as switching elements. The first element (first inverter) 412 included in the non-volatile latch circuit 400 includes at least the third transistor 421. The gate of the third transistor 421 is electrically connected to the input of the first element (first inverter) 412. That is, the gate of the third transistor 421 is electrically connected to one of the source electrode and the drain electrode of the second transistor 432. Furthermore, the gate of the third transistor 421 is electrically connected to one of the source electrode and the drain electrode of the first transistor 431. The other of the source electrode and the drain electrode of the first transistor 431 is electrically connected to the wiring 414 to which an input signal is applied. The other of the source electrode and the drain electrode of the second transistor 432 is electrically connected to the output of the second element (second inverter) 413. A node connected to the input of the first element (first inverter) 412 is referred to as node S.

The first transistor 431 and the second transistor 432 can have a structure illustrated in FIG. 2A or FIG. 2B instead of the structure illustrated in FIG. 15.

Figure 13B:
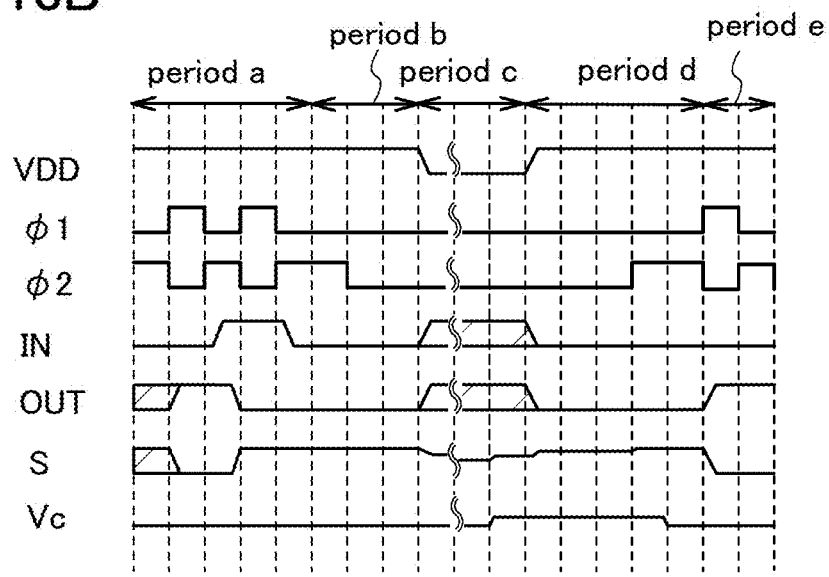

Data writing, retaining, and reading operation of the non-volatile latch circuit 400 is similar to that of the latch circuit 400 illustrated in FIGS. 11A and 11B (FIG. 12, FIGS. 13A and 13B, and description thereof).

According to this embodiment, a transistor using, as a semiconductor material of a channel formation region, an intrinsic (i-type) or substantially intrinsic (i-type) oxide semiconductor which has a sufficiently low hydrogen concentration to be highly purified and to have a sufficiently low carrier concentration, is used as the switching element and the capacitor electrically connected to the source electrode or the drain electrode of the transistor is provided; thus, it is possible to realize a non-volatile latch circuit which operates in a wide temperature range and stably operates even at high temperature, and in which a stored logic state is not erased even when the power is turned off, or a latch circuit which has a sufficiently long refresh time and data retention characteristics. In addition, since a charge accumulated in the capacitor is stored as data, data can be read easily with less variation as compared with the case where data is retained by remanent polarization.

Various kinds of logic circuits can be provided by using the non-volatile latch circuit. For example, the power consumption of a logic circuit using the non-volatile latch circuit can be reduced by turning off the power of blocks not in use. In addition, since a logic state is stored even when the power is turned off, a system can be started when the power is turned on or terminated when the power is turned off, at high speed and low power.

This embodiment can be freely combined with the other embodiments.

Embodiment 6

In this embodiment, a configuration of a logic circuit including a plurality of the non-volatile latch circuits each of which is an embodiment of the disclosed invention, will be described with reference to FIGS. 16A to 16C.

Figure 16A:
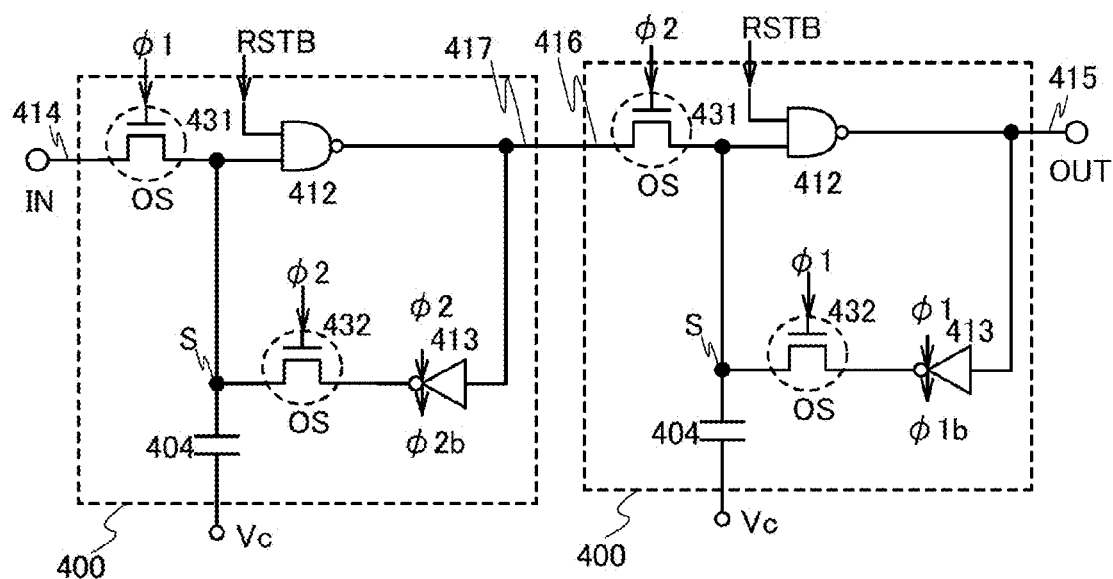
FIGS. 16A to 16C illustrate examples of a configuration of a non-volatile latch circuit.

FIG. 16A illustrates a configuration of a logic circuit including two non-volatile latch circuits 400. This logic circuit is referred to as a D-FF and used as a register in a CPU or various logic circuits for example. FIG. 16B illustrates a configuration of part of the non-volatile latch circuit 400.

FIG. 16A illustrates an example of the configuration of the latch circuit 400 in FIG. 1, where a NAND is used as the first element and a clocked inverter is used as the second element.

That is, the latch circuit 400 has a loop structure in which an output of the first element (NAND) 412 is electrically connected to an input of the second element (clocked inverter) 413 and an output of the second element (clocked inverter) 413 is electrically connected to an input of the first element (NAND) 412 through the second transistor 432.

One of the inputs of the first element (NAND) 412 is electrically connected to the wiring 414 to which an input signal is applied through the first transistor 431. The output of the first element (NAND) 412 is electrically connected to the wiring 415 to which an output signal is applied. The other input of the first element (NAND) 412 is electrically connected to a wiring to which a signal RSTB is applied. A clock signal and an inverted clock signal are applied to the second element (clocked inverter) 413. The first transistor 431 and the second transistor 432 can have a structure similar to that shown in Embodiment 1. That is, as the first transistor 431 and the second transistor 432, it is possible to use a transistor which uses an oxide semiconductor layer for a channel formation region and has normally-off characteristics and a significantly low off-state current.

In the non-volatile latch circuit 400, the first transistor 431 and the second transistor 432 are used as switching elements. In addition, the non-volatile latch circuit 400 includes the capacitor 404 which is electrically connected to a source electrode or a drain electrode of the first transistor 431 and the second transistor 432. That is, one electrode of the capacitor 404 is electrically connected to one of the source electrode and the drain electrode of the first transistor 431, and the one electrode of the capacitor 404 is electrically connected to one of the source electrode and the drain electrode of the second transistor 432. The other of the source electrode and the drain electrode of the first transistor 431 is electrically connected to the wiring to which an input signal is applied. The other of the source electrode and the drain electrode of the second transistor 432 is electrically connected to the output of the second element. A potential Vc is applied to the other electrode of the capacitor 404.

Figure 16B:
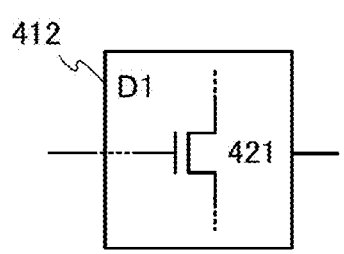

In the above configuration, the first element (NAND) 412 included in the non-volatile latch circuit 400 includes at least the third transistor 421 as illustrated in FIG. 16B. The gate of the third transistor 421 is electrically connected to the input of the first element (NAND) 412. That is, the gate of the third transistor 421 is electrically connected to one of the source electrode and the drain electrode of the second transistor 432. Furthermore, the gate of the third transistor 421 is electrically connected to one of the source electrode and the drain electrode of the first transistor 431.

The first transistor 431 and the second transistor 432 can have a structure illustrated in FIG. 2A or FIG. 2B instead of the structure illustrated in FIG. 16A.

As described above, in the non-volatile latch circuit 400, the capacitor 404 and the gate capacitance of the third transistor 421 are electrically connected to predetermined positions in the loop structure. Specifically, one electrode of the capacitor 404 and the gate of the third transistor 421 are electrically connected to the input of the first element (NAND) 412. In this manner, the capacitor 404 and the gate capacitance of the third transistor 421 are electrically connected to predetermined positions in the loop structure of the non-volatile latch circuit 400. Thus, every time data is written to the latch circuit, a charge corresponding to the data is accumulated in the capacitor 404 and the gate capacitance of the third transistor 421. In other words, data of the latch circuit 400 is automatically written to a non-volatile latch (data writing). Data rewriting can be performed similarly.

Data written to the capacitor 404 and the gate capacitance of the third transistor 421, namely, a charge accumulated in the capacitor 404 and the gate capacitance of the third transistor 421, can be retained by applying a potential to the gate of the first transistor 431 and the gate of the second transistor 432 so that the first transistor 431 and the second transistor 432 are turned off (data retaining).

Here, a transistor used as the first transistor 431 and the second transistor 432 uses an oxide semiconductor layer for a channel formation region and has normally-off characteristics and a significantly low off-state current. Thus, a charge accumulated in the capacitor can be kept retained even after a power source voltage has stopped to be supplied to at least the first element (NAND) 412 and the second element (clocked inverter) 413 included in the latch circuit 400. Accordingly, the logic state of the latch circuit 400 can be kept stored even after the supply of the power source voltage has stopped.

The capacitor 404 and the gate capacitance of the third transistor 421 are electrically connected to the input of the first element (NAND) 412. Thus, after the power source voltage restarts to be supplied to at least the first element (NAND) 412 of the latch circuit 400, the potential of the output signal OUT is determined by the charge accumulated in the capacitor 404 and the gate capacitance of the third transistor 421. That is, the data written to the capacitor 404 and the gate capacitance of the third transistor 421 can be read (data reading).

The logic circuit illustrated in FIG. 16A includes two non-volatile latch circuits 400 described above. The non-volatile latch circuit 400 is electrically connected to the wiring 414 to which a potential of an input signal is applied from a circuit of a preceding stage. A wiring 417 to which a potential of an output signal of the non-volatile latch circuit 400 is applied is electrically connected to a wiring 416 to which a potential of an input signal of the non-volatile latch circuit 400 is applied. The non-volatile latch circuit 400 is electrically connected to the wiring 415 from which a potential of an output signal is applied to a circuit of a subsequent stage.

Although FIG. 16A illustrates an example in which the data of the latch circuit 400 is retained in the capacitor 404 and the gate capacitance of the third transistor 421, only the gate capacitance of the third transistor 421 can be used without using the other capacitor (the capacitor 404). In that case, the capacitor 404 is not necessarily provided in the latch circuit 400.

Figure 16C:
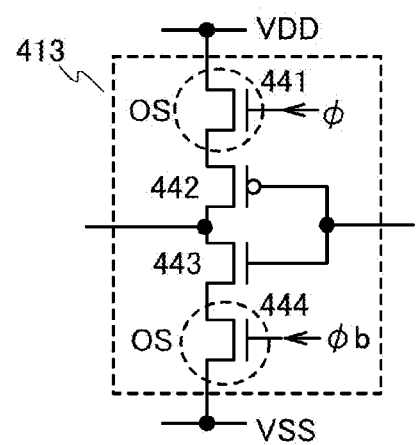

In the latch circuit 400 illustrated in FIG. 16A, the second element (clocked inverter) 413 may have a configuration illustrated in FIG. 16C. The second element (clocked inverter) 413 in FIG. 16C includes a transistor 442 and a transistor 443 electrically connected to the input and the output of the second element (clocked inverter) 413, a transistor 441 electrically connected to a high-level power source voltage VDD, and a transistor 444 electrically connected to a low-level power source voltage VSS. The transistor 441 and the transistor 444 each function as a switch for controlling the supply and stop of a power source voltage. A clock signal $\phi$ and an inverted clock signal $\phi b$ are applied to a gate of the transistor 441 and a gate of the transistor 444, respectively.

Here, as the transistor 441 and the transistor 444 included in the second element (clocked inverter) 413 in FIG. 16C, it is possible to use a transistor which uses an oxide semiconductor layer for a channel formation region and has normally-off characteristics and a significantly low off-state current. When a transistor using an oxide semiconductor as a semiconductor material of a channel formation region is thus used as the transistor 441 and the transistor 444 functioning as a switch for controlling the supply and stop of a power source voltage of the second element (clocked inverter) 413, the current path through the latch circuit 400 can be interrupted. In the case where the configuration of FIG. 16C is used, the second transistor 432 in the latch circuit is not necessarily provided. That is, in the case where the configuration of FIG. 16C is used, the second transistor 432 is not necessarily provided in the latch circuit 400.

According to this embodiment, a transistor using, as a semiconductor material of a channel formation region, an intrinsic (i-type) or substantially intrinsic (i-type) oxide semiconductor which has a sufficiently low hydrogen concentration to be highly purified and to have a sufficiently low carrier concentration, is used as the switching element and the capacitor electrically connected to the source electrode or the drain electrode of the transistor is provided; thus, it is possible to realize a non-volatile latch circuit which operates in a wide temperature range and stably operates even at high temperature, and in which a stored logic state is not erased even when the power is turned off, or a latch circuit which has a sufficiently long refresh time and data retention characteristics. In addition, since a charge accumulated in the capacitor is stored as data, data can be read easily with less variation as compared with the case where data is retained by remanent polarization.

Various kinds of logic circuits can be provided by using the non-volatile latch circuit. For example, the power consumption of a logic circuit using the non-volatile latch circuit can be reduced by turning off the power of blocks not in use. In addition, since a logic state is stored even when the power is turned off, a system can be started when the power is turned on or terminated when the power is turned off, at high speed and low power.

This embodiment can be freely combined with the other embodiments.

Embodiment 7

Next, another example of the method for manufacturing a transistor using an oxide semiconductor which can be used as the transistor 402 in the above embodiments (such as Embodiment 1 or Embodiment 2), will be described with reference to FIGS. 17A to 17E. In this embodiment, description is made in detail on the case of using an oxide semiconductor (particularly with an amorphous structure) which is highly purified. Although a top-gate transistor is used as an example in the following description, the structure of the transistor is not limited to this.

First, an insulating layer 202 is formed over a bottom substrate 200. Then, an oxide semiconductor layer 206 is formed over the insulating layer 202 (see FIG. 17A).

Here, the bottom substrate 200 corresponds to the substrate including the transistor 421 in the lower portion and the like, which is shown in the above embodiments. The above embodiments can be referred to for details of the bottom substrate 200. Note that a surface of the bottom substrate 200 is preferably as flat as possible. In order to achieve this, the surface may be subjected to CMP or the like so as to have a peak-to-valley height of 5 nm or less, preferably 1 nm or less, or a root-mean-square roughness (RMS) of 2 nm or less, preferably 0.4 nm or less.

The insulating layer 202 serves as a base and can be formed in a manner similar to that for forming the gate insulating layer 138, the protective insulating layer 144, or the like shown in the above embodiments. The above embodiments can be referred to for details of the insulating layer 202. Note that the insulating layer 202 is preferably formed so as to contain hydrogen or water as little as possible.

The oxide semiconductor layer 206 can be formed using an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are oxides of two metal elements; or an In—O-based oxide semiconductor, a Sn—O-based oxide semiconductor, or a Zn—O-based oxide semiconductor.

In particular, an In—Ga—Zn—O-based oxide semiconductor material has a sufficiently high resistance when there is no electric field and thus a sufficiently low off-state current can be obtained. In addition, having a high field-effect mobility, the In—Ga—Zn—O-based oxide semiconductor material is suitable for a semiconductor device.

A typical example of the In—Ga—Zn—O-based oxide semiconductor material is represented by $InGaO_3(ZnO)_m$ (m>0, and m is not a natural number). Another example of the oxide semiconductor material is represented by $InMO_3(ZnO)_m$ (m>0, and m is not a natural number) where M is used instead of Ga. Here, M denotes one or more of metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, or Ga and Co. Note that the aforementioned composition is only an example obtained from a crystalline structure.

In this embodiment, the oxide semiconductor layer 206 with an amorphous structure is formed by a sputtering method using an In—Ga—Zn—O-based metal oxide target.

As the target for forming the oxide semiconductor layer 206 by a sputtering method, it is possible to use, for example, a target having a composition ratio of $In_2O_3$:$Ga_2O_3$:$ZnO$=1:1:1 [molar ratio]. It is also possible to use a target having a composition ratio of $In_2O_3$:$Ga_2O_3$:$ZnO$=1:1:2 [molar ratio] or a target having a composition ratio of $In_2O_3$:$Ga_2O_3$:$ZnO$=1:1:4 [molar ratio].

The relative density of the oxide semiconductor in the metal oxide target is greater than or equal to 80%, preferably greater than or equal to 95%, and more preferably greater than or equal to 99.9%. The use of the metal oxide target with high relative density makes it possible to form the oxide semiconductor layer 206 having a dense structure.

The atmosphere in which the oxide semiconductor layer 206 is formed is preferably a rare gas (typically argon) atmosphere, an oxygen atmosphere, or a mixed atmosphere of a rare gas (typically argon) and oxygen. Specifically, it is preferable to use, for example, a high-purity gas atmosphere from which an impurity such as hydrogen, water, a hydroxyl group, or hydride is removed to a concentration of a few ppm or less (for example, 1 ppm or less), preferably a few ppb or less (for example, 1 ppb or less).

When the oxide semiconductor layer 206 can be formed, for example, the substrate is held in a treatment chamber kept under reduced pressure and the substrate is heated to a temperature of 100° C. to 550° C. inclusive, preferably 200° C. to 400° C. inclusive. Then, a sputtering gas from which hydrogen, water, or the like is removed is introduced while moisture in the treatment chamber is removed, whereby the oxide semiconductor layer 206 is formed with use of the aforementioned target. By forming the oxide semiconductor layer 206 while heating the substrate, impurities in the oxide semiconductor layer 206 can be reduced. In addition, damage due to sputtering can be reduced. In order to remove moisture from the treatment chamber, it is preferable to use an adsorption-type vacuum pump. For example, a cryopump, an ion pump, or a titanium sublimation pump can be used. A turbo pump provided with a cold trap may also be used. Hydrogen, water, or the like is removed from the treatment chamber evacuated with a cryopump; thus, the concentration of impurities in the oxide semiconductor layer 206 can be reduced.

The oxide semiconductor layer 206 is formed under the following conditions, for example: the distance between the substrate and the target is 170 mm; the pressure is 0.4 Pa; the direct-current (DC) power is 0.5 kW; and the atmosphere is oxygen (100% of oxygen), argon (100% of argon), or a mixed atmosphere of oxygen and argon. Note that a pulsed direct-current (DC) power supply is preferably used because dust (such as powder substances formed at the time of film formation) can be reduced and the film thickness can be made uniform. The thickness of the oxide semiconductor layer 206 is 2 nm to 200 nm inclusive, preferably 5 nm to 30 nm inclusive. Note that the appropriate thickness of the oxide semiconductor layer differs depending on the oxide semiconductor material used, the intended purpose of a semiconductor device, or the like; therefore, the thickness may be determined in accordance with the material, the intended purpose, or the like.

Note that before the oxide semiconductor layer 206 is formed by a sputtering method, it is preferable to perform reverse sputtering in which plasma is generated with an argon gas introduced, so that substances attached to the surface of the insulating layer 202 are removed. Here, the reverse sputtering is a method in which ions collide with a surface to be processed so that the surface is modified, in contrast to normal sputtering in which ions collide with a sputtering target. An example of a method for making ions collide with a surface to be processed is a method in which a high-frequency voltage is applied to the surface in an argon atmosphere and plasma is generated near a substrate. Note that an atmosphere of nitrogen, helium, oxygen, or the like may be used instead of an argon atmosphere.

Next, the oxide semiconductor layer 206 is processed by a method such as etching using a mask, whereby an island-shaped oxide semiconductor layer 206a is formed.

Either dry etching or wet etching may be employed for etching the oxide semiconductor layer 206. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape. The above embodiments can be referred to for details of the etching conditions. The oxide semiconductor layer 206 can be etched in a manner similar to that for forming the oxide semiconductor layer in the above embodiments. The above embodiments can be referred to for details of the etching.

After that, heat treatment (first heat treatment) is preferably performed on the oxide semiconductor layer 206a. Through the first heat treatment, excess hydrogen (including water and hydroxyl groups) in the oxide semiconductor layer 206a can be removed, the structure of the oxide semiconductor layer 206a can be aligned, and defects in the oxide semiconductor layer 206a can be reduced. The first heat treatment is performed at a temperature of, for example, 300° C. to 550° C. inclusive, or 400° C. to 550° C. inclusive.

The heat treatment can be performed in such a manner that, for example, the bottom substrate 200 is introduced into an electric furnace using a resistance heating element or the like, and then heated under a nitrogen atmosphere at 450° C. for an hour. During the heat treatment, the oxide semiconductor layer 206a is not exposed to the air to prevent the entry of water or hydrogen.

The heat treatment apparatus is not limited to an electric furnace, and it is also possible to use an apparatus for heating an object to be processed using thermal conduction or thermal radiation generated from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The substrate is put in an inert gas atmosphere, heated for several minutes, and taken out of the inert gas atmosphere. The GRTA process enables high-temperature heat treatment in a short time. Moreover, the GRTA process can be employed even when the temperature exceeds the upper temperature limit of the substrate because the heat treatment can be performed in a short time.

Note that the inert gas may be changed to a gas including oxygen during the process. This is because defects caused by oxygen vacancies can be reduced by performing the first heat treatment in an atmosphere containing oxygen.

For example, in the case where an electrical furnace is used for the first heat treatment, an atmosphere can be changed when a heat treatment temperature falls. For example, the heat treatment can be performed (at a constant temperature) in an atmosphere of an inert gas such as a rare gas (such as helium, neon, or argon) or nitrogen, and the gas can be changed to an atmosphere containing oxygen when the temperature falls. As the atmosphere containing oxygen, an oxygen gas or a mixed gas of an oxygen gas and a nitrogen gas can be used.

Note that as the inert gas atmosphere, it is preferable to use an atmosphere that contains nitrogen or a rare gas (e.g., helium, neon, or argon) as its main component and that does not contain water, hydrogen, or the like. For example, the purity of nitrogen or a rare gas such as helium, neon, or argon introduced into the heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

In any case, when the impurities are reduced through the first heat treatment to form the i-type or substantially i-type oxide semiconductor layer 206a, a transistor with excellent properties can be realized.

Note that the first heat treatment can also be performed on the oxide semiconductor layer 206 which has not yet been processed into the island-shaped oxide semiconductor layer 206a. In that case, after the first heat treatment, the bottom substrate 200 is taken out of the heating apparatus and a photolithography step is performed.

The first heat treatment, which has an effect of removing hydrogen or water, can also be referred to as dehydration treatment, dehydrogenation treatment, or the like. The dehydration treatment or dehydrogenation treatment can be performed, for example, after the oxide semiconductor layer is formed, or after a source or drain electrode is stacked over the oxide semiconductor layer 206a. Such dehydration treatment or dehydrogenation treatment may be conducted once or plural times.

Next, a conductive layer is formed to be in contact with the oxide semiconductor layer 206a. Then, the conductive layer is selectively etched to form a source or drain electrode 208a and a source or drain electrode 208b (see FIG. 17B). This step is similar to the step for forming the source or drain electrode 142a and the like described in the above embodiments. The above embodiments can be referred to for details of the step.

Figure 17A:
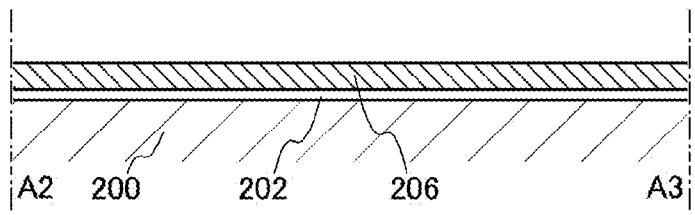
FIGS. 17A to 17E illustrate an example of a method for manufacturing an element included in a non-volatile latch circuit.
Figure 17B:
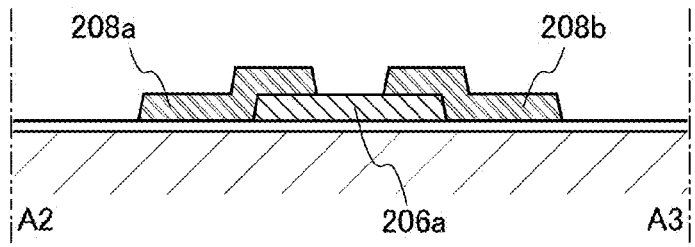
Figure 17C:
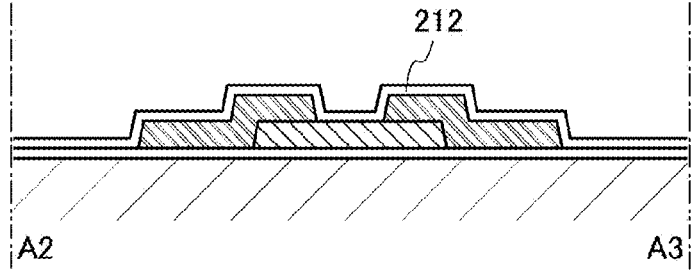

Next, a gate insulating layer 212 in contact with part of the oxide semiconductor layer 206a is formed (see FIG. 17C). The description of the gate insulating layer in the above embodiments can be referred to for details of the gate insulating layer 212.

After the gate insulating layer 212 is formed, second heat treatment is preferably performed in an inert gas atmosphere or an oxygen atmosphere. The heat treatment is performed at a temperature of 200° C. to 450° C. inclusive, preferably 250° C. to 350° C. inclusive. For example, the heat treatment may be performed at 250° C. for one hour in a nitrogen atmosphere. The second heat treatment can reduce variations in electric characteristics of the transistor. In the case where the gate insulating layer 212 contains oxygen, by supplying oxygen to the oxide semiconductor layer 206a to reduce oxygen vacancy of the oxide semiconductor layer 206a, an i-type (intrinsic) or substantially i-type oxide semiconductor layer can be formed.

Note that the second heat treatment is performed in this embodiment immediately after the gate insulating layer 212 is formed; however, the timing of the second heat treatment is not limited to this.

Figure 17D:
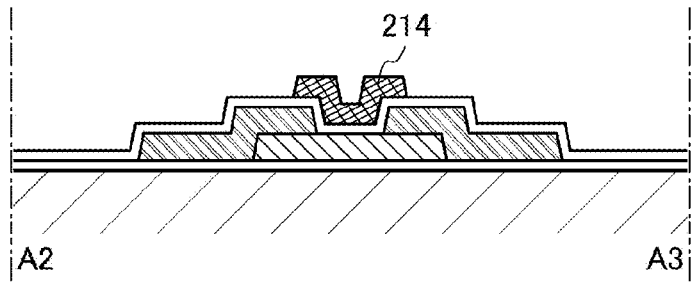

Next, a gate electrode 214 is formed over the gate insulating layer 212 in a region overlapping with the oxide semiconductor layer 206a (see FIG. 17D). The gate electrode 214 can be formed by forming a conductive layer over the gate insulating layer 212 and then selectively patterning the conductive layer. The description of the gate electrode in the above embodiments can be referred to for details of the gate electrode 214.

Figure 17E:
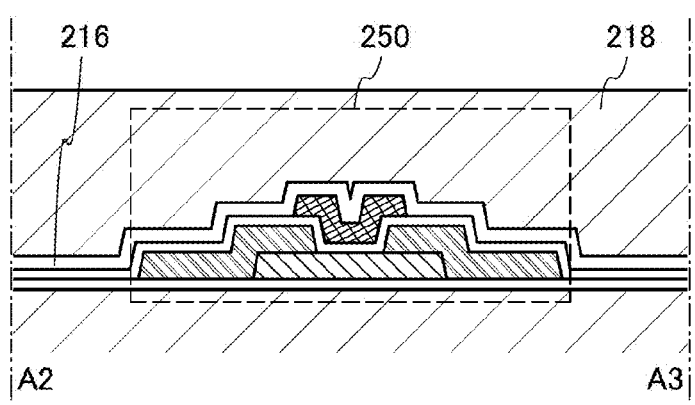

Next, an interlayer insulating layer 216 and an interlayer insulating layer 218 are formed over the gate insulating layer 212 and the gate electrode 214 (see FIG. 17E). The interlayer insulating layers 216 and 218 can be formed by a PVD method, a CVD method, or the like. The interlayer insulating layers 216 and 218 can be formed of a material including an inorganic insulating material such as silicon oxide, silicon oxynitride, silicon nitride, hafnium oxide, aluminum oxide, or tantalum oxide. Note that a layered structure of the interlayer insulating layers 216 and 218 is used in this embodiment, but an embodiment of the disclosed invention is not limited to this example. A single-layer structure or a layered structure of three or more layers can also be used.

Note that the interlayer insulating layer 218 is preferably formed so as to have a flat surface. This is because an electrode, a wiring, or the like can be favorably formed over the interlayer insulating layer 218 when the interlayer insulating layer 218 is formed to have a flat surface.

Through the above steps, a transistor 250 using the highly-purified oxide semiconductor layer 206a is completed.

The transistor 250 illustrated in FIG. 17E includes: the oxide semiconductor layer 206a provided over the bottom substrate 200 with the insulating layer 202 interposed therebetween; the source or drain electrode 208a and the source or drain electrode 208b that are electrically connected to the oxide semiconductor layer 206a; the gate insulating layer 212 covering the oxide semiconductor layer 206a, the source or drain electrode 208a, and the source or drain electrode 208b; the gate electrode 214 over the gate insulating layer 212; the interlayer insulating layer 216 over the gate insulating layer 212 and the gate electrode 214; and the interlayer insulating layer 218 over the interlayer insulating layer 216.

In the transistor 250 shown in this embodiment, the oxide semiconductor layer 206a is highly purified. Therefore, the concentration of hydrogen in the oxide semiconductor layer 206a is less than or equal to $5\times10^{19}/cm^3$, preferably less than or equal to $5\times10^{18}/cm^3$, more preferably less than or equal to $5\times10^{17}/cm^3$, and still more preferably less than or equal to $1\times10^{16}/cm^3$. In addition, the carrier density of the oxide semiconductor layer 206a is sufficiently low (e.g., less than $1\times10^{12}/cm^3$, preferably less than $1\times10^{11}/cm^3$) as compared with that of a typical silicon wafer (approximately $1\times10^{14}/cm^3$). As a result of this, a sufficiently low off-state current can be obtained. For example, in the case where a drain voltage Vd is +1 V or +10 V and a gate voltage Vg is in the range of −5 V to −20 V, the off-state current is less than or equal to $1\times10^{-13}$ A at room temperature. Furthermore, the aforementioned transistor has the properties as a normally-off transistor. Accordingly, the off-state current obtained when a voltage between a gate electrode and a source electrode is approximately 0 V, namely, the leakage current is much smaller than that of a transistor using silicon. For example, the leakage current per unit channel width at room temperature is less than or equal to 10 aA/μm.

In this manner, by using the oxide semiconductor layer 206a that is highly purified to be made intrinsic, the off-state current of the transistor can be sufficiently reduced.

In this embodiment, the transistor 250 is used as the transistor 402 shown in the above embodiments; however, the disclosed invention does not need to be construed as being limited to that case. For example, when the electric properties of an oxide semiconductor are sufficiently increased, the oxide semiconductor can be used for all the transistors including transistors included in an integrated circuit. In such a case, it is not necessary to employ a layered structure as shown in the above embodiments, and a semiconductor device can be formed using, for example, a substrate such as a glass substrate.

The structures, methods, and the like shown in this embodiment can be combined as appropriate with any of the structures, methods, and the like shown in the other embodiments.

Embodiment 8

Next, another example of the method for manufacturing a transistor using an oxide semiconductor which can be used as the transistor 402 in the above embodiments (such as Embodiment 1 or Embodiment 2), will be described with reference to FIGS. 18A to 18E. In this embodiment, description is made in detail on the case of using, as an oxide semiconductor layer, a first oxide semiconductor layer having a crystallized region and a second oxide semiconductor layer that is obtained by crystal growth from the crystallized region of the first oxide semiconductor layer. Although a top-gate transistor is used as an example in the following description, the structure of the transistor is not limited to this.

First, an insulating layer 302 is formed over a bottom substrate 300. Next, a first oxide semiconductor layer is formed over the insulating layer 302, and then subjected to first heat treatment so that a region including at least a surface of the first oxide semiconductor layer is crystallized, whereby a first oxide semiconductor layer 304 is formed (see FIG. 18A).

Here, the bottom substrate 300 corresponds to the substrate including the transistor 421 in the lower portion and the like, which is shown in the above embodiments. The above embodiments can be referred to for details of the bottom substrate 300. Note that the flatness of the surface of the bottom substrate 300 is particularly important in this embodiment, because it is indispensable for uniform crystal growth. In order to obtain an oxide semiconductor layer with preferable crystallinity, the surface of the bottom substrate 300 may have a peak-to-valley height of 1 nm or less, preferably 0.2 nm or less, or a root-mean-square roughness (RMS) of 0.5 nm or less, preferably 0.1 nm or less.

The insulating layer 302 serves as a base and can be formed in a manner similar to that for forming the gate insulating layer 138, the protective insulating layer 144, or the like shown in the above embodiments. The above embodiments can be referred to for details of the insulating layer 302. Note that the insulating layer 302 is preferably formed so as to contain hydrogen or water as little as possible.

The first oxide semiconductor layer 304 can be formed in a manner similar to that for forming the oxide semiconductor layer 206 shown in the above embodiment. The above embodiment can be referred to for details of the first oxide semiconductor layer 304 and a manufacturing method thereof. Note that in this embodiment, the first oxide semiconductor layer 304 is intentionally crystallized by the first heat treatment; therefore, the first oxide semiconductor layer 304 is preferably formed using a metal oxide target which causes crystallization easily. For example, ZnO can be used. Further, it is also preferable to use an In—Ga—Zn—O-based oxide in which the proportion of Zn in metal elements (In, Ga, Zn) is higher than or equal to 60%, because an In—Ga—Zn—O-based oxide containing Zn at high concentration is easily crystallized. The thickness of the first oxide semiconductor layer 304 is preferably 3 nm to 15 nm inclusive, and in this embodiment, 5 nm for example. Note that the appropriate thickness of the oxide semiconductor layer 304 differs depending on the oxide semiconductor material used, the intended purpose of a semiconductor device, or the like; accordingly, the thickness may be determined in accordance with the material, the intended purpose, or the like.

The first heat treatment is performed at a temperature of 450° C. to 850° C. inclusive, preferably 550° C. to 750° C. inclusive. The time for the first heat treatment is preferably 1 minute to 24 hours inclusive. The temperature and time differ depending on the kind or composition ratio of the oxide semiconductor. In addition, the first heat treatment is preferably performed in an atmosphere that does not contain hydrogen or water, such as an atmosphere of nitrogen, oxygen, or a rare gas (e.g., helium, neon, or argon), from which water is sufficiently removed.

As a heat treatment apparatus, it is possible to use not only an electric furnace, but also an apparatus for heating an object to be processed using thermal conduction or thermal radiation generated from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

Through the aforementioned first heat treatment, a region including at least the surface of the first oxide semiconductor layer is crystallized. The crystallized region is formed in such a manner that crystal growth proceeds from the surface of the first oxide semiconductor layer toward the inside of the first oxide semiconductor layer. Note that in some cases, the crystallized region includes a plate-like crystal with an average thickness of 2 nm to 10 nm inclusive. The crystallized region also includes, in some cases, a crystal which has an a-b surface substantially parallel to the surface of the oxide semiconductor layer and in which a c-axis is oriented in a direction substantially perpendicular to the surface of the oxide semiconductor layer. Here, "a direction substantially parallel" means a direction within ±10° of the parallel direction, and "a direction substantially perpendicular" means a direction within ±10° of the perpendicular direction.

Through the first heat treatment during which the crystallized region is formed, hydrogen (including water or hydroxyl groups) in the first oxide semiconductor layer is preferably removed. In order to remove hydrogen or the like, the first heat treatment may be performed in an atmosphere of nitrogen, oxygen, or a rare gas (helium, neon, argon, or the like), which has a purity of 6N (99.9999%) or more (that is, the concentration of the impurities is less than or equal to 1 ppm), more preferably a purity of 7N (99.99999%) or more (that is, the concentration of the impurities is less than or equal to 0.1 ppm). Alternatively, the first heat treatment may be performed in ultra-dry air containing $H_2O$ with 20 ppm or less, preferably 1 ppm or less.

Furthermore, through the first heat treatment during which the crystallized region is formed, oxygen is preferably supplied to the first oxide semiconductor layer. Oxygen can be supplied to the first oxide semiconductor layer by, for example, changing the atmosphere for the heat treatment to an oxygen atmosphere.

The first heat treatment in this embodiment is as follows: hydrogen or the like is removed from the oxide semiconductor layer through heat treatment in a nitrogen atmosphere at 700° C. for 1 hour, and then the atmosphere is changed to an oxygen atmosphere so that oxygen is supplied to the inside of the first oxide semiconductor layer. Note that the main purpose of the first heat treatment is the formation of the crystallized region; accordingly, treatment for removing hydrogen or the like and supplying oxygen may be performed separately. For example, heat treatment for crystallization can be performed after heat treatment for removing hydrogen or the like and treatment for supplying oxygen.

Through such first heat treatment, the crystallized region is formed, hydrogen (including water and hydroxyl groups) or the like is removed, and the first oxide semiconductor layer 304 supplied with oxygen can be obtained.

Figure 18A:
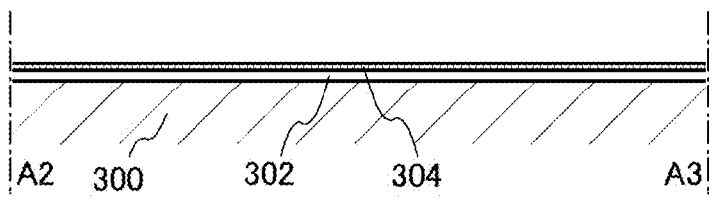
FIGS. 18A to 18E illustrate an example of a method for manufacturing an element included in a non-volatile latch circuit.
Figure 18B:
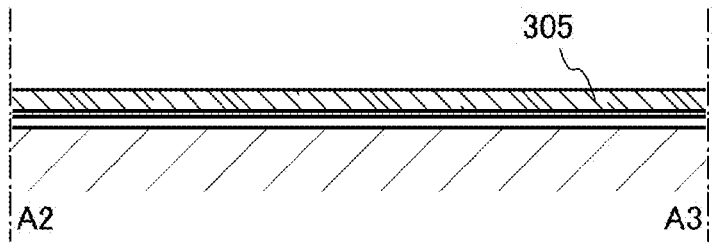

Next, a second oxide semiconductor layer 305 is formed over the first oxide semiconductor layer 304 including the crystallized region at least on its surface (see FIG. 18B).

The second oxide semiconductor layer 305 can be formed in a manner similar to that for forming the oxide semiconductor layer 206 shown in the above embodiments. The above embodiments can be referred to for details of the second oxide semiconductor layer 305 and a manufacturing method thereof. Note that the second oxide semiconductor layer 305 is preferably formed to be thicker than the first oxide semiconductor layer 304. Further, the second oxide semiconductor layer 305 is preferably formed so that the total thickness of the first oxide semiconductor layer 304 and the second oxide semiconductor layer 305 is 3 nm to 50 nm inclusive. Note that the appropriate thickness of the oxide semiconductor layer differs depending on the oxide semiconductor material used, the intended purpose of a semiconductor device, or the like; therefore, the thickness may be determined in accordance with the material, the intended purpose, or the like.

The second oxide semiconductor layer 305 and the first oxide semiconductor layer 304 are preferably made of materials which have the same main component and further have close lattice constants after crystallization (lattice mismatch is less than or equal to 1%). This is because in the crystallization of the second oxide semiconductor layer 305, crystal growth easily proceeds from the crystallized region of the first oxide semiconductor layer 304 in the case where materials having the same main component are used. In addition, the use of materials having the same main component realizes good interface physical properties or electric properties.

Note that in the case where a desired film quality is obtained through crystallization, the second oxide semiconductor layer 305 may be formed of a material which has a main component different from that of the material of the first oxide semiconductor layer 304.

Figure 18C:
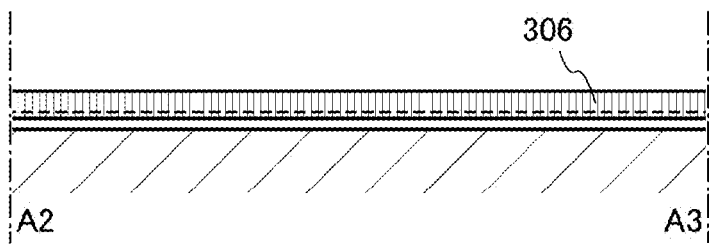

Next, second heat treatment is performed on the second oxide semiconductor layer 305, whereby crystal growth proceeds from the crystallized region of the first oxide semiconductor layer 304, and a second oxide semiconductor layer 306 is formed (see FIG. 18C).

The second heat treatment is performed at a temperature of 450° C. to 850° C. inclusive, preferably 600° C. to 700° C. inclusive. The time for the second heat treatment is 1 minute to 100 hours inclusive, preferably 5 hours to 20 hours inclusive, and typically 10 hours. Note that the second heat treatment is also preferably performed in an atmosphere that does not contain hydrogen or water.

Details of the atmosphere and the effect of the second heat treatment are similar to those of the first heat treatment. The heat treatment apparatus that can be used is also similar to that for the first heat treatment. For example, in the second heat treatment, inside of a furnace is filled with a nitrogen atmosphere when a temperature rises, and inside of the furnace is filled with an oxygen atmosphere when the temperature falls, whereby hydrogen or the like can be removed in the nitrogen atmosphere and oxygen can be supplied in the oxygen atmosphere.

Through the aforementioned second heat treatment, crystal growth can proceed from the crystallized region of the first oxide semiconductor layer 304 to the whole of the second oxide semiconductor layer 305, so that the second oxide semiconductor layer 306 can be formed. In addition, it is possible to form the second oxide semiconductor layer 306 from which hydrogen (including water and hydroxyl groups) or the like is removed and to which oxygen is supplied. Furthermore, the orientation of the crystallized region of the first oxide semiconductor layer 304 can be improved through the second heat treatment.

For example, in the case where an In—Ga—Zn—O-based oxide semiconductor material is used for the second oxide semiconductor layer 306, the second oxide semiconductor layer 306 can include a crystal represented by $InGaO_3(ZnO)_m$ (m>0, and m is not a natural number) or a crystal represented by $In_2Ga_2ZnO_7$ (In:Ga:Zn:O=2:2:1:7), for example. Such crystals are oriented through the second heat treatment so that a c-axis is in a direction substantially perpendicular to the surface of the second oxide semiconductor layer 306.

Here, the aforementioned crystals include any of In, Ga, and Zn, and can be considered to have a stacked structure of a plurality of layers parallel to an a-axis and a b-axis. Specifically, the aforementioned crystals have a structure in which a layer containing In and a layer not containing In (a layer containing Ga or Zn) are stacked in the c-axis direction.

In an In—Ga—Zn—O-based oxide semiconductor crystal, a layer containing In, namely a layer in a direction parallel to the a-axis and the b-axis, has good conductivity. This is because electrical conduction in the In—Ga—Zn—O-based oxide semiconductor crystal is mainly controlled by In, and the 5 s orbital of an In atom overlaps with the 5 s orbital of an adjacent In atom, so that a carrier path is formed.

Further, in the case where the first oxide semiconductor layer 304 includes an amorphous region at the interface with the insulating layer 302, through the second heat treatment, crystal growth proceeds in some cases from the crystallized region formed on the surface of the first oxide semiconductor layer 304 toward the bottom of the first oxide semiconductor layer to crystallize the amorphous region. Note that the amorphous region remains in some cases depending on the material of the insulating layer 302, the heat treatment conditions, and the like.

In the case where the first oxide semiconductor layer 304 and the second oxide semiconductor layer 305 are made of oxide semiconductor materials having the same main component, as illustrated in FIG. 18C, the first oxide semiconductor layer 304 and the second oxide semiconductor layer 306 have the same crystal structure in some cases. Therefore, although indicated by a dotted line in FIG. 18C, the boundary between the first oxide semiconductor layer 304 and the second oxide semiconductor layer 306 cannot be distinguished in some cases so that the first oxide semiconductor layer 304 and the second oxide semiconductor layer 306 can be considered as the same layer.

Figure 18D:
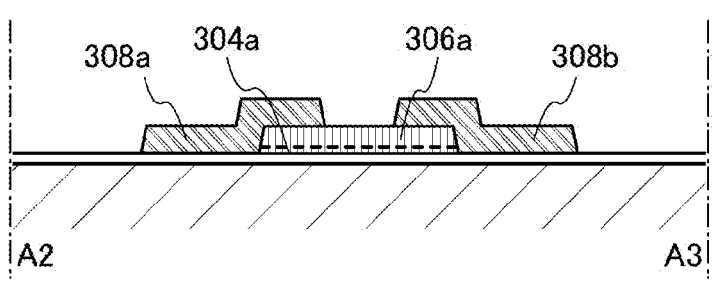

Next, the first oxide semiconductor layer 304 and the second oxide semiconductor layer 306 are processed by a method such as etching using a mask, whereby an island-shaped first oxide semiconductor layer 304a and an island-shaped second oxide semiconductor layer 306a are formed (see FIG. 18D).

The first oxide semiconductor layer 304 and the second oxide semiconductor layer 306 may be etched by either dry etching or wet etching. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape. The first oxide semiconductor layer 304 and the second oxide semiconductor layer 306 can be etched in a manner similar to that for etching the oxide semiconductor layer shown in the above embodiments. The above embodiments can be referred to for details of the etching.

A region of the oxide semiconductor layers, which becomes a channel formation region, preferably has a flat surface. For example, the surface of the second oxide semiconductor layer preferably has a peak-to-valley height of 1 nm or less (more preferably 0.2 nm or less) in a region overlapping with a gate electrode (the channel formation region).

Next, a conductive layer is formed to be in contact with the second oxide semiconductor layer 306a. Then, the conductive layer is selectively etched to form a source or drain electrode 308a and a source or drain electrode 308b (see FIG. 18D). The source or drain electrode 308a and the source or drain electrode 308b can be formed in a manner similar to that for forming the source or drain electrode 142a and the source or drain electrode 142b shown in the above embodiments. The above embodiments can be referred to for details of the source or drain electrodes 308a and 308b.

In the step illustrated in FIG. 18D, crystal layers on the side surfaces of the first oxide semiconductor layer 304a and the second oxide semiconductor layer 306a, which are in contact with the source or drain electrode 308a and the source or drain electrode 308b, are brought into an amorphous state in some cases.

Next, a gate insulating layer 312 in contact with part of the second oxide semiconductor layer 306a is formed. The gate insulating layer 312 can be formed by a CVD method or a sputtering method. Then, a gate electrode 314 is formed over the gate insulating layer 312 in a region overlapping with the first oxide semiconductor layer 304a and the second oxide semiconductor layer 306a. After that, an interlayer insulating layer 316 and an interlayer insulating layer 318 are formed over the gate insulating layer 312 and the gate electrode 314 (see FIG. 18E). The gate insulating layer 312, the gate electrode 314, the interlayer insulating layer 316, and the interlayer insulating layer 318 can be formed in a manner similar to that for forming the gate insulating layer and the like shown in the above embodiments. The above embodiments can be referred to for details of the gate insulating layer 312, the gate electrode 314, the interlayer insulating layer 316, and the interlayer insulating layer 318.

After the gate insulating layer 312 is formed, third heat treatment is preferably performed in an inert gas atmosphere or an oxygen atmosphere. The third heat treatment is performed at a temperature of 200° C. to 450° C. inclusive, preferably 250° C. to 350° C. inclusive. For example, the heat treatment may be performed at 250° C. for 1 hour in an oxygen atmosphere. The third heat treatment can reduce variations in electric characteristics of the transistor. In the case where the gate insulating layer 312 contains oxygen, by supplying oxygen to the second oxide semiconductor layer 306a to reduce oxygen vacancy of the second oxide semiconductor layer 306a, an i-type (intrinsic) or substantially i-type oxide semiconductor layer can be formed.

Note that the third heat treatment is performed in this embodiment after the gate insulating layer 312 is formed; however, the timing of the third heat treatment is not limited to this. Further, the third heat treatment may be omitted in the case where oxygen is supplied to the second oxide semiconductor layer through other treatment such as the second heat treatment.

The gate electrode 314 can be formed by forming a conductive layer over the gate insulating layer 312 and then selectively patterning the conductive layer. The description of the gate electrode in the above embodiments can be referred to for details of the gate electrode 314.

The interlayer insulating layer 316 and the interlayer insulating layer 318 can be formed by a PVD method or a CVD method. The interlayer insulating layer 316 and the interlayer insulating layer 318 can be made of a material including an inorganic insulating material such as silicon oxide, silicon oxynitride, silicon nitride, hafnium oxide, aluminum oxide, or tantalum oxide. Note that although a layered structure of the interlayer insulating layers 316 and 318 is used in this embodiment, an embodiment of the disclosed invention is not limited to this example. A single-layer structure or a layered structure including three or more layers can also be used.

Note that the interlayer insulating layer 318 is preferably formed so as to have a flat surface. This is because an electrode, a wiring, or the like can be favorably formed over the interlayer insulating layer 318 when the interlayer insulating layer 318 is formed to have a flat surface.

Through the above steps, a transistor 350 is completed. The transistor 350 uses the first oxide semiconductor layer 304a and the second oxide semiconductor layer 306a which is obtained by crystal growth from the crystallized region of the first oxide semiconductor layer 304a.

Figure 18E:
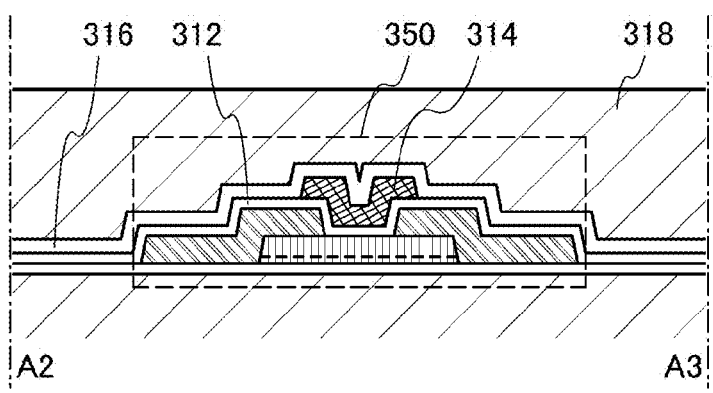

The transistor 350 illustrated in FIG. 18E includes: the first oxide semiconductor layer 304a provided over the bottom substrate 300 with the insulating layer 302 interposed therebetween; the second oxide semiconductor layer 306a provided over the first oxide semiconductor layer 304a; the source or drain electrode 308a and the source or drain electrode 308b that are electrically connected to the second oxide semiconductor layer 306a; the gate insulating layer 312 covering the second oxide semiconductor layer 306a, the source or drain electrode 308a, and the source or drain electrode 308b; the gate electrode 314 over the gate insulating layer 312; the interlayer insulating layer 316 over the gate insulating layer 312 and the gate electrode 314; and the interlayer insulating layer 318 over the interlayer insulating layer 316.

In the transistor 350 shown in this embodiment, the first oxide semiconductor layer 304a and the second oxide semiconductor layer 306a are highly purified. Therefore, the concentration of hydrogen in the first and second oxide semiconductor layers 304a and 306a is less than or equal to $5\times10^{19}/cm^3$, preferably less than or equal to $5\times10^{18}/cm^3$, more preferably less than or equal to $5\times10^{17}/cm^3$, and still more preferably less than $1\times10^{16}/cm^3$. In addition, the carrier density of the first and second oxide semiconductor layers 304a and 306a is sufficiently low (e.g., less than $1\times10^{12}/cm^3$, preferably less than $1\times10^{11}/cm^3$) as compared with that of a typical silicon wafer (approximately $1\times10^{14}/cm^3$). As a result of this, a sufficiently low off-state current can be obtained. For example, in the case where a drain voltage Vd is +1 V or +10 V and a gate voltage Vg is in the range of −5 V to −20 V, the off-state current is less than or equal to $1\times10^{-13}$ A at room temperature. Furthermore, the aforementioned transistor 350 has the properties as a normally-off transistor. Accordingly, the off-state current obtained when a voltage between a gate electrode and a source electrode is approximately 0 V, namely, the leakage current is much smaller than that of a transistor using silicon. For example, the leakage current per unit channel width is less than or equal to 10 aA/μm at room temperature.

In this manner, by using the first oxide semiconductor layer 304a and the second oxide semiconductor layer 306a that are highly purified to be made intrinsic the off-state current of the transistor can be sufficiently reduced.

Furthermore, in this embodiment, the first oxide semiconductor layer 304a having a crystallized region and the second oxide semiconductor layer 306a which is obtained by crystal growth from the crystallized region of the first oxide semiconductor layer 304a are used as the oxide semiconductor layer. Thus, the field-effect mobility can be increased and a transistor with good electric properties can be realized.

Note that in this embodiment, the transistor 350 is used as the transistor 402 shown in the above embodiments; however, the disclosed invention does not need to be construed as being limited to that case. For example, the transistor 350 shown in this embodiment uses the first oxide semiconductor layer 304a having a crystallized region and the second oxide semiconductor layer 306a which is obtained by crystal growth from the crystallized region of the first oxide semiconductor layer 304a, and thus has a high field-effect mobility. Accordingly, the oxide semiconductor can be used for all the transistors including transistors included in an integrated circuit. In such a case, it is not necessary to employ a layered structure as shown in the above embodiments, and a semiconductor device can be formed using, for example, a substrate such as a glass substrate.

The structures, methods, and the like shown in this embodiment can be combined as appropriate with any of the structures, methods, and the like shown in the other embodiments.

Embodiment 9

In this embodiment, examples of an electronic device provided with a semiconductor device using the non-volatile latch circuit obtained in the above embodiments, will be described with reference to FIGS. 19A to 19F. An electronic device provided with a semiconductor device using the non-volatile latch circuit obtained in the above embodiments has excellent characteristics which cannot be seen in the conventional technology. Therefore, with use of a semiconductor device including the non-volatile latch circuit, an electronic device with a new structure can be provided. Note that a semiconductor device using the non-volatile latch circuit according to the above embodiments is integrated to be mounted on a circuit board or the like, and then placed inside each electronic device.

Figure 19A:
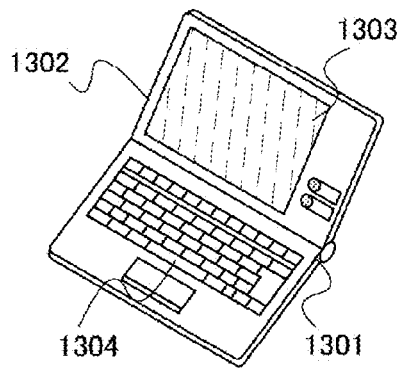
FIGS. 19A to 19F illustrate examples of an electronic device including a semiconductor device using a non-volatile latch circuit.

FIG. 19A illustrates a laptop personal computer provided with a semiconductor device using the non-volatile latch circuit according to the above embodiments, and includes a main body 1301, a housing 1302, a display portion 1303, a keyboard 1304, and the like. When the semiconductor device according to the disclosed invention is applied to a personal computer, a high-performance personal computer can be provided.

Figure 19B:
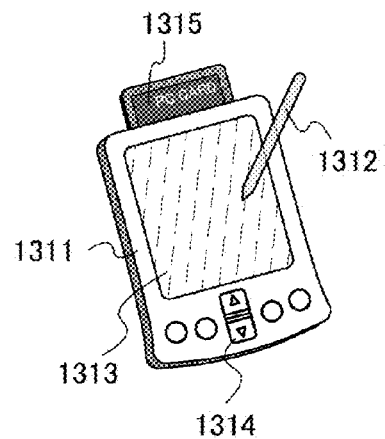

FIG. 19B illustrates a personal digital assistant (PDA) provided with a semiconductor device using the non-volatile latch circuit according to the above embodiments. A main body 1311 includes a display portion 1313, an external interface 1315, operation buttons 1314, and the like. In addition, a stylus 1312 is provided as an accessory for operating the PDA. When the semiconductor device according to the disclosed invention is applied to a personal digital assistant (PDA), a high-performance personal digital assistant (PDA) can be provided.

Figure 19C:
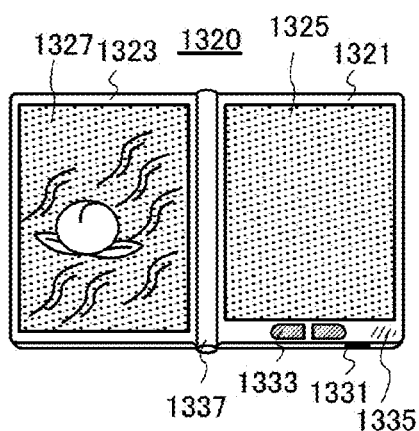

FIG. 19C illustrates an e-book reader 1320 as an example of electronic paper provided with a semiconductor device using the non-volatile latch circuit according to the above embodiments. The e-book reader 1320 includes two housings, a housing 1321 and a housing 1323. The housing 1321 and the housing 1323 are combined with a hinge 1337 so that the e-book reader 1320 can be opened and closed with the hinge 1337 as an axis. With such a structure, the e-book reader 1320 can be used like a paper book.

The housing 1321 includes a display portion 1325 and the housing 1323 includes a display portion 1327. The display portion 1325 and the display portion 1327 may display one image or different images. With a structure where different images are displayed, for example, text can be displayed on the right display portion (the display portion 1325 in FIG. 19C) and images can be displayed on the left display portion (the display portion 1327 in FIG. 19C).

FIG. 19C illustrates an example in which an operation portion and the like are provided in the housing 1321. The housing 1321 includes, for example, a power source switch 1331, operation keys 1333, and a speaker 1335. Pages can be turned with the operation keys 1333. Note that a keyboard, a pointing device, or the like may also be provided on the surface of the housing on which the display portion is provided. Furthermore, an external connection terminal (such as an earphone terminal, a USB terminal, or a terminal that can be connected to an AC adapter and various cables such as a USB cable), a recording medium insertion portion, and the like may be provided on the back or side surface of the housing. Moreover, the e-book reader 1320 may have a function as an electronic dictionary.

In addition, the e-book reader 1320 may have a configuration capable of wirelessly transmitting and receiving data. Through wireless communication, desired book data or the like can be purchased and downloaded from an electronic book server.

Note that electronic paper can be applied to devices in a variety of fields which display information. For example, electronic paper can be used for posters, advertisement in vehicles such as trains, or display on a variety of cards such as credit cards, as well as e-book readers. When the semiconductor device according to the disclosed invention is applied to electronic paper, high-performance electronic paper can be provided.

Figure 19D:
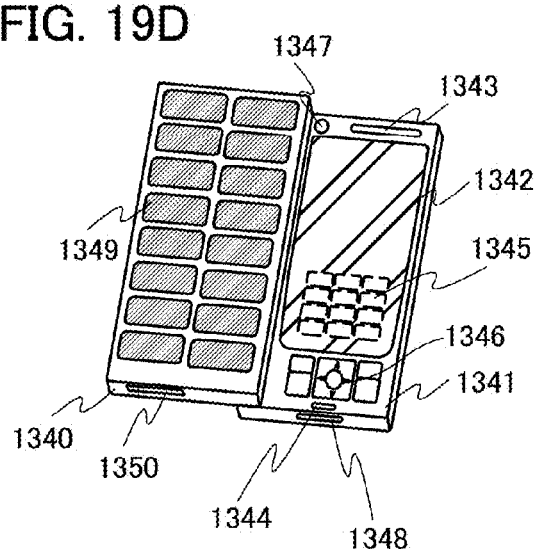

FIG. 19D illustrates a cellular phone provided with a semiconductor device using the non-volatile latch circuit according to the above embodiments. The cellular phone includes two housings, a housing 1340 and a housing 1341. The housing 1341 includes a display panel 1342, a speaker 1343, a microphone 1344, a pointing device 1346, a camera lens 1347, an external connection terminal 1348, and the like. The housing 1341 also includes a solar cell 1349 for charging the cellular phone, an external memory slot 1350, and the like. In addition, an antenna is built in the housing 1341.

The display panel 1342 has a touch panel function. In FIG. 19D, a plurality of operation keys 1345 displayed as images are indicated by dashed lines. Note that the cellular phone includes a step-up circuit for increasing the voltage output from the solar cell 1349 to a voltage needed for each circuit. In addition to the above structure, the cellular phone may include a contactless IC chip, a small recording device, or the like.

The display orientation of the display panel 1342 is changed as appropriate depending on the usage pattern. Furthermore, since the camera lens 1347 is provided on the same surface as the display panel 1342, the cellular phone can be used as a video phone. The speaker 1343 and the microphone 1344 can be used for videophone calls, recording and playing sound, and the like as well as voice calls. Moreover, the housing 1340 and the housing 1341 which are unfolded as illustrated in FIG. 19D can slide to overlap with each other. Thus, the cellular phone can be in a suitable size for portable use.

The external connection terminal 1348 can be connected to an AC adapter or various cables such as a USB cable, whereby the cellular phone can be charged or data communication can be performed. In addition, when a recording medium is inserted into the external memory slot 1350, a larger amount of data can be stored and transferred. Further, in addition to the above functions, an infrared communication function, a television reception function, or the like may be provided. When the semiconductor device according to the disclosed invention is applied to a cellular phone, a high-performance cellular phone can be provided.

Figure 19E:
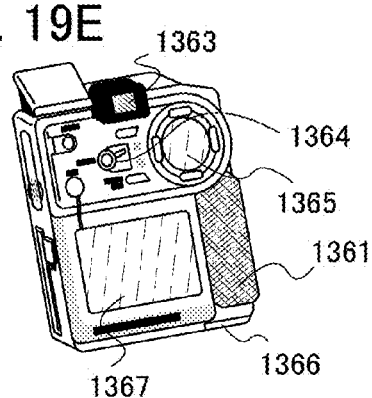

FIG. 19E illustrates a digital camera provided with a semiconductor device using the non-volatile latch circuit according to the above embodiments. The digital camera includes a main body 1361, a display portion (A) 1367, an eyepiece 1363, an operation switch 1364, a display portion (B) 1365, a battery 1366, and the like. When the semiconductor device according to the disclosed invention is applied to a digital camera, a high-performance digital camera can be provided.

Figure 19F:
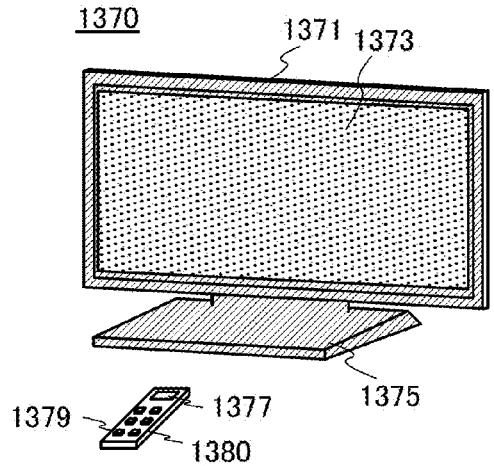

FIG. 19F illustrates a television set provided with a semiconductor device using the non-volatile latch circuit according to the above embodiments. In the television set 1370, a housing 1371 includes a display portion 1373. Images can be displayed on the display portion 1373. Note that here, the housing 1371 is supported by a stand 1375.

The television set 1370 can be operated with an operation switch of the housing 1371 or a remote controller 1380 separately provided. Channels and volume can be controlled with operation keys 1379 of the remote controller 1380 so that an image displayed on the display portion 1373 can be controlled. Further, the remote controller 1380 can be provided with a display portion 1377 for displaying data output from the remote controller 1380.

Note that the television set 1370 is preferably provided with a receiver, a modem, and the like. A general television broadcast can be received with the receiver. Moreover, when the television set is connected to a communication network with or without wires via the modem, one-way (from a sender to a receiver) or two-way (between a sender and a receiver or between receivers) data communication can be performed. When the semiconductor device according to the disclosed invention is applied to a television set, a high-performance television set can be provided.

The structures, methods, and the like shown in this embodiment can be combined as appropriate with any of the structures, methods, and the like shown in the other embodiments.

This application is based on Japanese Patent Application serial no. 2009-288146 filed with Japan Patent Office on Dec. 18, 2009, the entire contents of which are hereby incorporated by reference.

EXPLANATION OF REFERENCE

100: substrate, 102: protective layer, 104: semiconductor region, 106: element isolation insulating layer, 108a: gate insulating layer, 110a: gate electrode, 112: insulating layer, 114: impurity region, 116: channel formation region, 118: sidewall insulating layer, 120: high-concentration impurity region, 122: metal layer, 124: metal compound region, 126: interlayer insulating layer, 128: interlayer insulating layer, 130a: source or drain electrode, 130b: source or drain electrode, 130c: electrode, 132: insulating layer, 134: conductive layer, 136a: electrode, 136b: electrode, 136c: electrode, 136d: gate electrode, 138: gate insulating layer, 140: oxide semiconductor layer, 142a source or drain electrode, 142b: source or drain electrode, 144: protective insulating layer, 146: interlayer insulating layer, 148: conductive layer, 150a: electrode, 150b: electrode, 150c: electrode, 150d: electrode, 150e: electrode, 152: insulating layer, 154a: electrode, 154b: electrode, 154c: electrode, 154d: electrode, 200: bottom substrate, 202: insulating layer, 206: oxide semiconductor layer, 206a: oxide semiconductor layer, 208a: source or drain electrode, 208b: source or drain electrode, 212: gate insulating layer, 214: gate electrode, 216: interlayer insulating layer, 218: interlayer insulating layer, 250: transistor, 300: bottom substrate, 302: insulating layer, 304: oxide semiconductor layer, 304a: oxide semiconductor layer, 305: oxide semiconductor layer, 306: oxide semiconductor layer, 306a: oxide semiconductor layer, 308a: source or drain electrode, 308b: source or drain electrode, 312: gate insulating layer, 314: gate electrode, 316: interlayer insulating layer, 318: interlayer insulating layer, 350: transistor, 400: latch circuit, 402: transistor, 404: capacitor, 412: first element, 413: first element, 414: wiring, 415: wiring, 421: third transistor, 431: first transistor, 432: second transistor, 441: transistor, 442: transistor, 443: transistor, 444: transistor, 1301: main body, 1302: housing, 1303: display portion, 1304: keyboard, 1311: main body, 1312: stylus, 1313: display portion, 1314: operation button, 1315: external interface, 1320: e-book reader, 1321: housing, 1323: housing, 1325: display portion, 1327: display portion, 1331: power source switch, 1333: operation key, 1335: speaker, 1337: hinge, 1340: housing, 1341: housing, 1342: display panel, 1343: speaker, 1344: microphone, 1345: operation key, 1346: pointing device, 1347: camera lens, 1348: external connection terminal, 1349: solar cell, 1350: external memory slot, 1361: main body, 1363: eyepiece, 1364: operation switch, 1365: display portion (B), 1366: battery, 1367: display portion (A), 1370: television device, 1371: housing, 1373: display portion, 1375: stand, 1377: display portion, 1379; operation key, 1380: remote controller.

The invention claimed is:

1. A semiconductor device comprising:
   a first transistor;
   a first circuit including a third transistor; and
   a second circuit,
   wherein an output of the first circuit is electrically connected to an input of the second circuit, and an output of the second circuit is electrically connected to an input of the first circuit,
   wherein the input of the first circuit is electrically connected to a wiring to which an input signal is applied through the first transistor, and the output of the first circuit is electrically connected to a wiring to which an output signal is applied,
   wherein one of a source electrode and a drain electrode of the first transistor is electrically connected to a gate of the third transistor, and the other of the source electrode and the drain electrode of the first transistor is electrically connected to the wiring to which the input signal is applied,
   wherein an insulating layer is provided over the third transistor,
   wherein the first transistor is provided over the insulating layer,
   wherein a channel formation region of the first transistor comprises an oxide semiconductor, and
   wherein a channel formation region of the third transistor comprises a silicon.

2. The semiconductor device according to claim 1, wherein the oxide semiconductor comprises indium, gallium, and zinc.

3. The semiconductor device according to claim 1, wherein data stored in a gate capacitance of the third transistor is retained by the first transistor.

4. The semiconductor device according to claim 1, wherein the first circuit is a first inverter and the second circuit is a second inverter.

5. The semiconductor device according to claim 1, wherein the first circuit is a NAND and the second circuit is a clocked inverter.

6. The semiconductor device according to claim 1, further comprising a second transistor,
   wherein one of a source electrode and a drain electrode of the second transistor is electrically connected to the gate of the third transistor, and
   wherein the other of the source electrode and the drain electrode of the second transistor is electrically connected to the output of the second circuit.

7. A semiconductor device comprising:
   a first transistor;
   a first circuit including a third transistor;
   a second circuit; and
   a capacitor,
   wherein an output of the first circuit is electrically connected to an input of the second circuit, and an output of the second circuit is electrically connected to an input of the first circuit,
   wherein the input of the first circuit is electrically connected to a wiring to which an input signal is applied through the first transistor, and the output of the first circuit is electrically connected to a wiring to which an output signal is applied, wherein one of a source electrode and a drain electrode of the first transistor is electrically connected to a gate of the third transistor, and the other of the source electrode and the drain electrode of the first transistor is electrically connected to the wiring to which the input signal is applied, wherein an insulating layer is provided over the third transistor, wherein the first transistor is provided over the insulating layer, wherein a channel formation region of the first transistor comprises an oxide semiconductor, wherein a channel formation region of the third transistor comprises a silicon, and wherein the one of the source electrode and the drain electrode of the first transistor is electrically connected to one electrode of the capacitor.

8. The semiconductor device according to claim 7, wherein the oxide semiconductor comprises indium, gallium, and zinc.

9. The semiconductor device according to claim 7, wherein data stored in the capacitor and a gate capacitance of the third transistor is retained by the first transistor.

10. The semiconductor device according to claim 7, wherein the first circuit is a first inverter and the second circuit is a second inverter.

11. The semiconductor device according to claim 7, wherein the first circuit is a NAND and the second circuit is a clocked inverter.

12. The semiconductor device according to claim 7, further comprising a second transistor, wherein one of a source electrode and a drain electrode of the second transistor is electrically connected to the gate of the third transistor, and wherein the other of the source electrode and the drain electrode of the second transistor is electrically connected to the output of the second circuit.

13. A semiconductor device comprising:
a first circuit including a third transistor;
a second circuit; and
a second transistor, wherein an output of the first circuit is electrically connected to an input of the second circuit, wherein an output of the second circuit is electrically connected to an input of the first circuit through the second transistor, wherein the input of the first circuit is electrically connected to a wiring to which an input signal is applied, wherein the output of the first circuit is electrically connected to a wiring to which an output signal is applied, wherein one of a source electrode and a drain electrode of the second transistor is electrically connected to the output of the second circuit, wherein the other of the source electrode and the drain electrode of the second transistor is electrically connected to a gate electrode of the third transistor, wherein an insulating layer is provided over the third transistor, wherein the second transistor is provided over the insulating layer, wherein a channel formation region of the second transistor comprises an oxide semiconductor, and wherein a channel formation region of the third transistor comprises a silicon.

14. The semiconductor device according to claim 13, wherein the oxide semiconductor comprises indium, gallium, and zinc.

15. The semiconductor device according to claim 13, wherein data stored in a gate capacitance of the third transistor is retained by the second transistor.

16. The semiconductor device according to claim 13, wherein the first circuit is a first inverter and the second circuit is a second inverter.

17. The semiconductor device according to claim 13, wherein the first circuit is a NAND and the second circuit is a clocked inverter.

18. The semiconductor device according to claim 13, further comprising a capacitor, wherein one electrode of the capacitor is electrically connected to the other of the source electrode and the drain electrode of the second transistor.

19. A semiconductor device comprising:
a first transistor;
a first circuit including a third transistor;
a second circuit; and
a second transistor, wherein an output of the first circuit is electrically connected to an input of the second circuit, wherein an output of the second circuit is electrically connected to an input of the first circuit through the second transistor, wherein the input of the first circuit is electrically connected to a wiring to which an input signal is applied through the first transistor, wherein the output of the first circuit is electrically connected to a wiring to which an output signal is applied, wherein one of a source electrode and a drain electrode of the second transistor is electrically connected to the output of the second circuit, wherein the other of the source electrode and the drain electrode of the second transistor is electrically connected to a gate electrode of the third transistor, wherein one of a source electrode and a drain electrode of the first transistor is electrically connected to the gate electrode of the third transistor, wherein the other of the source electrode and the drain electrode of the first transistor is electrically connected to the wiring to which the input signal is applied, wherein an insulating layer is provided over the third transistor, wherein the first transistor and the second transistor are provided over the insulating layer, wherein a channel formation region of each of the first transistor and the second transistor comprises an oxide semiconductor, and wherein a channel formation region of the third transistor comprises a silicon.

20. The semiconductor device according to claim 19, wherein the oxide semiconductor comprises indium, gallium, and zinc.

21. The semiconductor device according to claim 19, wherein data stored in a gate capacitance of the third transistor is retained by the first transistor and the second transistor.

22. The semiconductor device according to claim 19, wherein the first circuit is a first inverter and the second circuit is a second inverter.

23. The semiconductor device according to claim 19, wherein the first circuit is a NAND and the second circuit is a clocked inverter.

24. The semiconductor device according to claim 19, further comprising a capacitor,
- wherein one electrode of the capacitor is electrically connected to the other of the source electrode and the drain electrode of the second transistor and the one of the source electrode and the drain electrode of the first transistor.

* * * * *